US010784633B2

(12) United States Patent
Richardson et al.

(10) Patent No.: US 10,784,633 B2
(45) Date of Patent: Sep. 22, 2020

(54) MODULAR BUILDING BLOCK SYSTEM FOR RF AND MICROWAVE DESIGN OF PROTOTYPES

(71) Applicant: X-MICROWAVE, LLC, Austin, TX (US)

(72) Inventors: John Dale Richardson, Austin, TX (US); Raymond Thomas Page, Georgetown, TX (US)

(73) Assignee: X-MICROWAVE, LLC, Austin, TX (US)

( * ) Notice: Subject to any disclaimer, the term of this patent is extended or adjusted under 35 U.S.C. 154(b) by 50 days.

(21) Appl. No.: 16/264,286

(22) Filed: Jan. 31, 2019

(65) Prior Publication Data

US 2019/0165522 A1 May 30, 2019

Related U.S. Application Data

(62) Division of application No. 14/932,957, filed on Nov. 4, 2015, now Pat. No. 10,230,202.

(60) Provisional application No. 62/074,887, filed on Nov. 4, 2014.

(51) Int. Cl.
*H01R 24/50* (2011.01)
*G01R 1/067* (2006.01)

(52) U.S. Cl.
CPC ......... *H01R 24/50* (2013.01); *G01R 1/06772* (2013.01)

(58) Field of Classification Search
CPC .......................... H01R 24/50; G01R 1/06772
See application file for complete search history.

(56) References Cited

U.S. PATENT DOCUMENTS

| 3,246,265 | A | * | 4/1966 | Smith-Vaniz | ........... H01P 1/185 333/161 |
| 4,455,537 | A | * | 6/1984 | La Prade | .................. H01P 5/02 333/246 |
| 4,745,381 | A | * | 5/1988 | Kosugi | ................ H01R 4/4809 333/245 |
| 4,816,789 | A | | 3/1989 | Mars | |

(Continued)

OTHER PUBLICATIONS

Exatron—"Diamond Particle Interconnect", Exatron Corp. Jul. 2002 (pp. 1-2).

(Continued)

*Primary Examiner* — Stephen E. Jones
*Assistant Examiner* — Samuel S Outten
(74) *Attorney, Agent, or Firm* — Mark P Kahler

(57) ABSTRACT

An RF signal processing system including multiple drop-in modular circuit blocks is disclosed. The drop-in modular circuit blocks include input and output launches exhibiting the same launch geometry. The RF system may include a conductive plate with a grid of holes disposed on the conductive plate. Multiple modular blocks may be installed on the conductive plate to form a cascade of modular blocks that exhibit common launch geometries. The cascade may include an RF probe with a projection and conductive pin that overhang a portion of a launch of a modular block at an end of the cascade. Flex connects may be disposed on, and held in position by, anchors to connect adjacent modular blocks together in a prototype system. A production RF system may exhibit the same overall geometry as a prototype RF system to speed up the transition from prototype design to production design.

12 Claims, 50 Drawing Sheets

(56) References Cited

U.S. PATENT DOCUMENTS

| | | | | |
|---|---|---|---|---|
| 5,053,853 A | * | 10/1991 | Haj-Ali-Ahmadi | ................... H01L 23/4006 257/693 |
| 5,065,124 A | * | 11/1991 | Chrzan | ................. H01P 1/047 333/246 |
| 5,363,075 A | * | 11/1994 | Fanucchi | ........... H01R 13/6658 333/246 |
| 5,488,380 A | * | 1/1996 | Harvey | .............. H01O 21/0025 333/248 |
| 7,344,381 B2 | | 3/2008 | Kerekes | |
| 8,251,762 B2 | | 8/2012 | Maier | |
| 8,317,523 B2 | | 11/2012 | Blakborn | |
| 8,760,184 B2 | | 6/2014 | Zelder | |
| 8,764,489 B2 | | 7/2014 | Blakborn | |
| 2009/0317985 A1 | | 12/2009 | Irion | |
| 2010/0317226 A1 | | 12/2010 | Schmid | |
| 2011/0254536 A1 | | 10/2011 | Zelder | |

OTHER PUBLICATIONS

Ironwood—"Diamond Particle Interconnect (DPI) QFN/LGA Socket User Manual", Apr. 20, 2010 (pp. 1-3).

Johnson—High Frequency End Launch Connectors, Emerson Network Power, downloaded from www.digikey.com on Oct. 30, 2015 (pp. 1-13).

Microwaves101—"RF Probing", downloaded from "http://www.microwaves101.com/encyclopedias/rf-probing" on Oct. 27, 2015 (pp. 1-5).

Rosenberger 1A—"02K80A-40ML5 right angle jack PCB", Rosenberger Online Catalog, downloaded from www.rosenberger.de on Oct. 2, 2015 (p. 1).

Rosenberger 1B—"SMD Connector jack, 02K80A-40ML5", Technical Data Sheet, downloaded from www.rosenberger.de on Oct. 2, 2015 (pp. 1-2).

Rosenberger 2A—"08K80A-40ML5 right angle jack PCB", Rosenberger Online Catalog, downloaded from www.rosenberger.de on Oct. 2, 2015 (p. 1).

Rosenberger 2B—"SMD Connector jack, 08K80A-40ML5", Technical Data Sheet, downloaded from www.rosenberger.de on Oct. 2, 2015 (pp. 1-2).

Rosenberger Hochfrequenztechnik "Solderless PCB Mount Connectors", Microwave Journal, Mar. 15, 2013 (pp. 1-4).

Southwest 1—"End Launch Connectors—to 110 GHz", Southwest Microwave Inc. Copyright 2014 (pp. 1-2).

Southwest 2—"End Launch Connectors—Dimensions", Southwest Microwave Inc. Copyright 2014 (pp. 1-2).

Southwest 3—"End Launch Connectors—Coplanar Test Data", Southwest Microwave Inc. Copyright 2014 (pp. 1-2).

Southwest 4—"End Launch Connectors—Microstrip Test Data", Southwest Microwave Inc. Copyright 2014 (pp. 1-2).

Motorola—"MX300-S Series—Service Manual", Motorola, Inc., 1984 (pp. 1-4).

Motorola Photo—"Photograph of MX-300S Internal Modules", Motorola, Inc., 1984 (p. 1).

Rosenberger Physical Formulae—"Solderless PCB Mount Connectors", Rosenberger, 2014 (pp. 1-4).

* cited by examiner

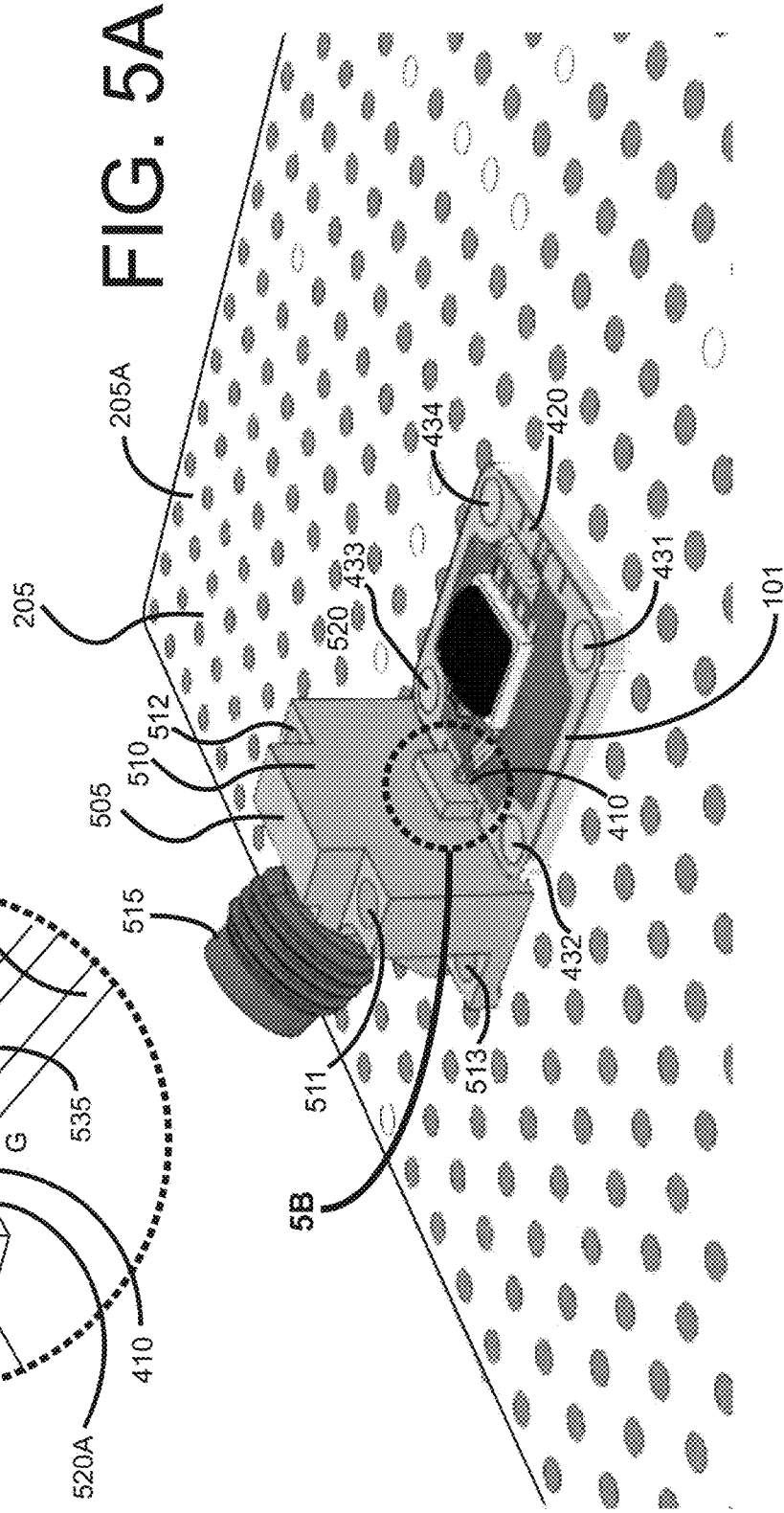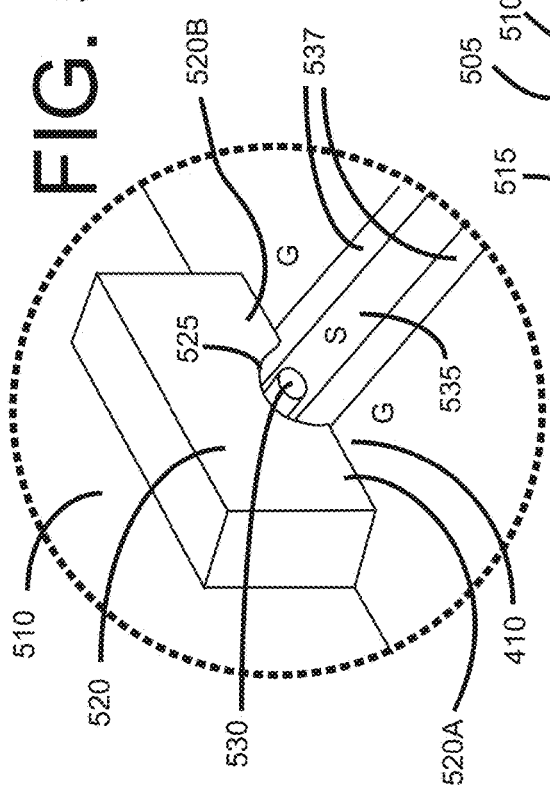

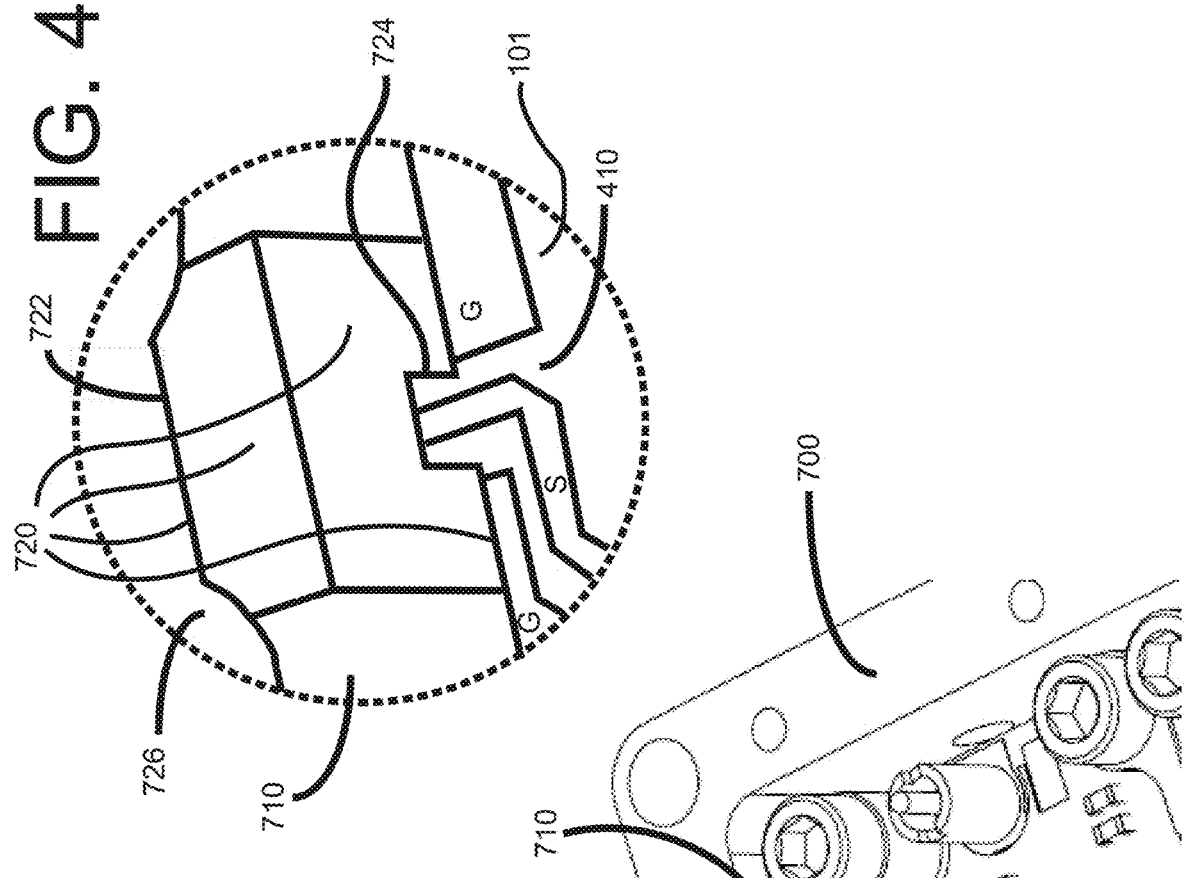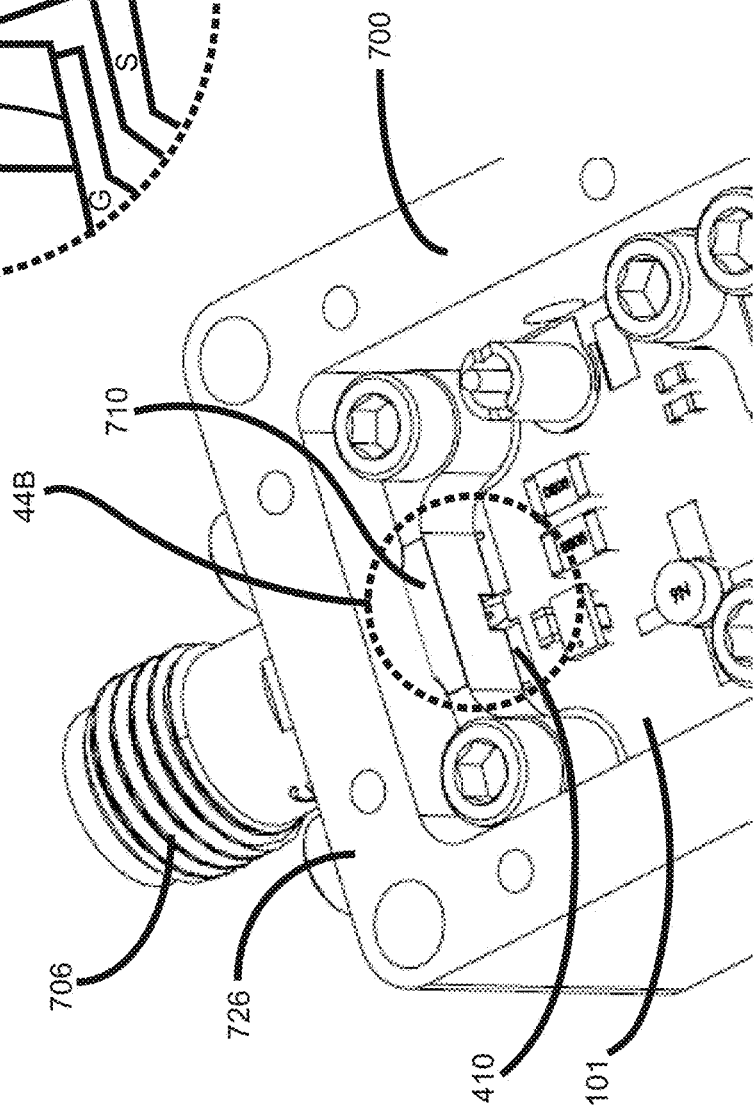

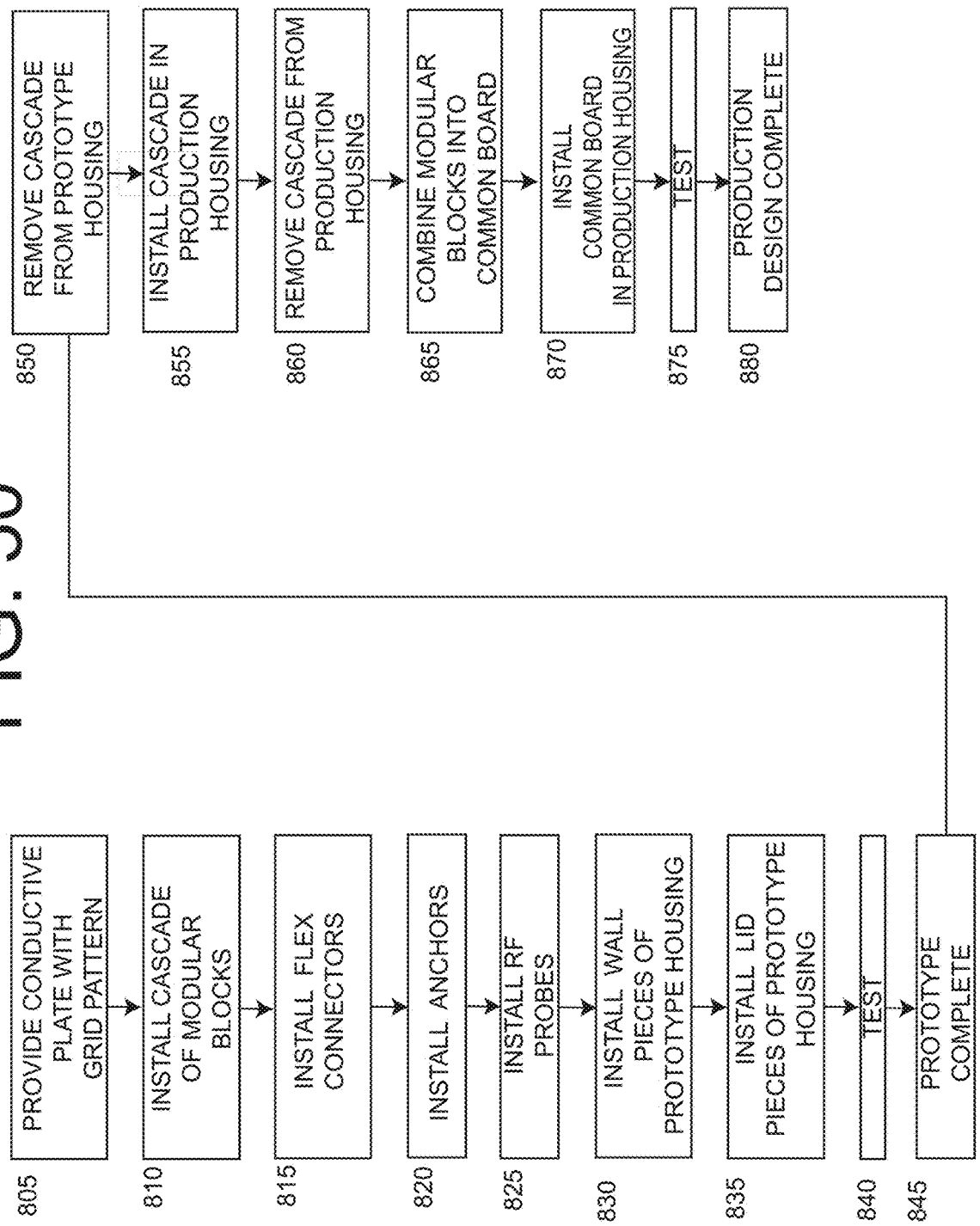

MODULAR BUILDING BLOCK SYSTEM FOR RF AND MICROWAVE DESIGN OF PROTOTYPES

CROSS REFERENCE TO RELATED PATENT APPLICATIONS

This patent application is a Divisional Application of, and claims priority to, Non-Provisional U.S. patent application Ser. No. 14/932,957, filed Nov. 4, 2015, entitled "MODULAR BUILDING BLOCK SYSTEM FOR RF AND MICROWAVE DESIGN OF COMPONENTS AND SYSTEMS FROM CONCEPT TO PRODUCTION", which claims priority to Provisional U.S. Patent Application No. 62/074,887, filed Nov. 4, 2014, entitled "SYSTEMS AND METHODS FOR MODULAR RADIO FREQUENCY AND MICROWAVE COMPONENTS AND INTEGRATED MICROWAVE ASSEMBLIES" by inventors Richardson, et al. and assigned to the assignee hereof, the disclosure of which is incorporated herein by reference in its entirety.

BACKGROUND

The disclosures herein relate generally to radio frequency (RF) signal apparatus and more particular to RF systems that may employ multiple stages. It is desirable to simplify the design, prototyping and manufacture of RF system products.

BRIEF SUMMARY

In one embodiment, a radio frequency (RF) signal probe is disclosed. The radio frequency (RF) signal probe may include a body including first and second surfaces. A jack extends from the first surface, the jack being adapted to receive a connector that mates therewith. A projection extends from the second surface, the projection being shaped to overhang a launch portion of an electrical component when the electrical component is situated adjacent the RF signal probe. In one embodiment, the RF probe also includes a channel below the projection, the RF probe including a connective element situated in the channel and overhanging the launch portion of the electrical component. In another embodiment the connective may be a connective pin. In one embodiment, the projection is fabricated of electrically conductive material that is adapted to couple to a ground of the launch portion of the electrical element. In another embodiment, the body of the RF probe includes a plurality of holes that are positioned to align with a corresponding plurality of holes in an electrically conductive member situated below the body.

In another embodiment, a high frequency radio frequency (RF) connection apparatus is disclosed. The apparatus may include a first board including a first launch, the first launch including a first plurality of conductors. The apparatus may include a second board having a second launch, the second launch including a second plurality of conductors, wherein the first launch is situated adjacent the second launch. The apparatus may also include a flex connector having a plurality of flex conductors, the flex connector being positioned at the first and second launches to connect the first plurality of conductors to the second plurality of conductors. In one embodiment, the first launch of the first board and the second launch of the second board may exhibit the same launch geometry. In one embodiment, the apparatus further includes an electrically conductive plate including a plurality of holes extending into the plate. The plurality of holes of the plate may be arranged arranged in a grid pattern. In one embodiment, the apparatus may include anchors to hold the flex connector in place to enhance the connection of the flex connector to the first and second launches.

In yet another embodiment, a high frequency radio frequency (RF) connection apparatus is disclosed. The apparatus may include an electrically conductive housing including a housing floor, first and second opposed ends, and opposed housing sides. The housing may include a plurality of holes extending into the housing, the plurality of holes including first and second holes adjacent the first opposed end of the housing. A modular board may be situated atop the housing floor, the board including a first launch disposed adjacent the first end of the housing, the board including first and second board holes aligned with the first and second holes of the housing adjacent the first end of the housing. An end connector may be situated external to the housing at the first opposed end of the housing, the end connector including a conductive pin that extends through an opening in the first opposed end of the housing and into the interior of the housing above the first launch of the board. The apparatus may include a pin bridge situated at the first launch, the pin bridge including a channel through which the conductive pin extends to contact a signal conductor of the first launch of the board, the pin bridge providing an electrically conductive path between a ground conductor of the first launch and the adjacent wall of the housing. In one embodiment, the pin bridge includes first and second opposed ends and first and second pin bridge holes adjacent the first and second opposed ends, respectively.

In still another embodiment, a system is disclosed that includes a conductive plate including a grid pattern of holes extending into the plate from a first surface thereof. The system may include a plurality of circuit board modules each including respective input and output launches, the input and output launches exhibiting the same launch geometry. In one embodiment, the plurality of circuit board modules are cascaded across the conductive plate to form a circuit board module cascade with an input launch at one end of the circuit board module cascade and an output launch at a remaining end of the circuit board module cascade. In one embodiment, the plurality of circuit board modules including holes aligned with holes of the plurality of holes, the circuitry board modules being removably screwed to the conductive plate via screws through aligned holes of the circuit board modules and corresponding holes of the conductive plate below.

In yet another embodiment, a method includes providing a conductive plate including a grid pattern of holes extending into the plate from a first surface thereof. The method also includes configuring a plurality of circuit board modules each including input and output launches, the input and output launches exhibiting the same launch geometry. The method further includes cascading the plurality of circuit board modules across the conductive plate to form a circuit board module cascade with an input launch at one end of the circuit board module cascade and an output launch at a remaining end of the circuit board module cascade. The method also includes removably attaching each circuit board module of the circuit board module cascade to the conductive plate via screws passing through holes in each of the circuit board modules to corresponding aligned holes in the conductive plate.

BRIEF DESCRIPTION OF THE DRAWINGS

The appended drawings illustrate only exemplary embodiments of the invention and therefore do not limit its scope because the inventive concepts lend themselves to other equally effective embodiments.

FIG. 5A shows the modular block of FIG. 4 and a representative RF probe coupled to one another on a conductive plate in accordance with one embodiment of the disclosed RF system.

FIG. 5B is a close up view of the input launch area of the modular block showing the connection to the RF probe in one embodiment of the disclosed RF system.

FIG. 44A is a perspective view showing a portion of production housing adjacent a connector and showing a pin bridge mounted to the modular block adjacent the housing.

FIG. 44B is a close-up perspective view showing the pin bridge of FIG. 44A.

FIG. 50 is a high level flowchart that depicts design steps used to proceed from a prototype design to a production design in accordance with the disclosed methodology.

DETAILED DESCRIPTION

Figure 1:
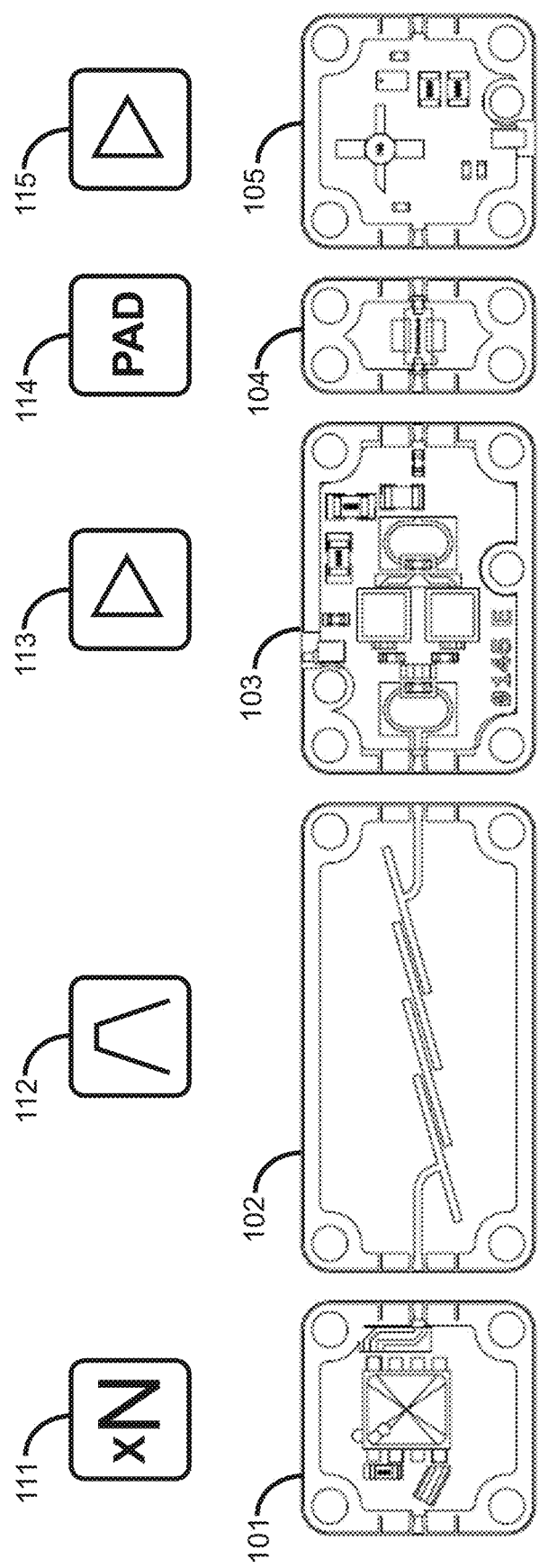
FIG. 1 is a representation of multiple modular blocks of one embodiment of the disclosed RF system.

In one embodiment, an RF probe for an RF system including one or more modular drop-in blocks is disclosed. The RF probe and modular block may be situated on a conductive plate including a grid of threaded holes in one embodiment. The RF probe and modular block may be removably attached to the plate via screws coupling the RF probe and modular block to the holes in the conductive plate below. The RF probe includes a connector pin that extends from the RF probe and overhangs at least a portion of a launch at the modular block to electrically and mechanically couple the connector pin to a conductor in the launch of the modular block. A solderless connection between the connector pin and the launch of the modular block is thus provided. In one embodiment, an RF probe for connection to modular drop-in blocks as part of a modular system is disclosed. The RF probe and modular block may be situated on a conductive plate (or housing floor) including a grid of threaded holes in one embodiment. The RF probe and modular block may be independently removably attached to the plate via screws coupling the RF probe and modular block to the holes in the conductive plate below. A feature of the RF probe includes a connector pin and a boss consisting of two ground contact surfaces that extend from the RF probe and overhang at least a portion of a launch of a modular block to electrically and mechanically couple the connector pin and ground surfaces to a launch of a modular block. In one embodiment a solderless Ground-Signal-Ground connection between the probe connector and the launch of the modular block is thus provided.

In another embodiment, the RF system includes multiple modular blocks coupled to one another to form a cascade of modular blocks. Each modular block includes an input launch and an output launch. A multiple conductor flex connector couples the output launch of one modular block to the input launch of an adjacent modular block in the cascade. Respective removable anchors hold the opposite ends of the flex connector to the output launch of one modular block and the input launch of the adjacent modular block in the cascade. Modular wall and lid pieces may form a prototype housing for the cascade in one embodiment.

In yet another embodiment, the cascade may be removed from the prototype housing and installed in a machined housing, such as a production housing. In this case the production housing exhibits the same geometry as the prototype housing. A panel mount connector is installed at one end of the housing. The panel mount connector includes a connector pin that extends through an opening in the housing to the interior of the housing. A panel mount connector may be installed at each end of the housing.

In still another embodiment, a prototyping system with drop-in modular blocks is provided. The system includes a conductive plate with a grid pattern of holes extending into at least one surface of the conductive plate. In another embodiment, the holes may extend all the way through the plate between the opposed surfaces thereof. The system may include multiple drop-in modular blocks, wherein each modular block includes an input launch and an output launch. The modular blocks are oriented to form a cascade in which the input launch of one modular block is at one end of the cascade and the output launch of another modular block is at the remaining end of the cascade. Within the cascade, the output launch of one modular block is coupled to the input launch of an adjacent modular block. The input launches and output launches of the modular blocks exhibit the same geometry so that they are readily connected together from one modular block to an adjacent modular block in the cascade.

The modular blocks are removably coupled to the conductive plate via anchors employing screws extending through the anchors, through the modular blocks and into the holes in the conductive plate below. An input RF probe is removably attached to the input launch of the modular block at one end of the cascade and the conductive plate below. An output RF probe is removably attached to the input launch of the modular block at one end of the cascade and the conductive plate below. The prototyping system includes modular wall pieces and modular lid pieces that form a removable prototype housing above the cascade of modular blocks. In this manner, a prototype RF system is provided. The cascade need not be a straight line of modular blocks. The cascade could exhibit other geometries such as L-shaped, Z-shaped or other geometry.

After the prototype RF system is created in the manner described above, a production RF system is readily created in the manner now described. To form a production RF system from the prototype RF system, the removable wall pieces and lid pieces of the prototype housing are removed from the cascade of modular blocks. The cascade of modular blocks is then placed in a production housing such as a machined housing that exhibits the same geometry as the prototype housing. The multiple modular blocks of the cascade may be combined into a common board that includes the electrical circuits of the modular blocks of the cascade. The common board may be a single board that includes the electrical circuits of the modular blocks of the cascade. The common board exhibits the same geometry as the cascade. In this manner, the common board may be readily mounted in a production housing that exhibits the same dimensions as the prototype housing. In this manner, the designer may avoid extensive redesign of the modular blocks and housing when moving from a prototype design to a production design.

FIG. 1 is a representation of multiple modular drop-in blocks that may be coupled together to form a cascade. In this particular example, the cascade includes a multiplier modular block 101, a bandpass filter modular block 102, an amplifier modular block 103, a pad modular block 104 and an amplifier modular block 105. Icon symbols 111, 112, 113, 114 and 115 appear above modular blocks 101, 102, 103, 104 and 105, respectively, to symbolically indicate the function of each modular block.

Figure 2:
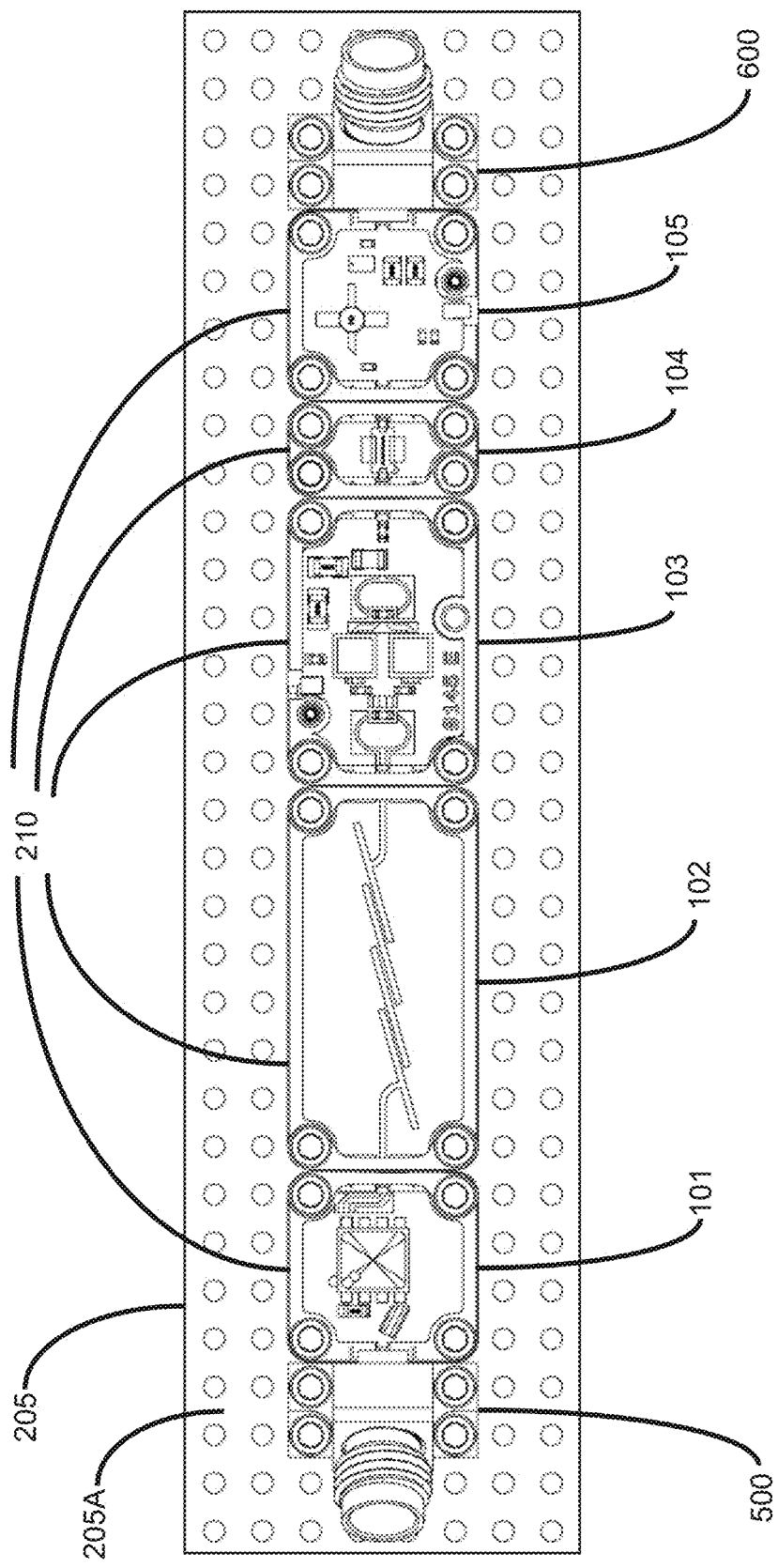
FIG. 2 is a representation of the multiple modular blocks of FIG. 1 disposed on a conductive plate in one embodiment of the disclosed RF system.

FIG. 2 is a representation of the multiple modular blocks of FIG. 1 disposed on an electrically conductive plate 205 in one embodiment of the disclosed RF system. More particularly, modular blocks 101-105 are cascaded together end to end to form a cascade 210 that includes modular blocks 101-105. Conductive plate 205 may be fabricated from electrically conductive material such as aluminum, steel and other metals. Conductive plate 205 includes multiple threaded holes, such as hole 211, that are laid out in a grid pattern of rows of holes and columns of holes. These holes may alternatively be referred to as orifices. In one embodiment, these holes are equidistant from one another as shown in FIG. 2. In one embodiment, these holes extend into conductive plate 205 from the top surface 205A but do not extend completely through conductive plate 205. In another embodiment, these holes extend completely through conductive plate 205 from top surface 205A to the bottom surface (not shown) of conductive plate 205. RF probes 500 and 600 couple to the respective ends of modular blocks 101 and 105 of cascade 210, as shown. RF probes 500 and 600 are removably connected to conductive plate 205 and are removably connected to launches on modular blocks 101 and 105, respectively, as discussed in more detail below.

Figure 3:
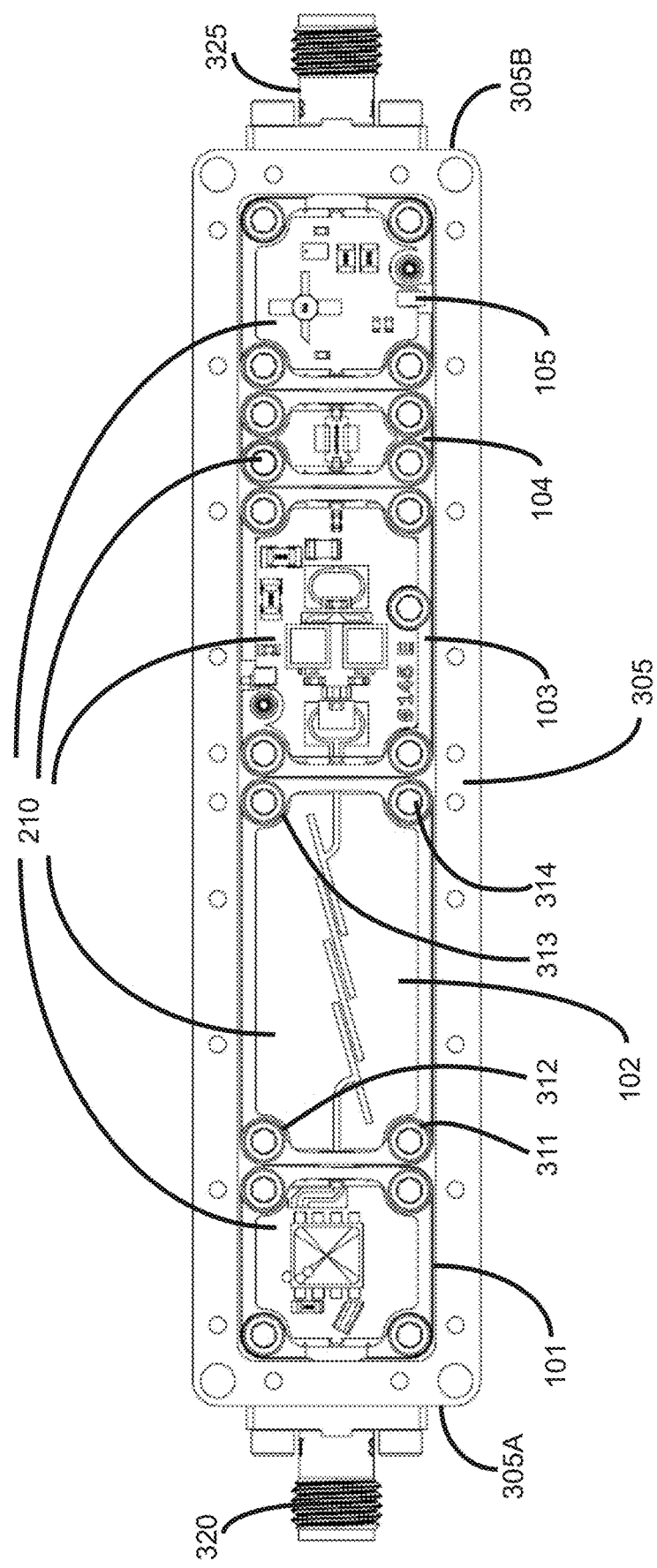
FIG. 3 shows the modular blocks of FIG. 1 situated in a machined housing in one embodiment of the disclosed RF system.

FIG. 3 shows the modular blocks 101-105 of FIG. 1 situated in a production housing 305 in one embodiment of the disclosed RF system. Production housings are used for a finished RF system product, whereas prototype housings are used in the design and testing of a prototype RF system.

In the disclosed RF system, the prototype housing and the production housing exhibit the same physical geometry in one embodiment. This feature aids in avoiding a substantial redesign of an RF system when the RF system is transitioned from a prototype design to a finished production design.

More particularly, FIG. 3 shows cascade 210 of modular blocks 101-105 situated in a production housing 305 such as a machined housing. In FIG. 3, the top lid of housing 305 is not shown so that the components in housing 305 are visible. As will be explained in more detail below, each of the modular blocks 101, 102, 103, 104 and 105 is screwed into threaded holes (not shown) in the bottom of housing 305. For example, screws 311, 312, 313 and 314 are screwed through respective holes in modular block 102 into respective holes in the bottom of housing 305 to mount modular block 102 to housing 305. Panel mount connectors 320 and 325 are situated at the opposed ends 305A and 305B of housing 305. Panel mount connector 320 couples to an input launch of modular block 101. Panel mount connector 325 couples to an output launch of modular block 105.

Figure 4:
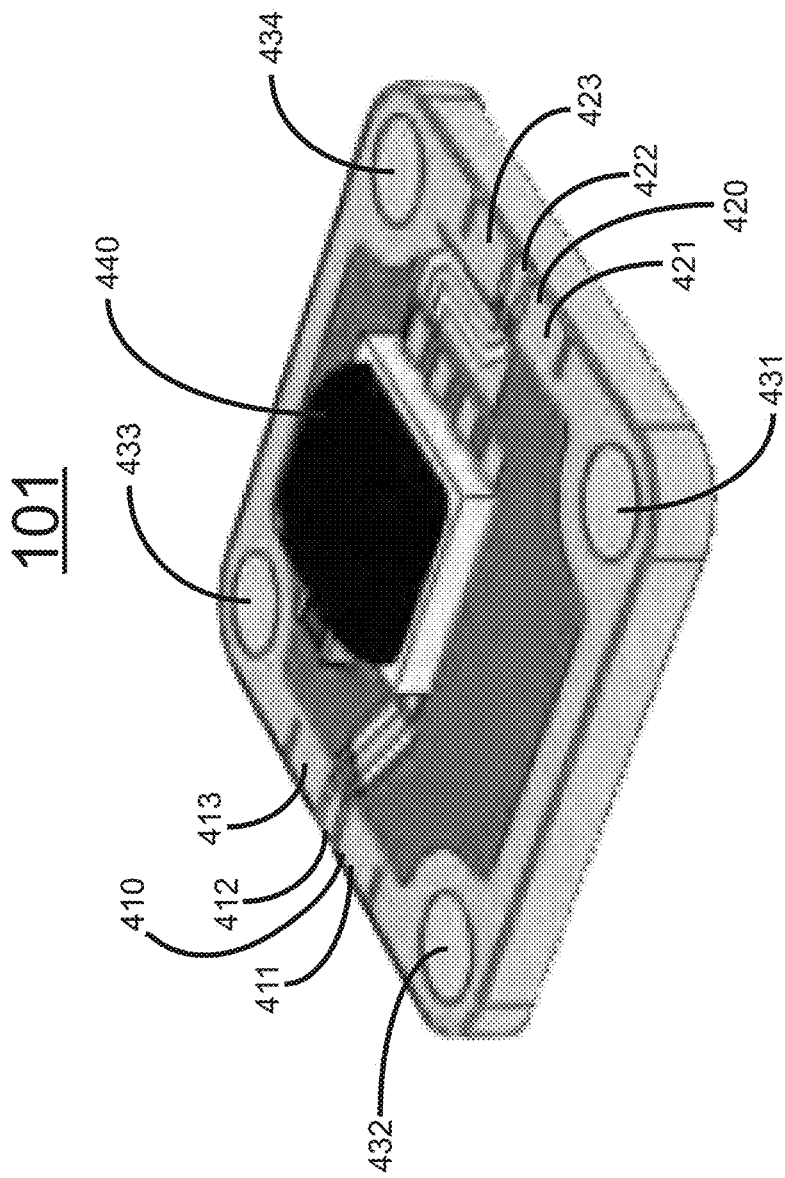
FIG. 4 is a perspective view of a representative modular block in one embodiment of the disclosed RF system.

FIG. 4 shows a representative modular block 101 that includes an input launch 410 and an output launch 420. Input launch 410 exhibits a ground-signal-ground geometry that includes a ground conductor 411, a signal conductor 412 and a ground conductor 413. Output launch 420 exhibits the same geometry as input launch 410, namely a ground-signal-ground geometry that includes a ground conductor 421, a signal conductor 422 and a ground conductor 423. Modular block 101 exhibits a square geometry with four holes 431, 432, 433, 434 being situated at the four corners thereof as shown. Screws (not shown) pass through holes 431, 432, 433 and 434 and into respective threaded holes in a conductive plate 205 (for prototyping) therebelow, or alternatively through threaded holes in a production housing (for production). Modular block 101 also includes a semi-conductor device 440 or other electronic circuit structure that is coupled either directly or indirectly to input launch 410 and output launch 420.

FIG. 5A shows the modular block 101 of FIG. 4 and a representative RF probe 505 coupled to one another on a conductive plate 205 in accordance with one embodiment of the disclosed RF system. More specifically, RF probe 505 is coupled to the input launch 410 of modular block 101. Electrically conductive plate 205 includes a plurality of holes organized in a regular grid geometry with rows of holes and columns of holes as seen in FIG. 5A. In one embodiment, these holes are equidistant from one another. Holes 431, 432, 433 and 434 are aligned with corresponding threaded holes in electrically conductive plate 205.

RF probe 505 includes a main body 510 and a threaded jack 515 extending angularly from main body 510 as shown in FIG. 5A. Main body 510 includes holes 511 and 512, and holes 513 and 514 that are not visible in this view. Holes 511, 512, 513 and 514 are vertically aligned above corresponding threaded holes in conductive plate 205. Screws (not shown) situated in holes 511 and 512 are threaded into the corresponding threaded holes in conductive plate 205 to hold RF probe 505 to conductive plate 205. FIG. 5B is a simplified close-up view showing the connection of RF probe 505 to the input launch 410 of modular block 101. As seen in FIG. 5B, main body 510 includes a conductive projection 520 that extends over a portion of input launch 410 of modular block 101. In one embodiment, projection 520 couples to ground. In this manner, projection 520 overhangs a portion of input launch 410. An electrically conductive, connective pin 530 extends from an opening 525 in projection 520. In this manner, connective pin 530 likewise extends over and overhangs input launch 410. More specifically, in the embodiment shown in FIG. 5B, connective pin 530 overhangs and contacts, both mechanically and electrically, the signal line (S) of a microstrip transmission line 535. Microstrip transmission line 535 also includes two ground conductors (G) on opposed sides of the S signal line as shown in FIG. 5B. Ground conductors G extend nearly to the edge of the modular block 101 under projection 520 to make good electrical and mechanical contact with respective opposed projection sides 520A and 520B.

In one embodiment, the modular blocks such as block 101 are printed circuit boards fabricated from RO4003 electrically insulative substrate material. In the embodiment of FIG. 5B, this electrically insulative material appears as the insulative material 537 between the S signal conductor and the two ground conductors G running near the S signal conductor on opposite sides thereof.

When the mounting screws (not shown) are placed into holes 511, 512 and threaded into the vertically aligned holes in conductive block 205 below, connective pin 530 is squeezed with sufficient pressure against microstrip line 535 conductor S that a good mechanical and electrical connection is formed between the connective pin 530 and conductor S. Likewise, projection 520 is pressed against ground conductors at the input launch 410 to properly connect the main body 510 to the ground of modular block 101.

The RF probe of FIGS. 5A and 5B enables a high frequency connection to a single ended RF signal at the launch of any modular block making a ground-signal-ground contact. Those skilled in the art will appreciate that other variants of the disclosed design enable a connection to differential signals wherein the connection is a ground-signal-ground-signal-ground connection. Similarly, the disclosed connection arrangement may be extended to enable arbitrary signal configurations associated with future modular block launch geometries.

Figure 6:
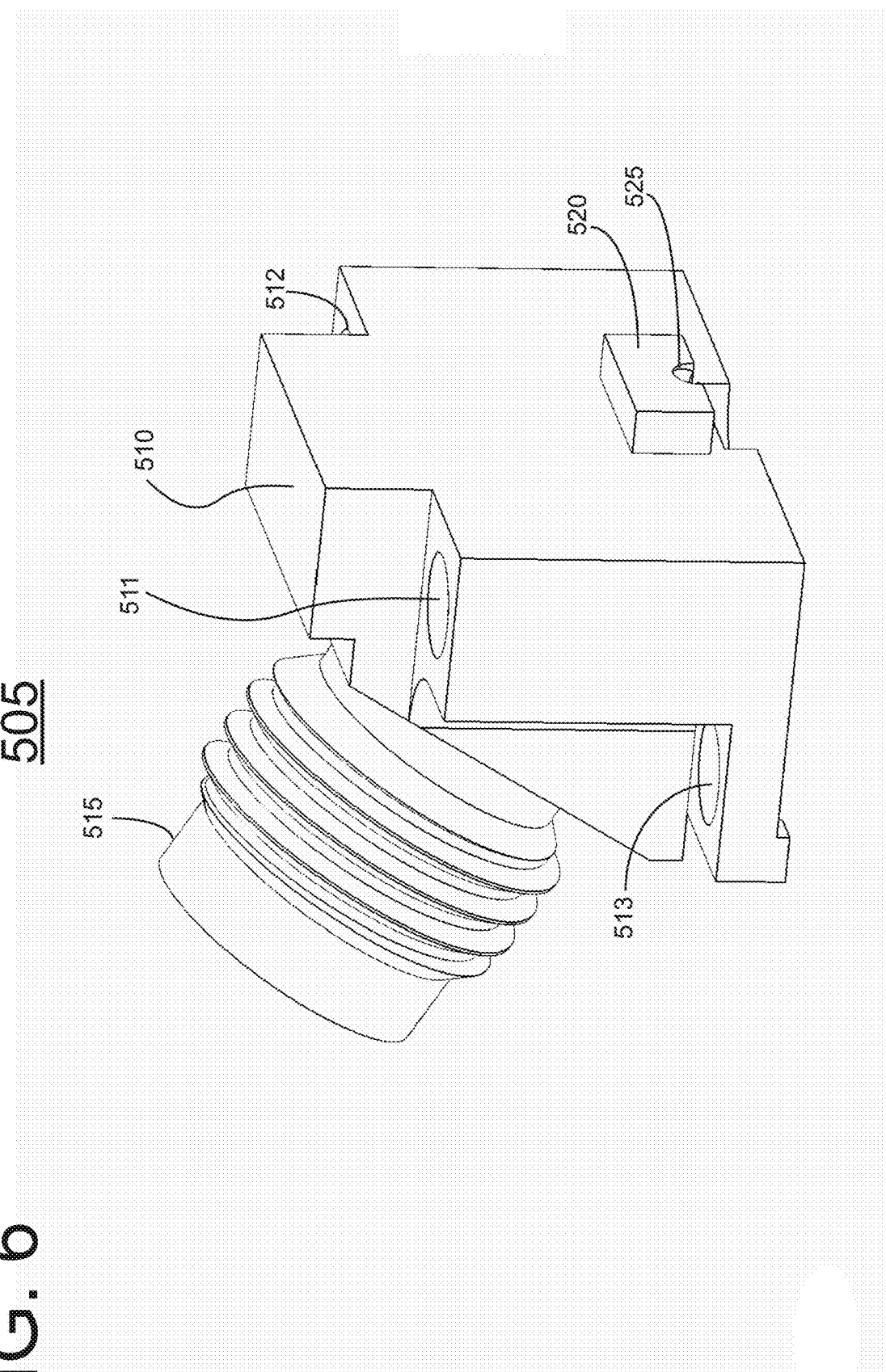
FIG. 6 is a rear perspective view of one embodiment of disclosed RF probe.

FIG. 6 shows a more detailed view of RF probe 505 from the same rear perspective as in FIGS. 5A and 5B discussed above. FIG. 6 shows projection 520, but connective pin 530 is not visible in this particular view.

Figure 7:
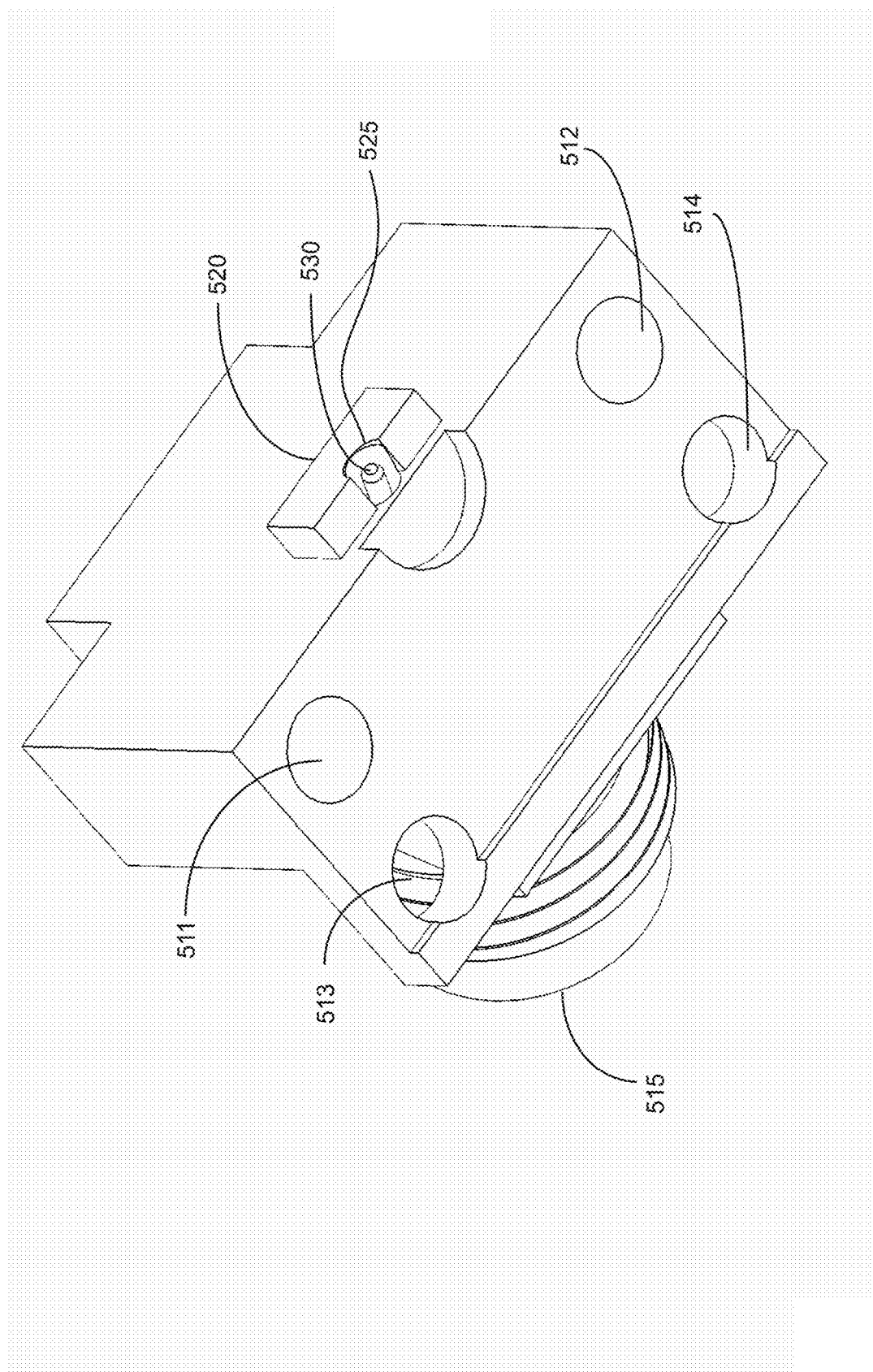
FIG. 7 is a bottom rear perspective view of one embodiment of the disclosed RF probe.

FIG. 7 shows a bottom rear perspective view of RF probe 505. In this view, holes 511, 512, 513 and 514 are clearly visible. FIG. 7 also shows projection 520 and connective pin 530 as viewed from the bottom. The semicircular channel below projection 520 provides an air dielectric to prevent connective pin 530 from shorting.

Figure 8:
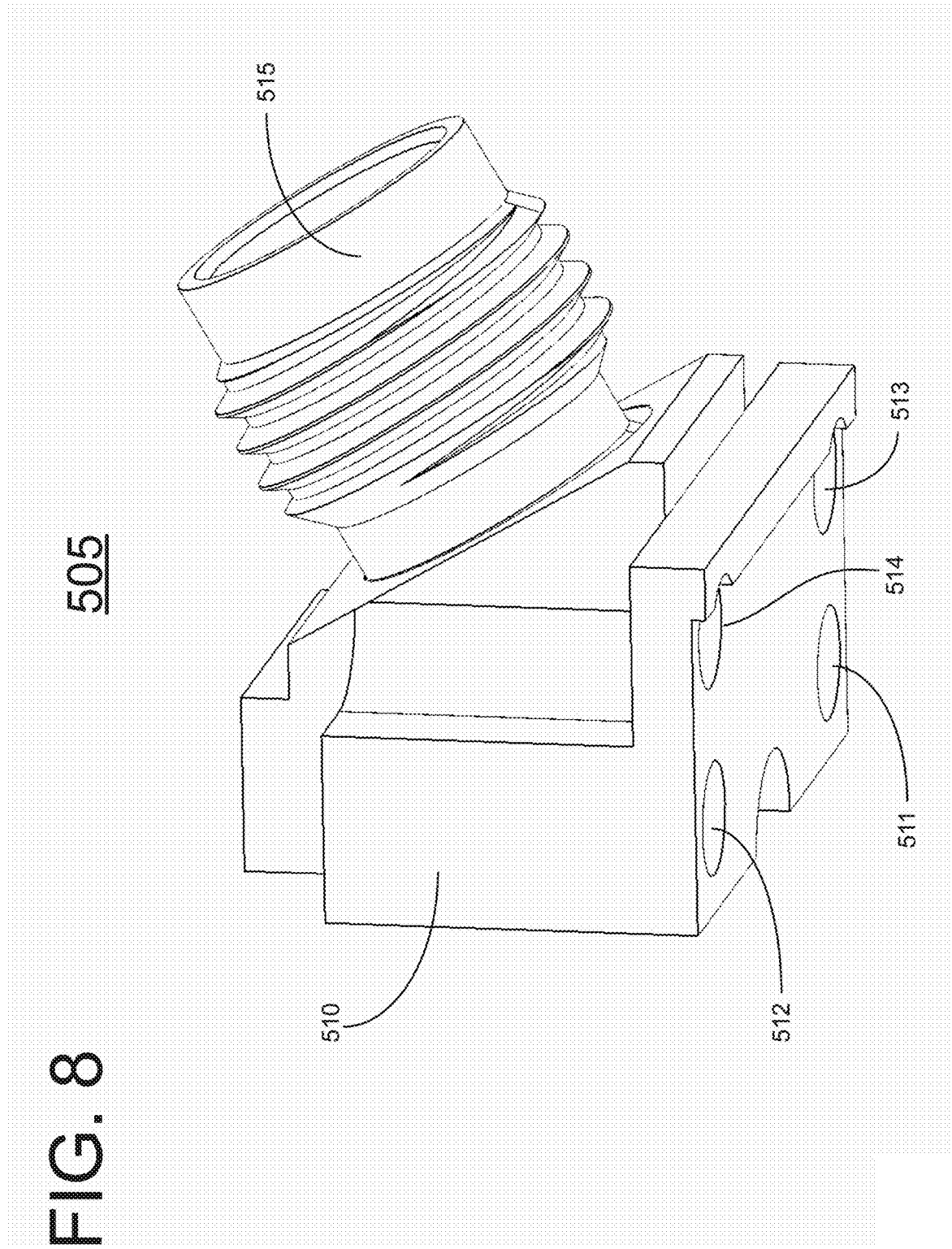
FIG. 8 is a bottom front perspective view of one embodiment of the disclosed RF probe.
Figure 9:
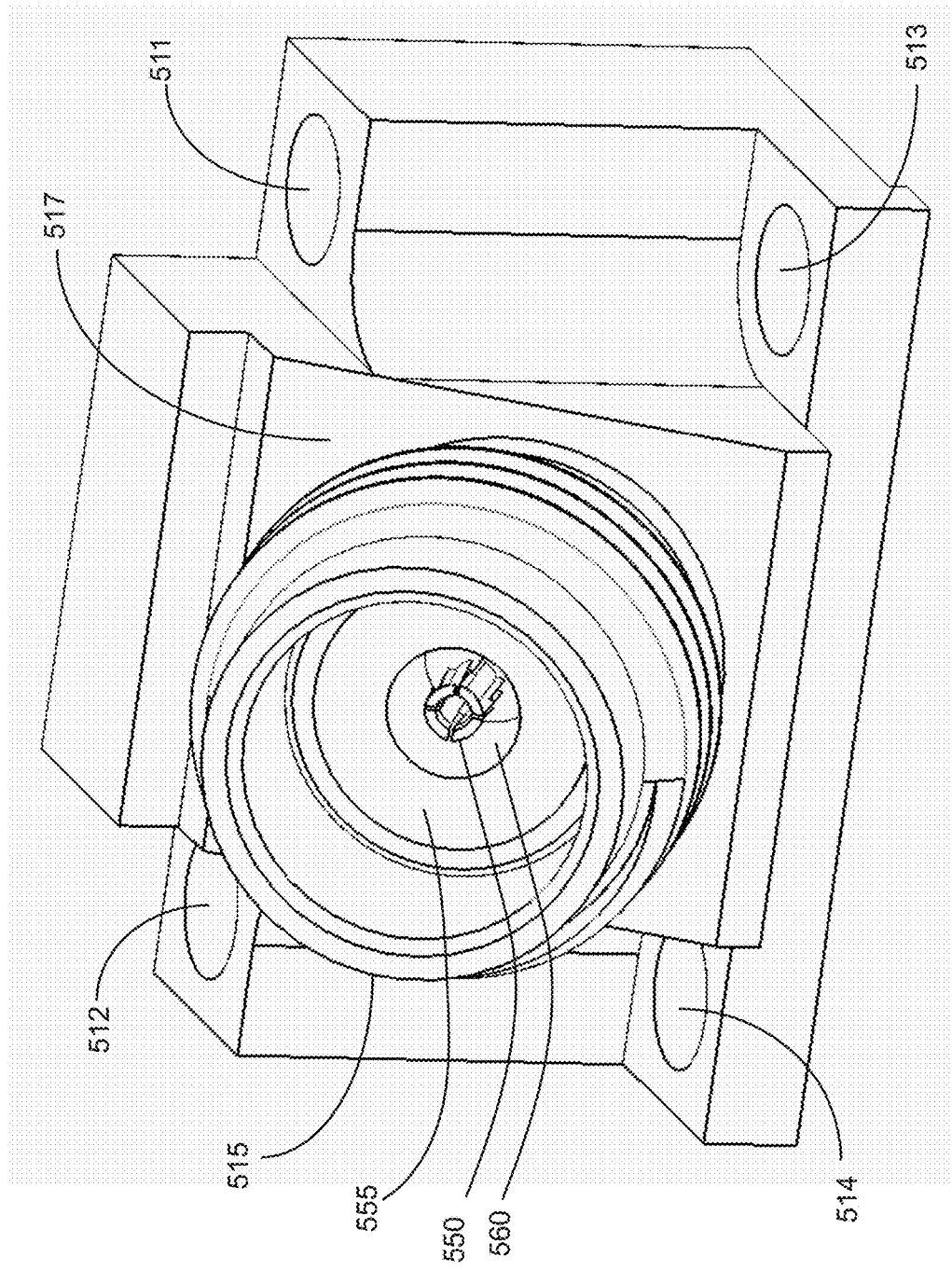
FIG. 9 is a top front perspective view of one embodiment of the disclosed RF probe.

FIG. 8 is a bottom front perspective view of RF probe 505. FIG. 9 is a front top perspective view of RF probe 505 showing more clearly the jack 515. Jack 515 includes a center conductor 550 and a cylindrical electrically insulative member 555 coaxially positioned with respect to center conductor 550. Jack 515 includes a cylindrical open region 560 between center conductor 550 and electrically insulative member 555. Center conductor 550 is electrically coupled to connective pin 530 (not visible in FIG. 9) internal to RF probe 505. In one embodiment, jack 515 is situated to extend from an angled ramp 517 such that jack 515 itself is angularly oriented with respect to the vertical axis of RF probe 505.

Figure 10:
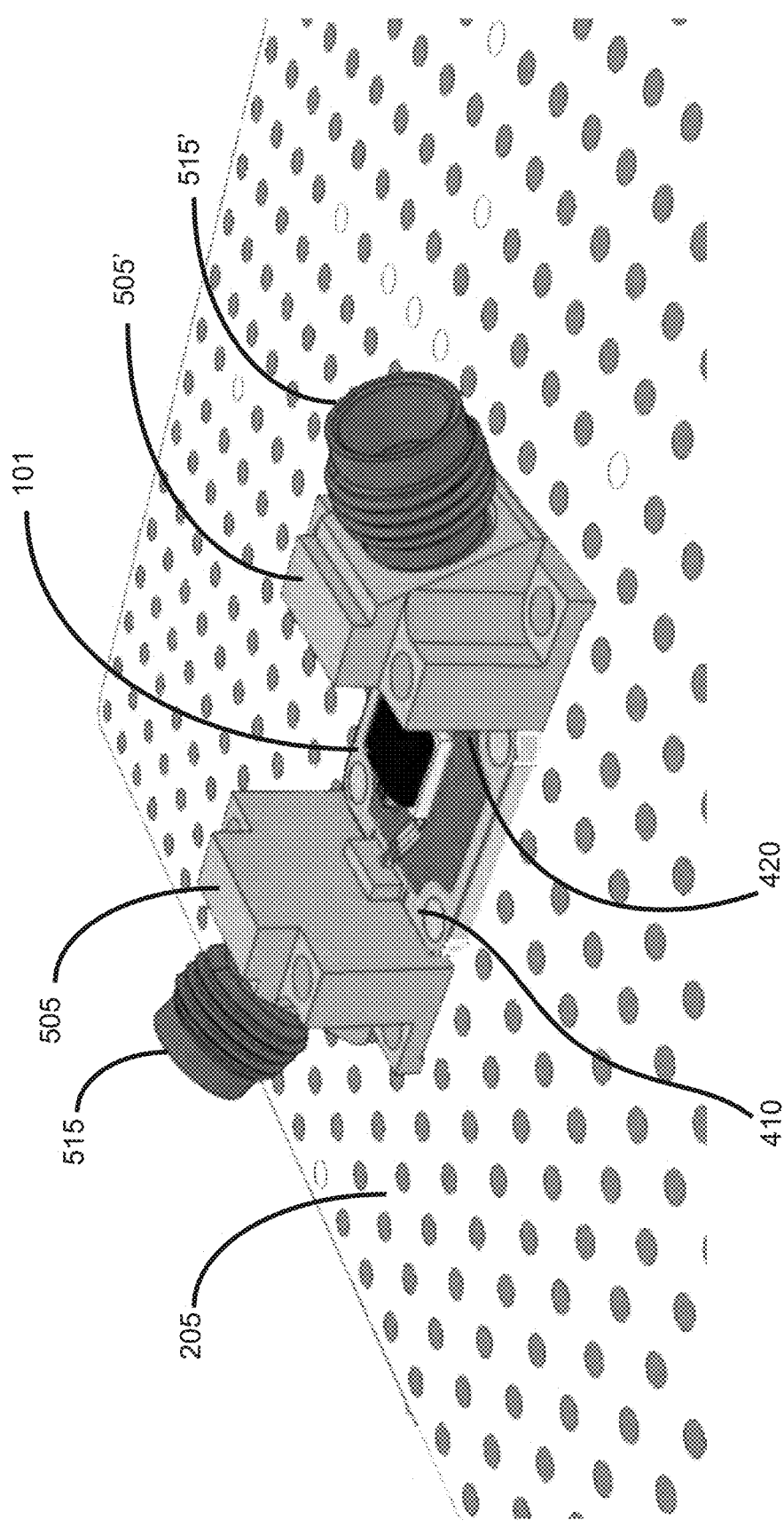
FIG. 10 shows the representative modular block of FIG. 4 coupled to an input probe and an output probe in one embodiment of the disclosed RF system.

FIG. 10 shows a first RF probe 505 coupled to an input launch 410 of modular block 101, and also shows a second RF probe 505' coupled to the output launch 420 of modular block 101. Modular block 101 may be tested and characterized using this configuration. A first connector (not shown) may be connected to jack 515 to supply a test signal to modular block 101.

A second connector (not shown) may be connected to jack 515' of RF probe 505' to receive the resultant signal generated at the output launch 420 of modular block 101. In this manner, the signal characteristics of drop-in modular block 101 may be determined to aid in prototype design. In this manner, X-parameter models can be accurately determined for each drop-in modular block probed. In actual practice, probes 505 and 505' are mounted to conductive plate 205 via screws in the holes of the probes that are threaded into respective aligned holes in the conductive plate 205 below.

Figure 11:
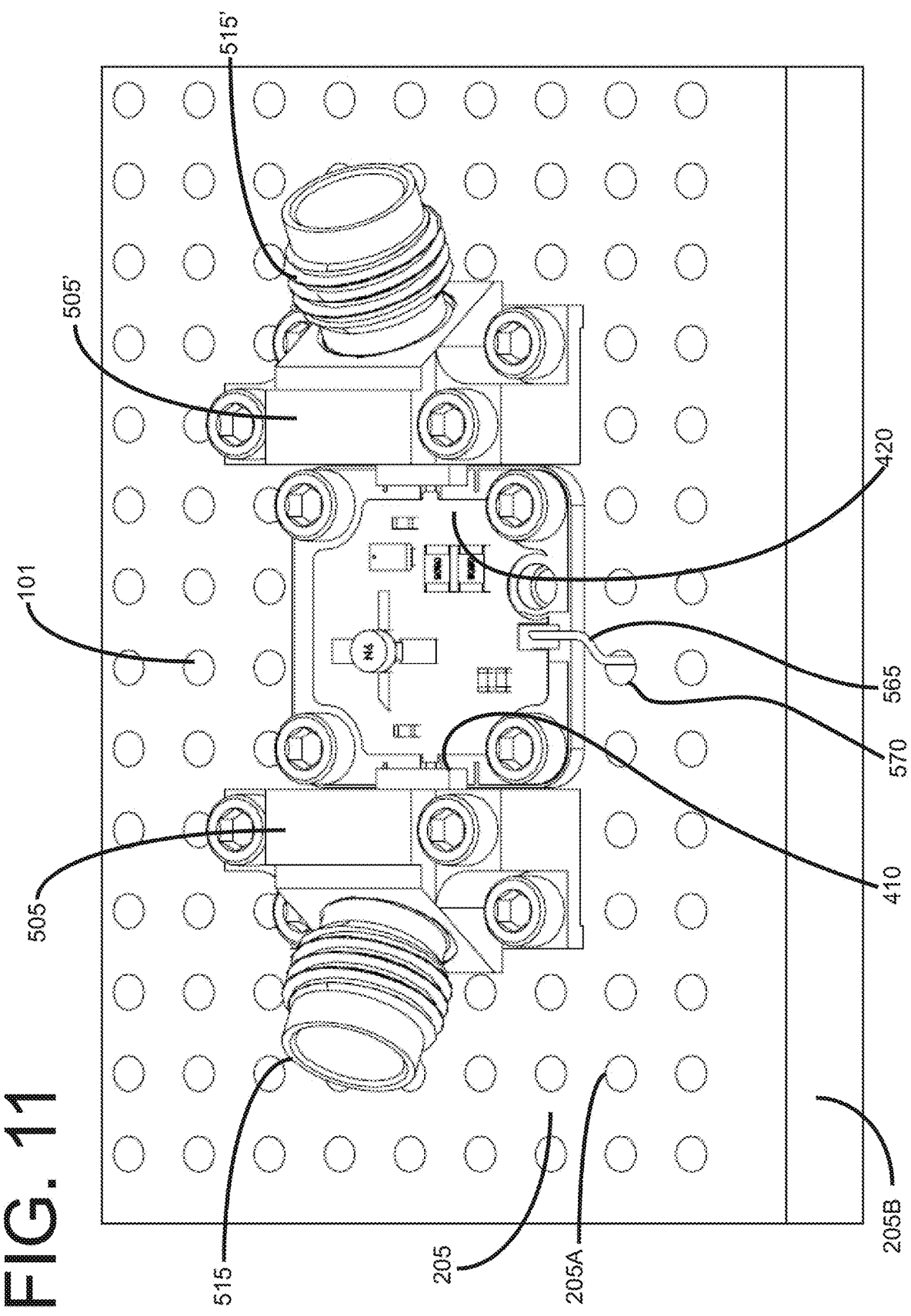
FIG. 11 shows a top front perspective view of two RF probes on a conductive block.

FIG. 11 shows an alternative embodiment of the testing configuration of FIG. 10. Like numbers indicate like elements when comparing the components of FIG. 11 with those of FIG. 10. Modular block 101 is connected between RF probes 505 and 505' on the top surface 205A of conductive plate 205. In this particular embodiment, an insulated electrical conductor 565 from a circuit below the bottom surface 205B of conductive plate extends through a hole 570 of conductive plate 205 to couple to a circuit node on modular block 101.

Figure 12:
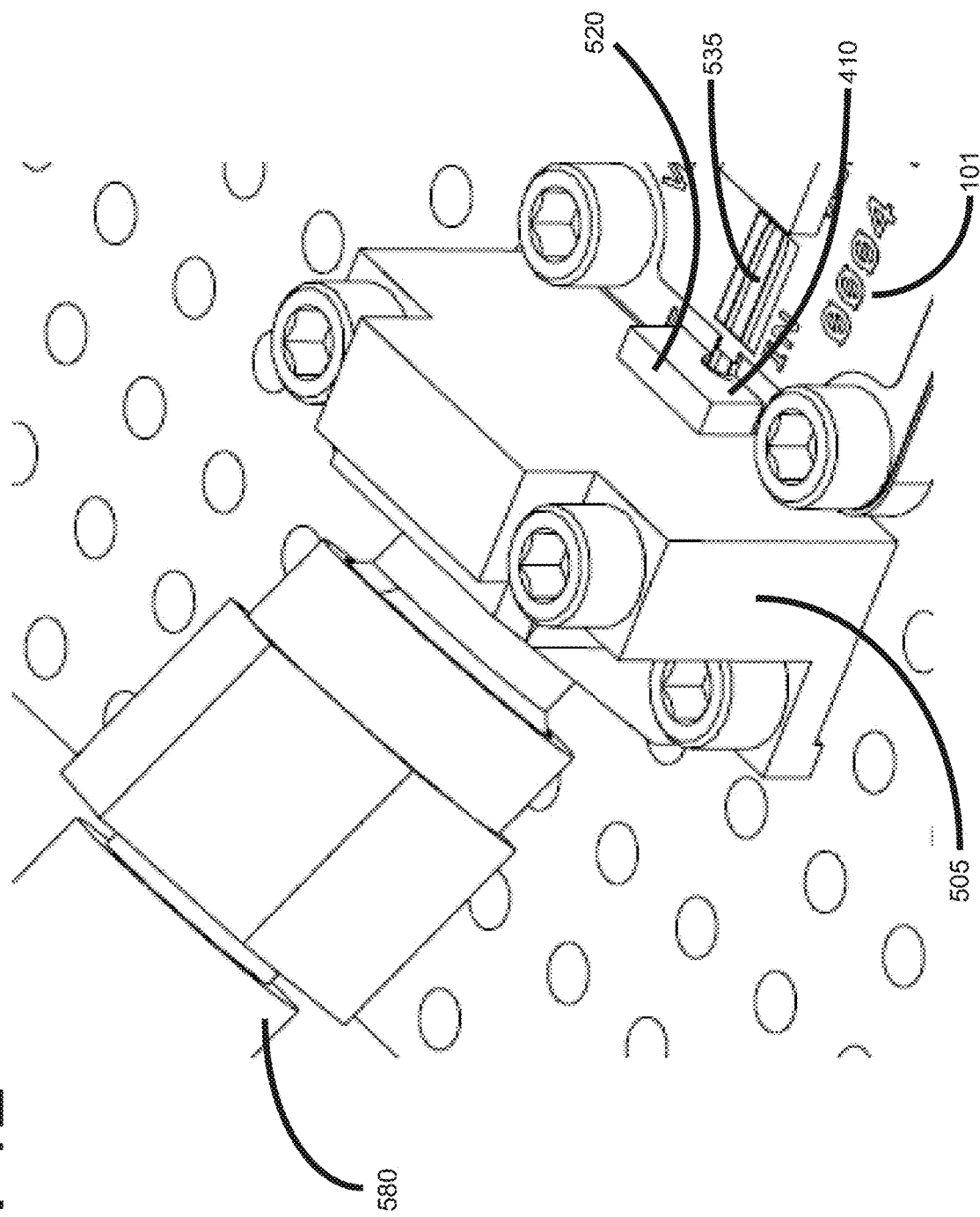
FIG. 12 is a close-up perspective view of an RF probe coupled to a signal cable.

FIG. 12 shows a connector 580 coupled to RF probe 505 to supply an input signal to modular block 101. FIG. 12 is similar to FIG. 5A, but with additional detail. Projection 520 extends over input launch 410 of modular block 101. Microstrip transmission line 535 couples the connective pin (not shown) within projection 520 to other circuitry of modular block 101.

In one embodiment of the disclosed RF system, multiple modular blocks with different functions each include the same input and output launch geometries. In this manner, these different function modular blocks may be uniformly probed by the same RF probe.

Figure 13:
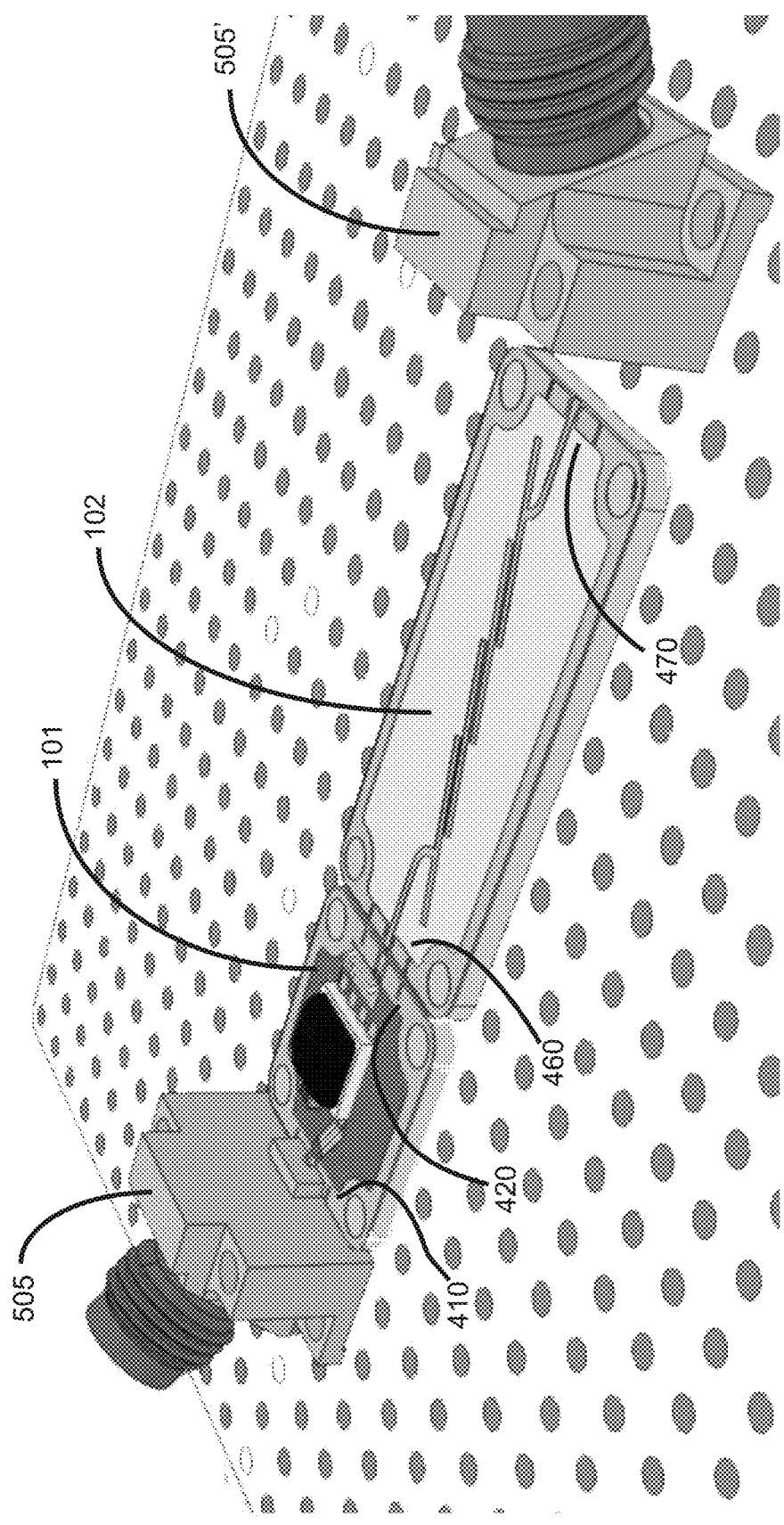
FIG. 13 is a perspective view showing modular blocks that are coupled together to form a cascade.

FIG. 13 shows modular blocks 101 and 102 that are coupled together to form a cascade. Modular block 101 includes input launch 410 and output launch 420. Modular block 102 includes input launch 460 and an output launch 470. RF probe 505 is connected to the input launch 410 in the manner taught above. In FIG. 13, RF probe 505' is shown before being coupled to the output launch 470 of modular block 102. In this cascade, the modular blocks exhibit same geometry input and output launches to make prototype design easier for the designer. In this manner, the modular blocks are readily cascaded together in end to end fashion with the output launch of one modular block being coupled to the input launch of an adjacent modular black in the cascade.

Figure 14:
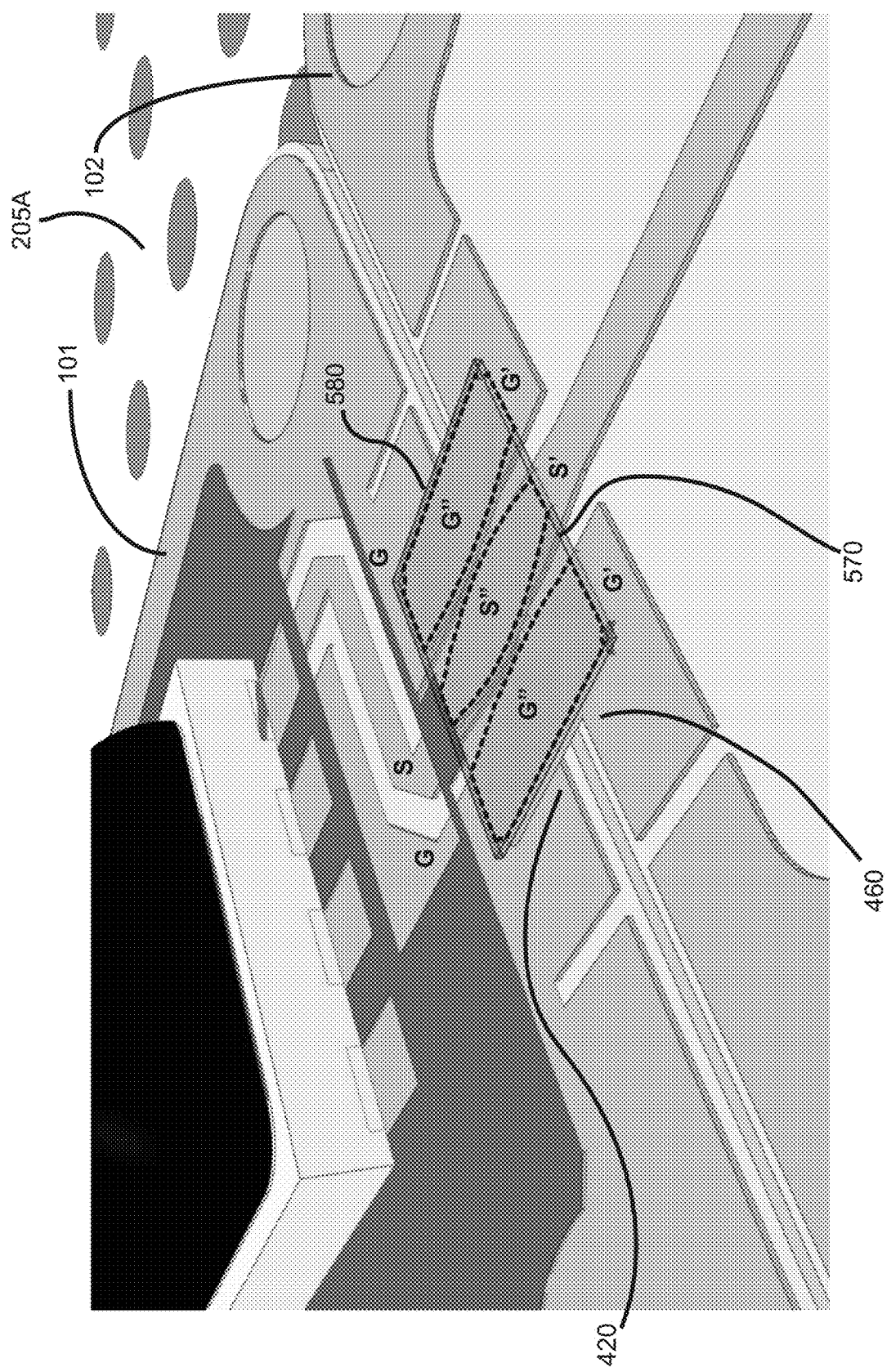
FIG. 14 is a close-up top perspective view showing a flex connector that couples together launches in adjacent modular blocks.

One embodiment of a connection mechanism between output launch 420 of modular block 101 and input launch 460 of modular block 102 is now discussed. Flex connector 580 and anchor 601 (not shown in FIG. 14) together provide this connection mechanism. In this particular embodiment wherein output launch 420 includes 3 conductors (ground G, signal S, ground G) to be connected to 3 conductors (ground G', signal S', ground G'), respectively, of adjacent input launch 460, flex connector 580 provides the electrical connections therebetween. Flex connector 580 is fabricated from a sheet of flexible electrically insulative material on which conductors G", S" and G" are situated. Conductors G", S" and G" are shown in dashed line in FIG. 14 because these conductors are situated on the bottom of flex connector 580 as viewed in FIG. 14.

While tolerances are held tightly in the manufacture of modular blocks 101 and 102 and other modular blocks, it is possible that the vertical height of the printed circuit board substrate used in these modular blocks may vary slightly. It is thus possible that output launch 420 of modular block 101 is not precisely coplanar with respect to the input launch 460 of adjacent modular block 102. The flexibility of flex connector 580 allows for this differential height variance between the output launch 420 and input launch 460. Anchors, discussed in more detail below with reference to FIGS. 17-24, assist in compensating for this differential height variance.

Figure 15:
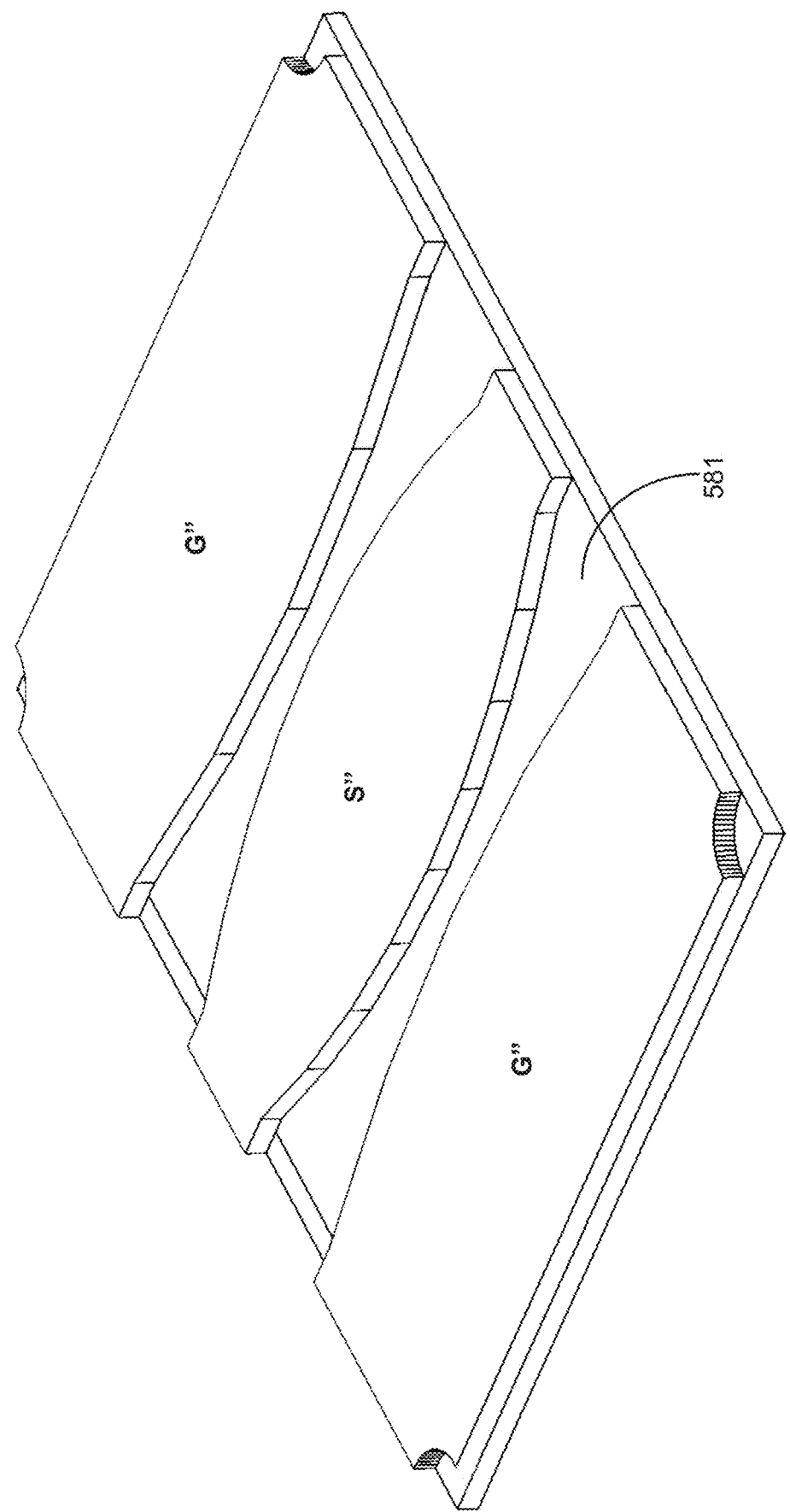
FIG. 15 is a perspective view of the bottom of the flex connector of FIG. 14.

FIG. 15 shows a bottom side perspective view of flex connector, i.e. flex jumper 580. Flex connector 580 includes a layer 581 of flexible, electrically insulative material. In this particular embodiment, flex connector 580 includes flexible electrical conductors G", S" and G" situated on layer 581, as shown. Flex connector 580 provides a bridge, i.e. a jumper, between the conductors of output launch 420 of modular block 101 and the respective conductors of input launch 460 of modular connector 102. Electrical conductors G", S" and G" of flex connector, i.e. flex jumper, 580, may be fabricated of copper impregnated with diamond particular interconnect material upon which a layer of gold is deposited for each conductor to enhance electrical coupling.

Figure 16:
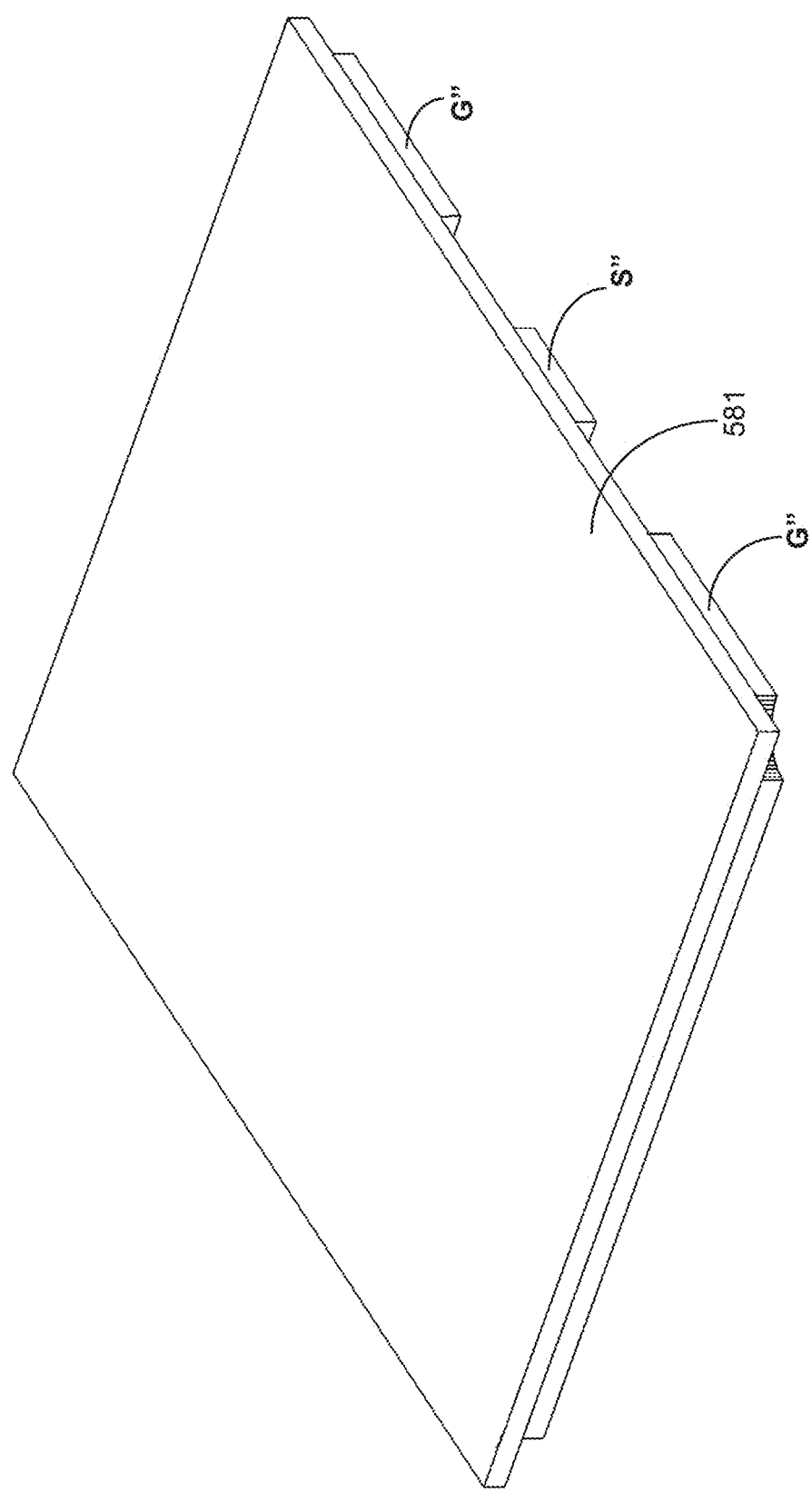
FIG. 16 is a top perspective view of the flex connector of FIG. 14.

FIG. 16 shows a top side perspective view of flex connector 580. Flex connector 580 include flexible sheet 581 on which conductors G", S" and G" are disposed.

Figure 17:
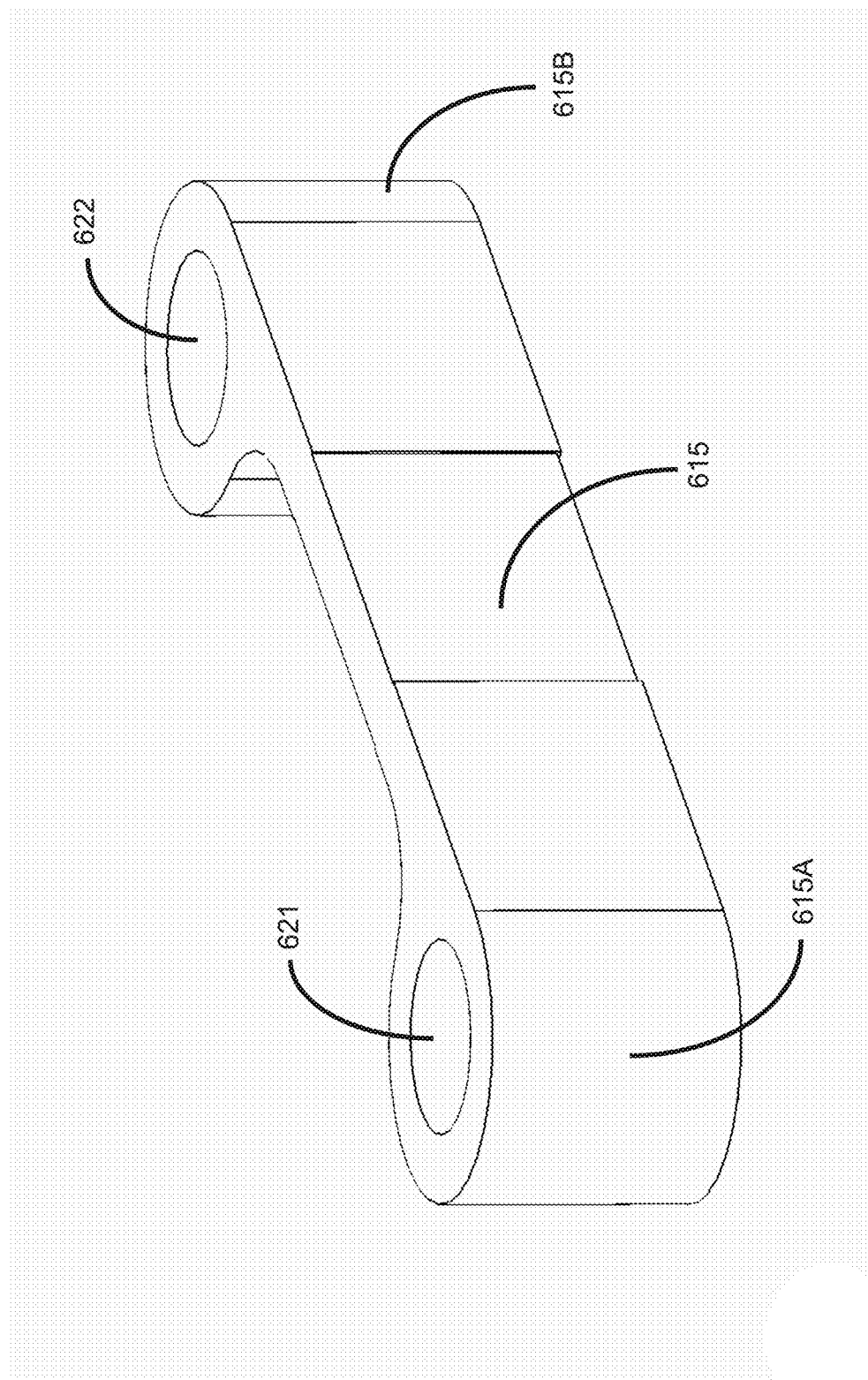
FIG. 17 shows a top front perspective view of an anchor used to hold the flex connector in place on a launch of a modular block.
Figure 22:
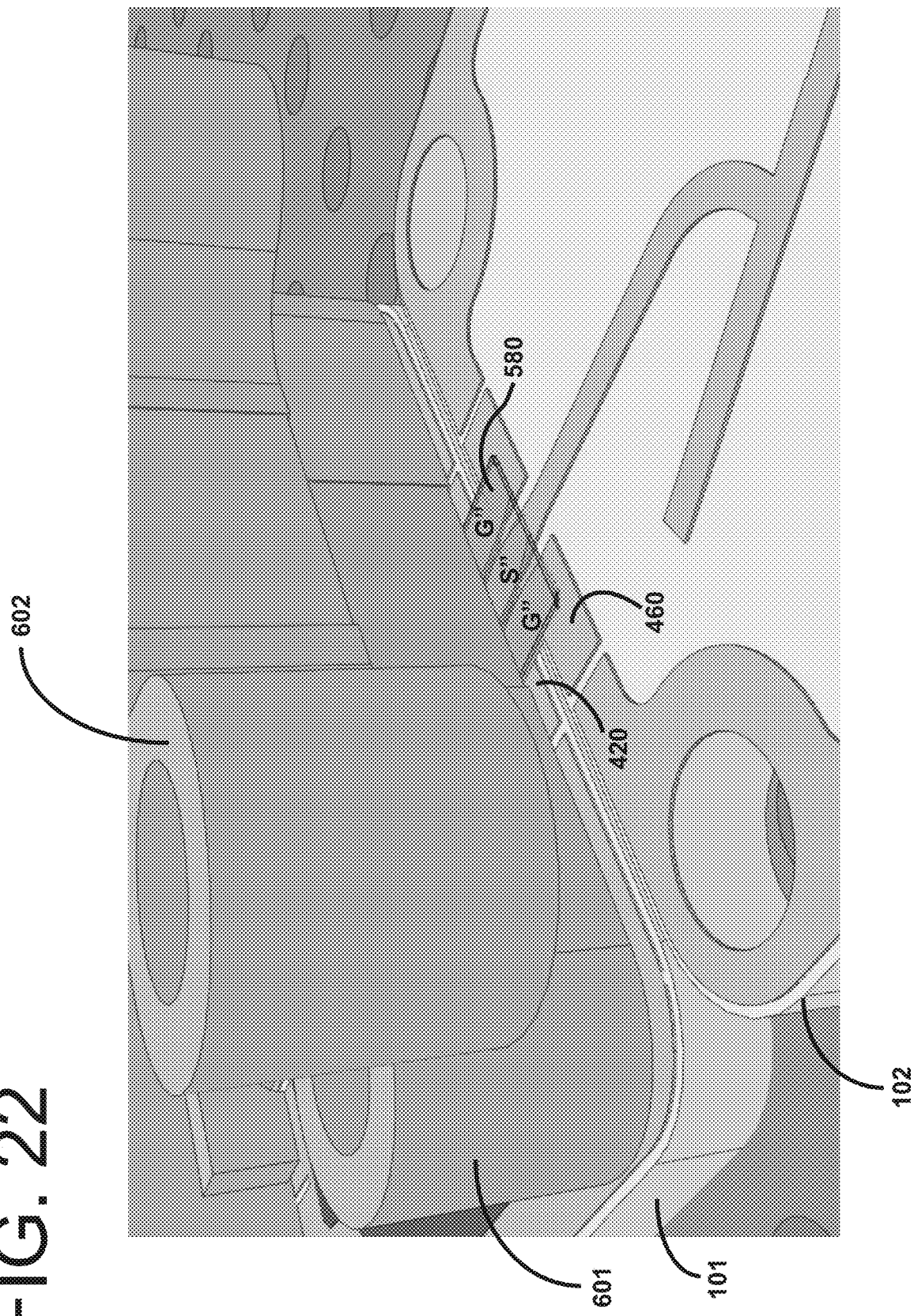
FIG. 22 shows an anchor being moved fully into position atop a launch of a modular block.
Figure 23:
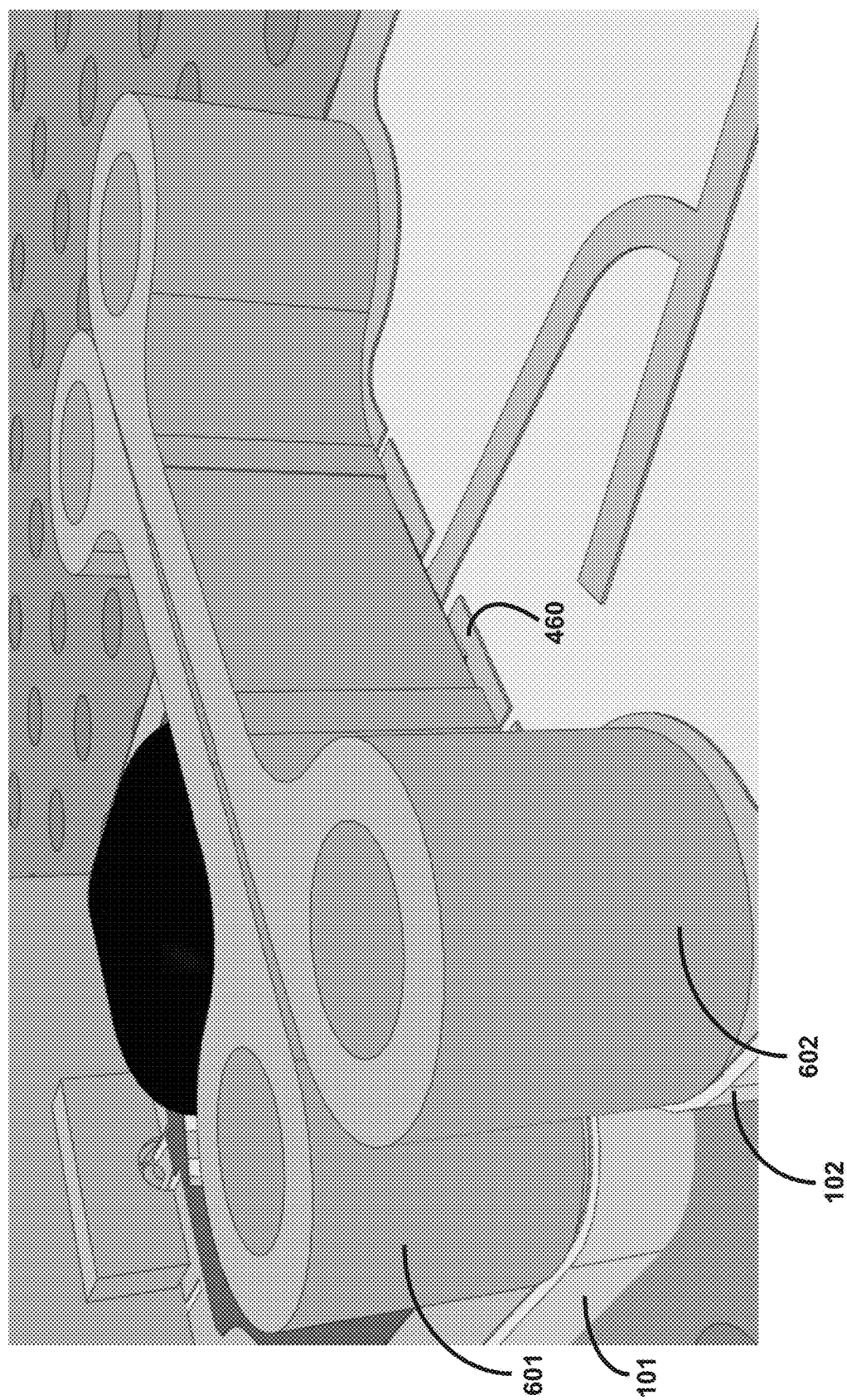
FIG. 23 shows another anchor being moved fully into position atop a launch of an adjacent modular block.

FIG. 17 shows a representative anchor 601 that holds one end of conductors G", S" and G" in place at output launch 420 of modular block 101, as seen more clearly in FIGS. 21, 22 and 23 that are discussed in more detail below. Returning to FIG. 17, anchor 601 includes a main body 615 with vertical holes 621 and 622 situated at the opposed ends 615A and 615B thereof. In one embodiment, main body 615 may be fabricated from FR4 material.

Figure 18:
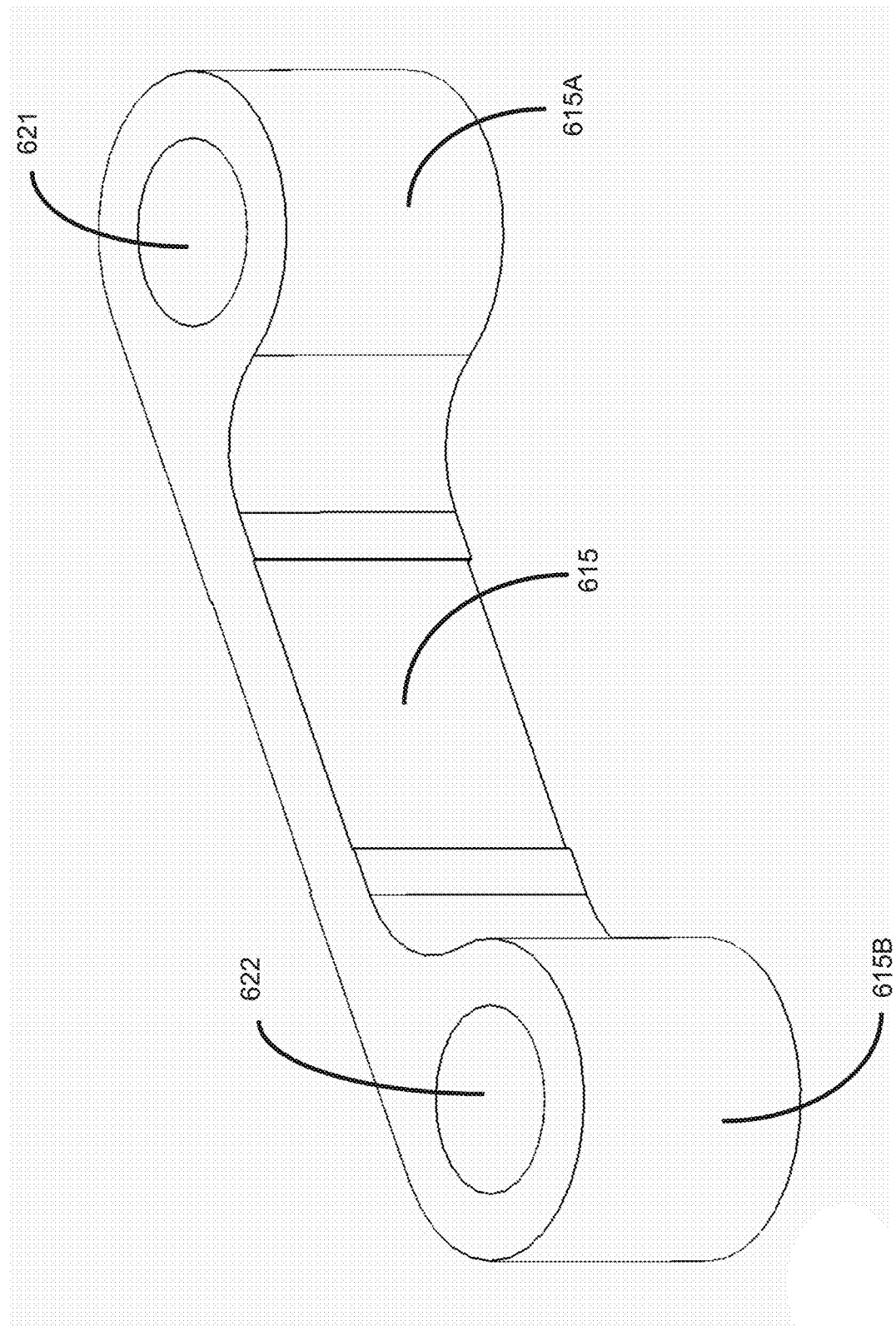
FIG. 18 shows a top rear perspective view of the anchor of FIG. 17.
Figure 19:
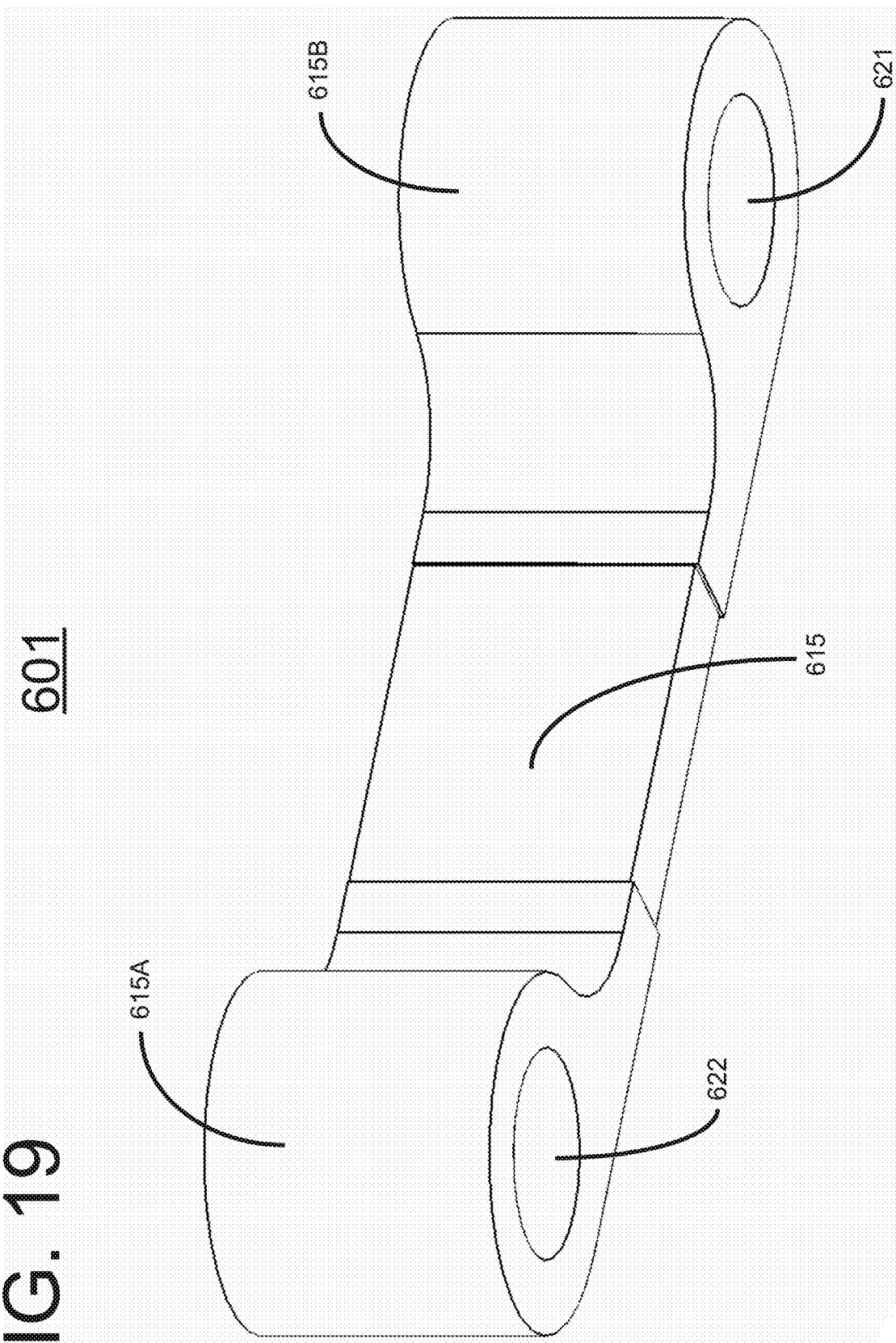
FIG. 19 shows bottom rear perspective view of the anchor of FIG. 17.
Figure 20:
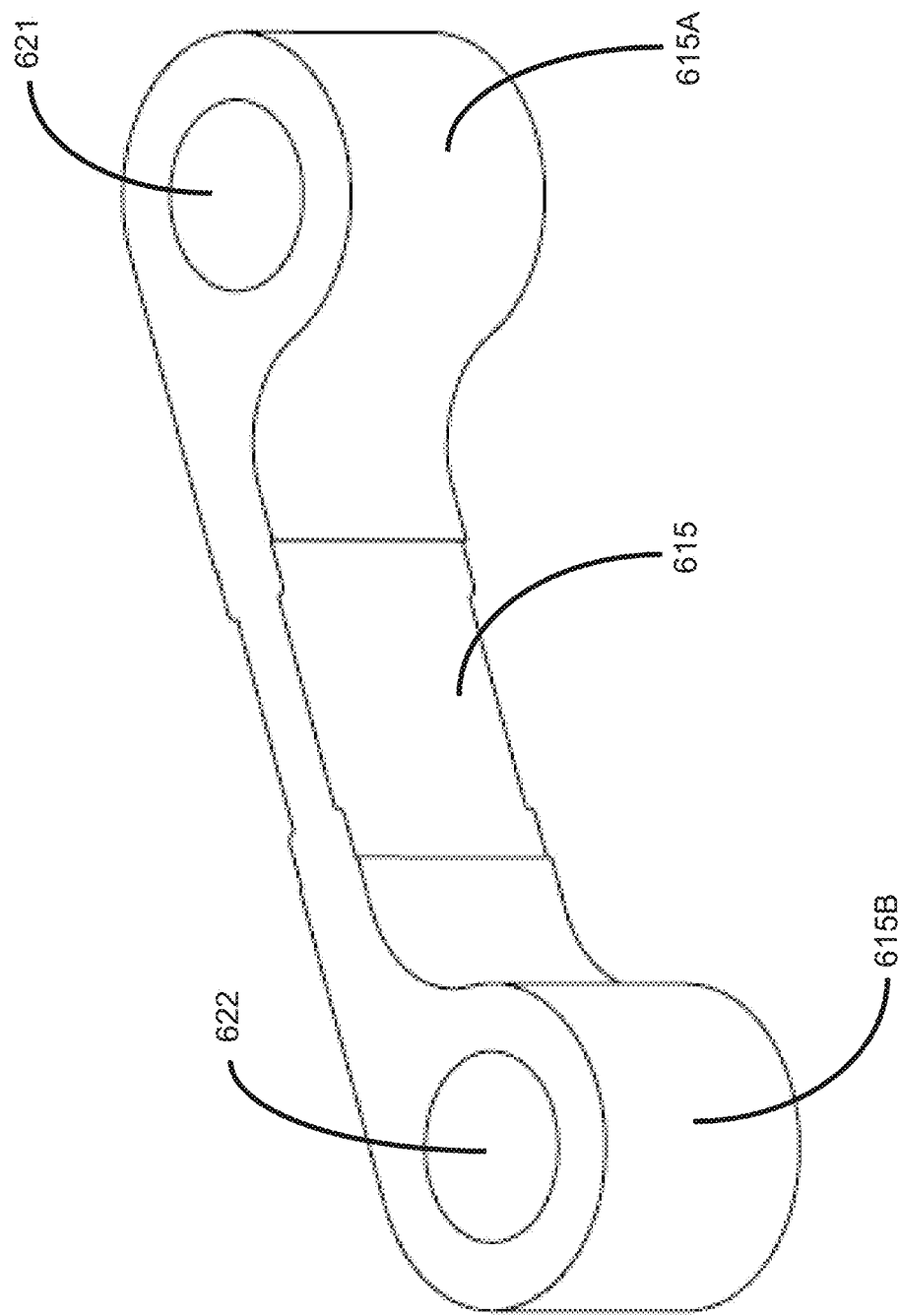
FIG. 20 is another top rear perspective view of the anchor of FIG. 17.

FIG. 17 showed anchor 601 from a top front perspective view, whereas FIG. 18 shows anchor 601 from a top rear perspective view. FIG. 19 shows anchor 601 from a bottom rear perspective view. FIG. 20 is another representation of anchor 601 from a top rear perspective view similar to the view of FIG. 18.

Figure 21:
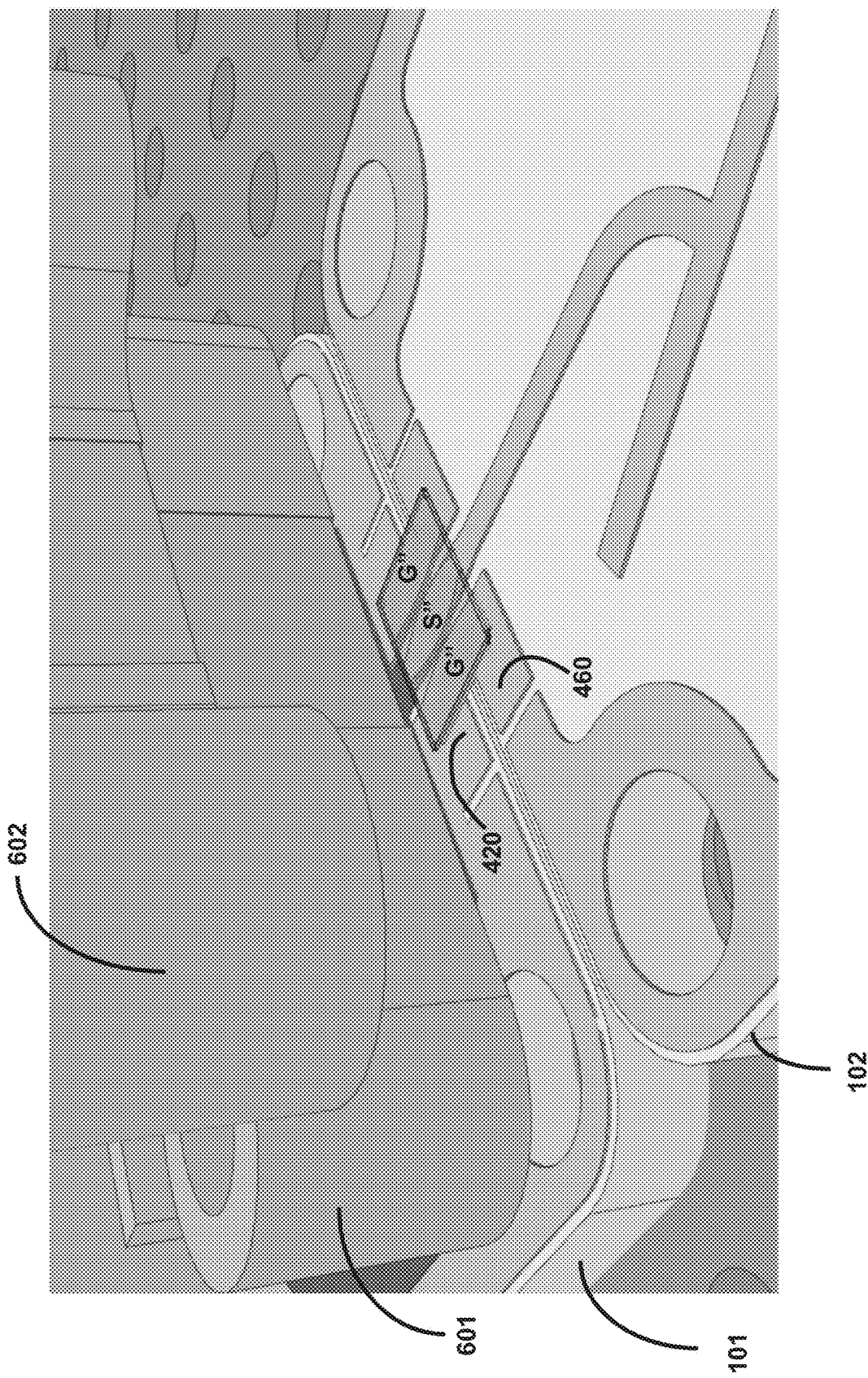
FIG. 21 shows an anchor being moved into position atop a launch of a modular block.

Referring now to FIG. 21, the process of connecting anchor 601 to modular block 101 is discussed. It is noted that connecting anchor 601 to modular block 101 holds one end of flex connector 580 in place at output launch 420 of modular block 101. More particularly a screw (not shown) is pushed through hole 622 of anchor 601, through hole 602 of modular block 101 below and is threaded to a thread hole (not visible) in conductive plate 205 below modular block 101. Another screw (not shown) connects the opposite anchor end 615B through modular block 101 to conductive plate 205.

Figure 24:
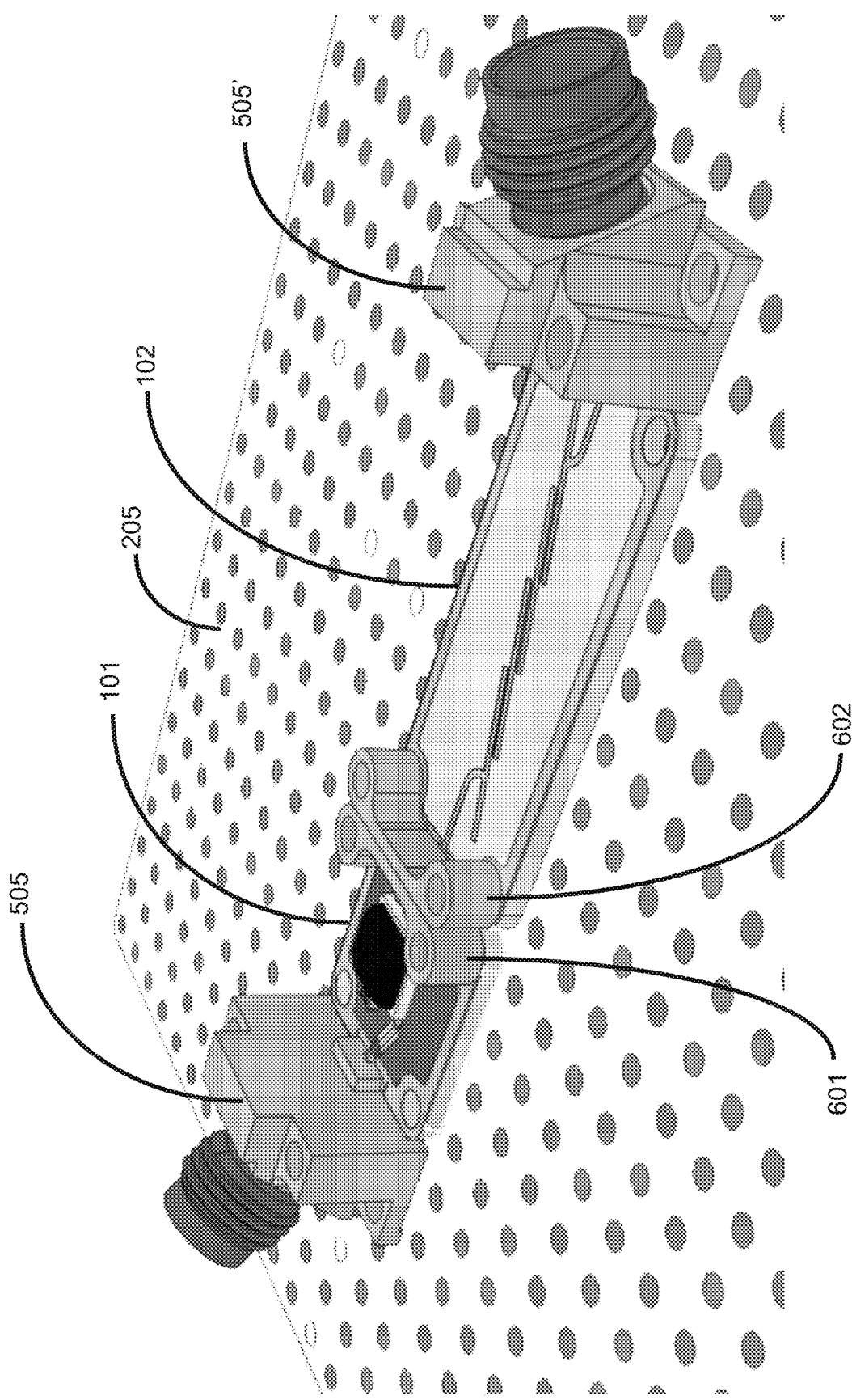
FIG. 24 shows two adjacent modular blocks coupled together using the disclosed flex connector and anchor methodology.
Figure 25:
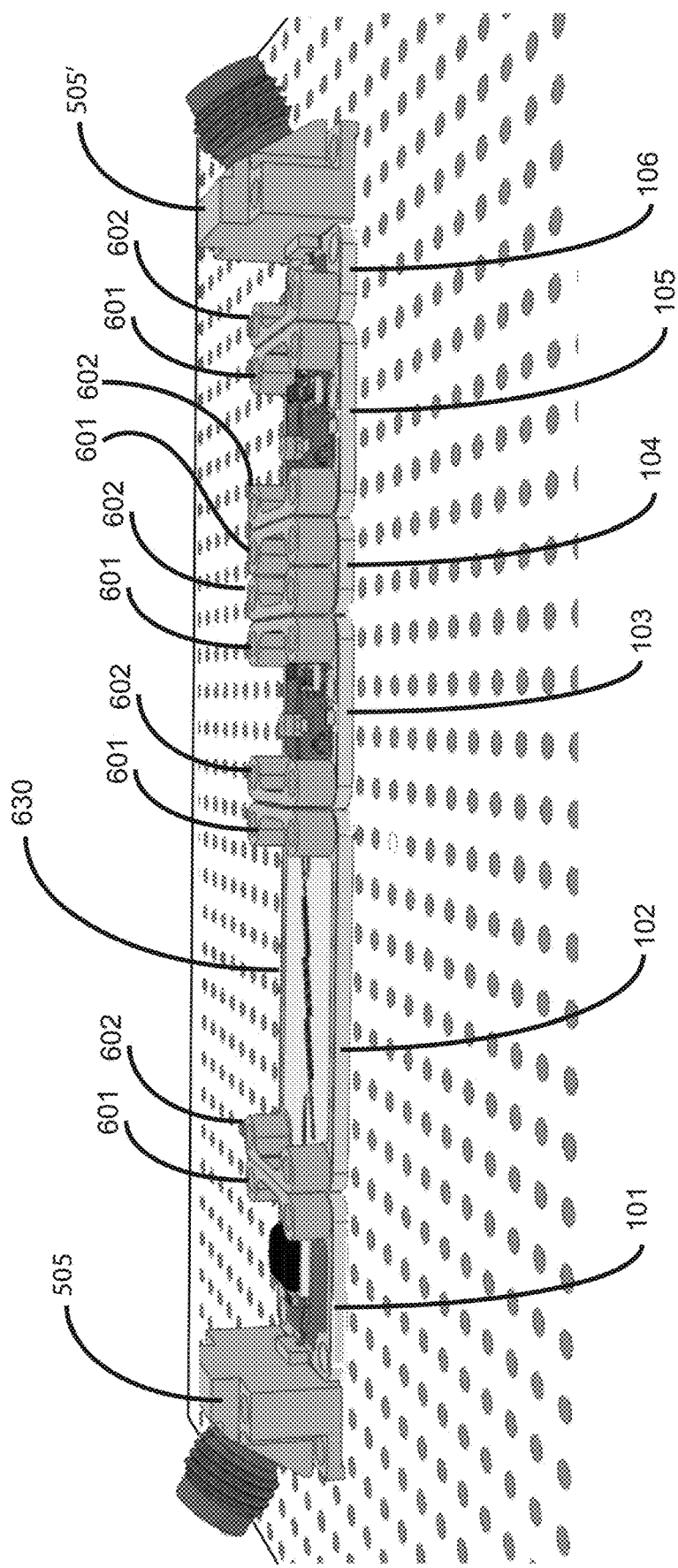
FIG. 25 shows a cascade of six modular blocks coupled together using the disclosed flex connector and anchor methodology.
Figure 26:
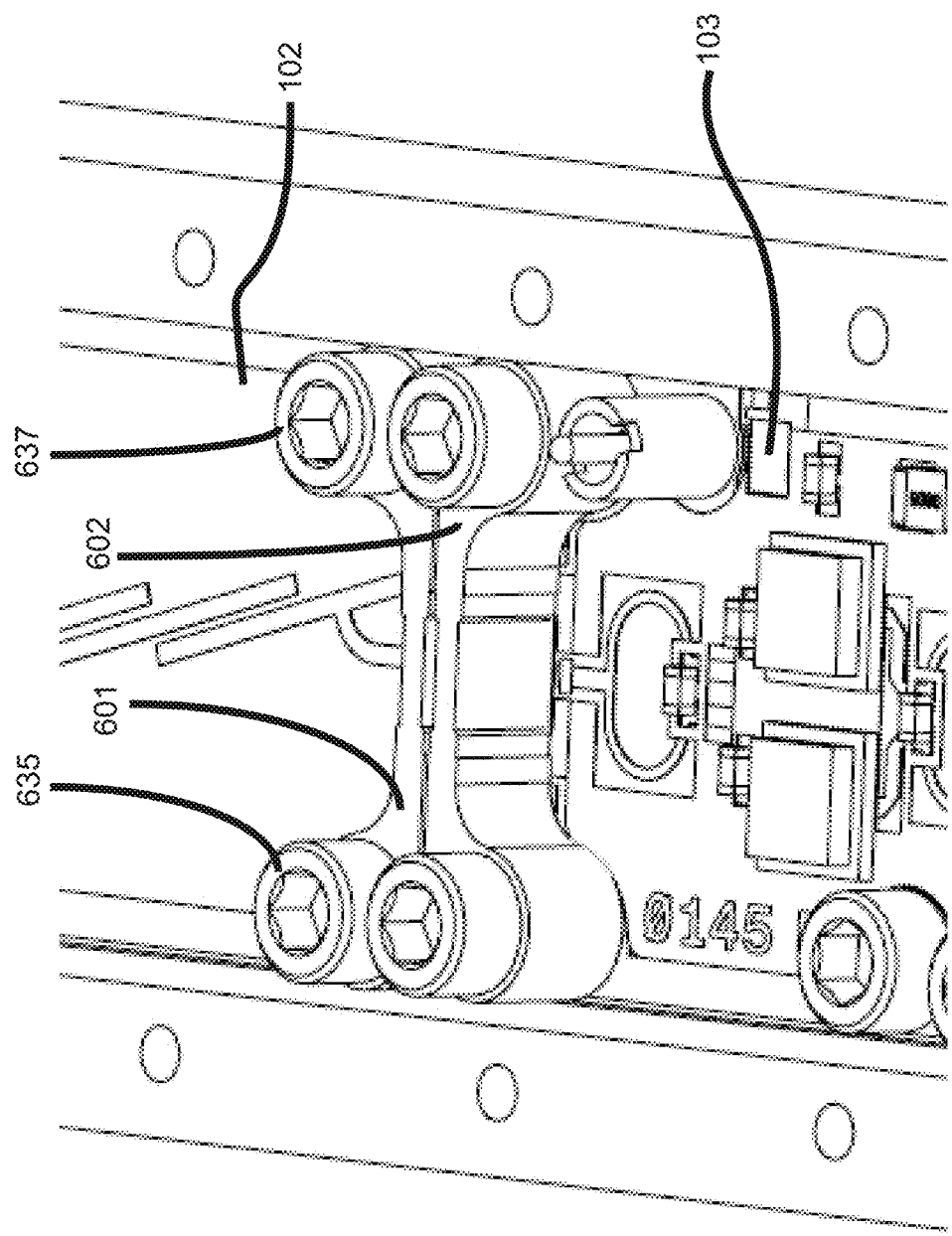
FIG. 26 is another perspective view showing the launches of adjacent modular blocks coupled together using the disclosed flex connector and anchor methodology

FIG. 21 shows anchor 601 not yet in contact with flex connector 580. However, FIG. 22 shows flex connector 580 now in contact with flex connector 580 so it can hold flex connector 580 to output launch 420 of modular block 101. In FIG. 22, anchor 602 is not yet in position atop flex connector 580 above input launch 460 thereof. FIG. 23 shows anchor 602 now in place atop the flex connector adjacent input launch 460 of modular block 102. The opposed ends of the anchor are screwed through holes in modular block and conductive plate 205 in the same manner as anchor 601. In this manner the opposite ends of the flex connector are held to output launch 420 and input launch 460 to provide good electrical connections between the output launch 420 and the input launch 460. FIG. 24 shows modular blocks 101 and 102 coupled together by the above described flex connector and anchor methodology. FIG. 25 shows a cascade of a higher number of modular blocks namely modular blocks 101, 102, 103, 104, 105 and 106. The modular blocks are together via flex connects and anchors as described above. Anchors designated as anchor 601 and 602 hold flex connectors (not visible in this view) at respective input and output launches of the modular blocks 101-106. Modular block 101 and 106 connected in this manner form a cascade FIG. 26 shows additional detail of anchors 601 and 602 being used to coupled adjacent modular blocks 102 and 103 together. Representative screws 635 and 637 are visible in this view. Screws 635 and 637 extend through holes in the opposed ends of anchor 601, through corresponding aligned holes in modular block 102 and are threaded into corresponding aligned holes in a conductive member, e.g. a conductive plate, below modular blocks 102 and 103.

Figure 27:
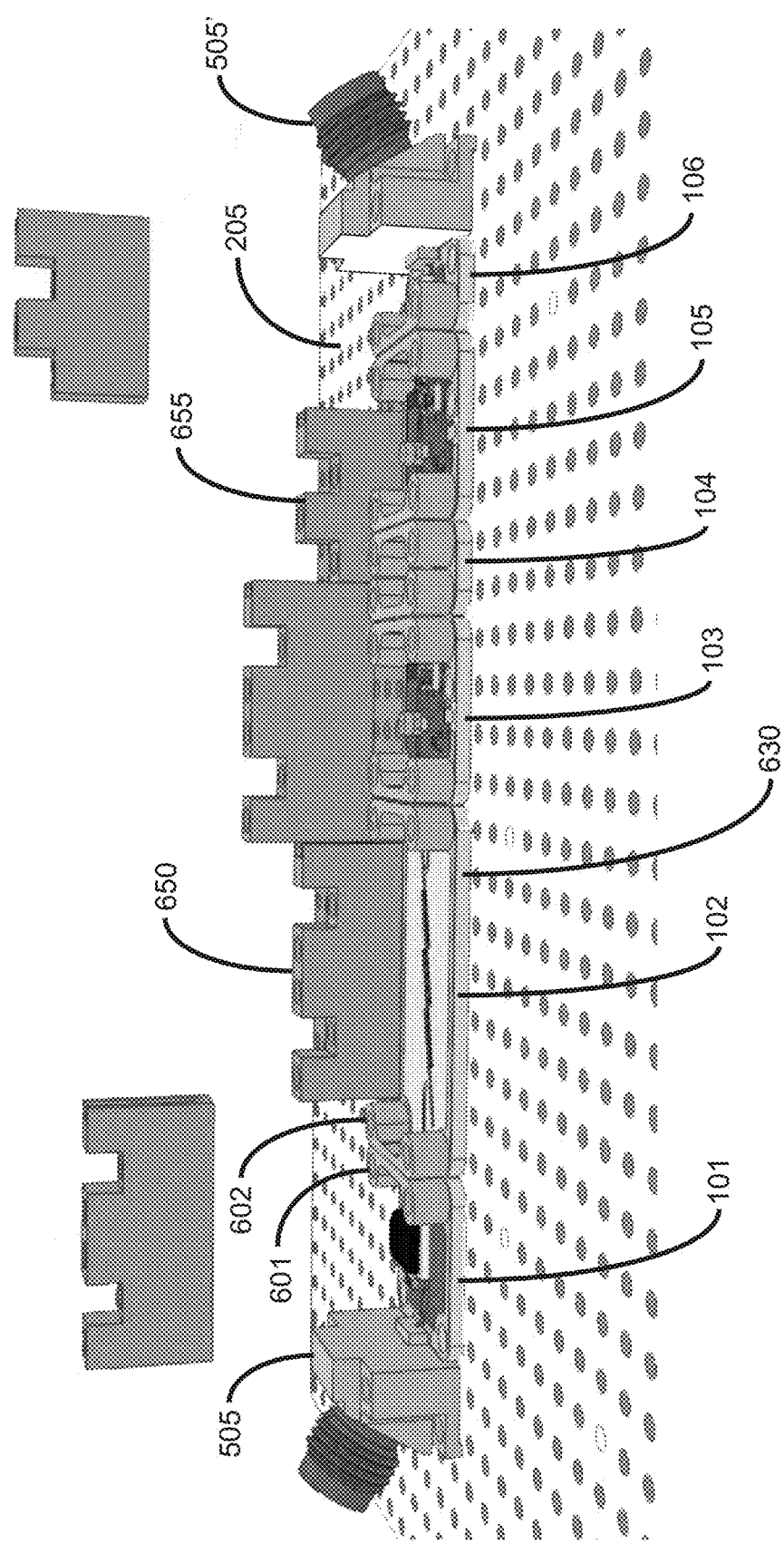
FIG. 27 is a side perspective view of a cascade of modular blocks that shows modular wall pieces being positioned on a conductive plate to form a portion of a prototype housing for the cascade.
Figure 28:
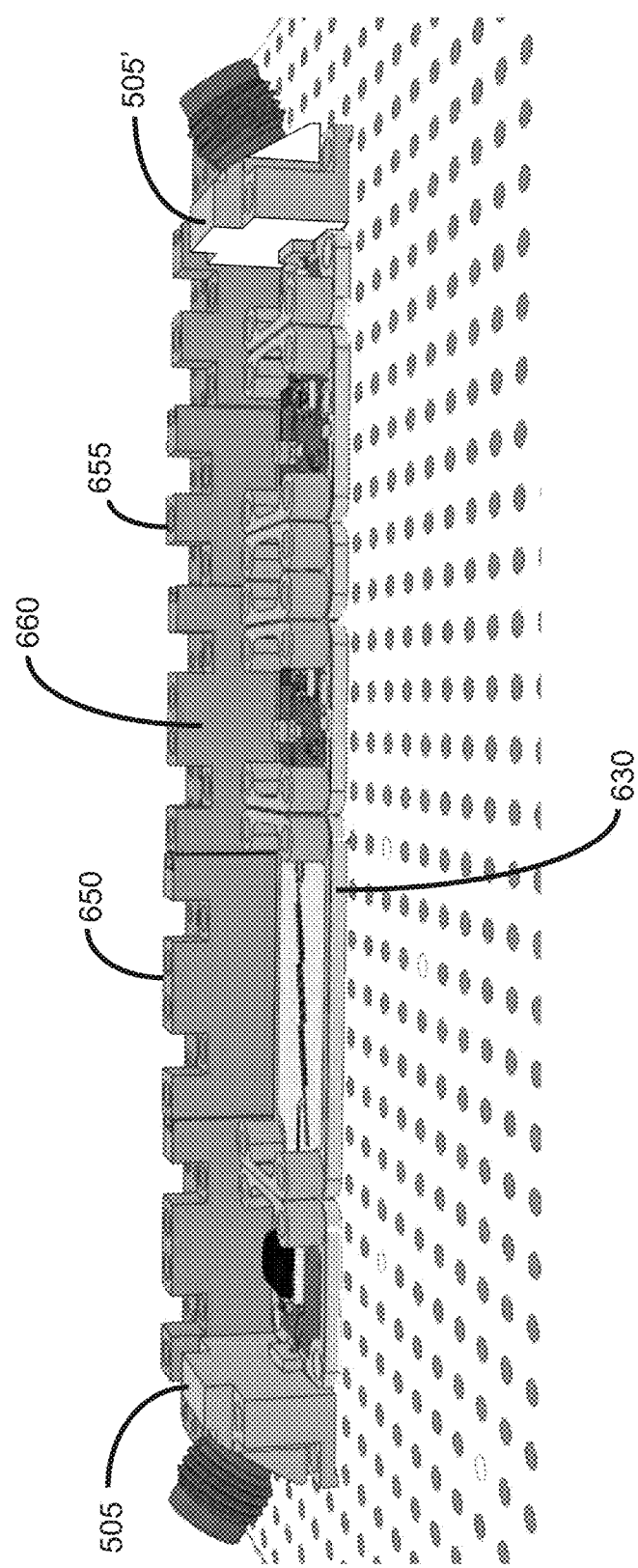
FIG. 28 shows a completed wall of a prototype housing for the cascade.

FIG. 27 is a side perspective view of cascade 630 that shows modular wall pieces such a representative wall pieces 650 and 655 being positioned on conductive plate 205 to form a portion of a prototype housing for cascade 630. FIG. 28 shows wall pieces such as wall pieces 650 and 655 positioned on conductive plate 205 to form a completed wall 660 of a prototype housing for cascade 630.

Figure 29:
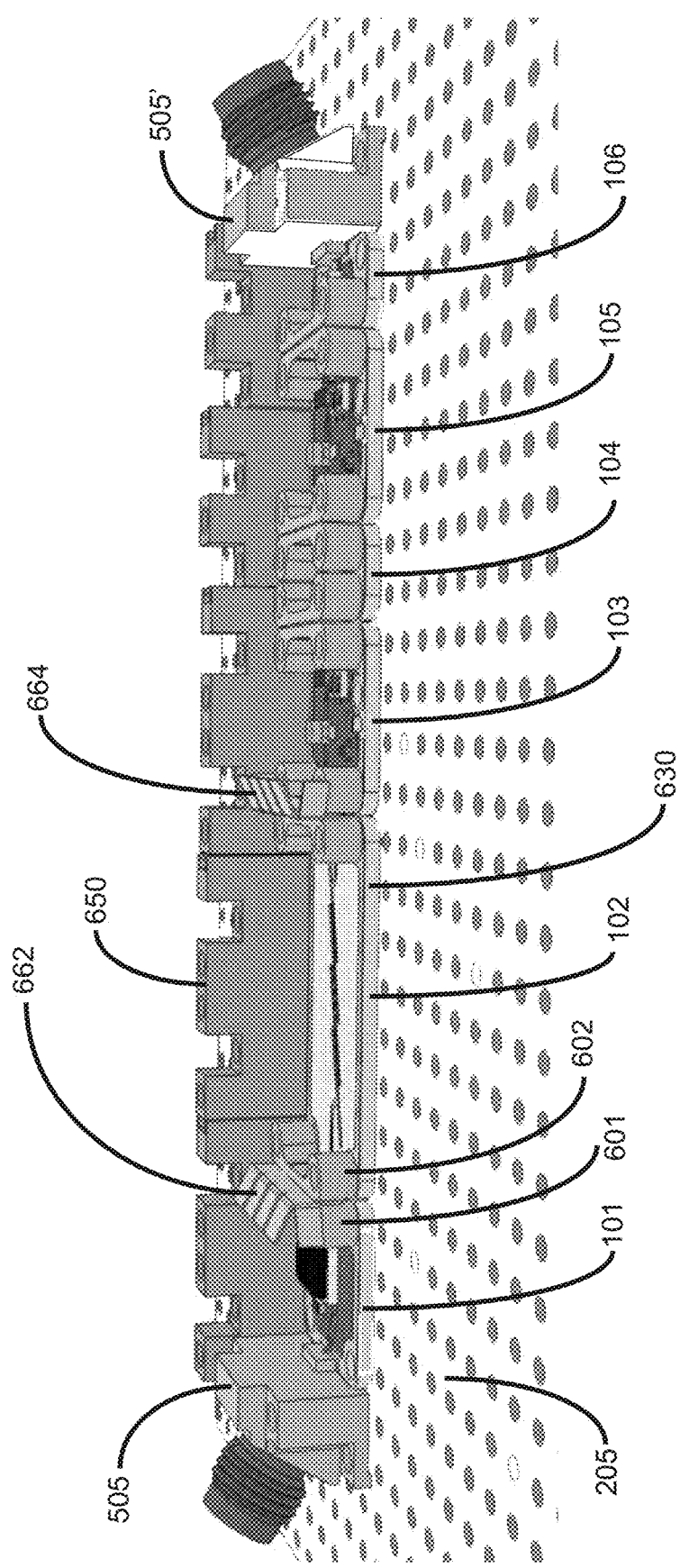
FIG. 29 depicts shields installed between modular blocks in the cascade.
Figure 30:
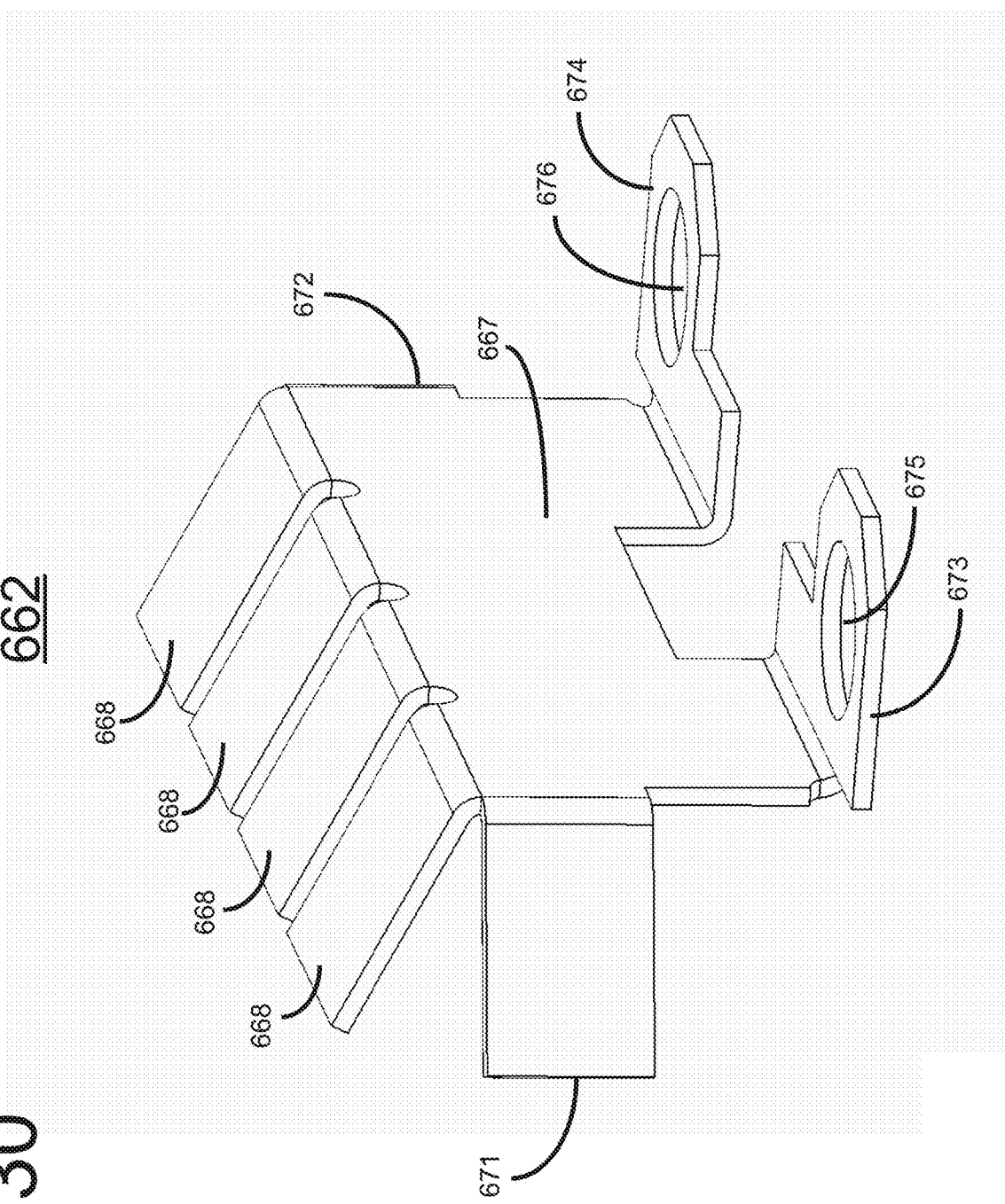
FIG. 30 is a top front perspective view of a shield in the cascade.
Figure 31:
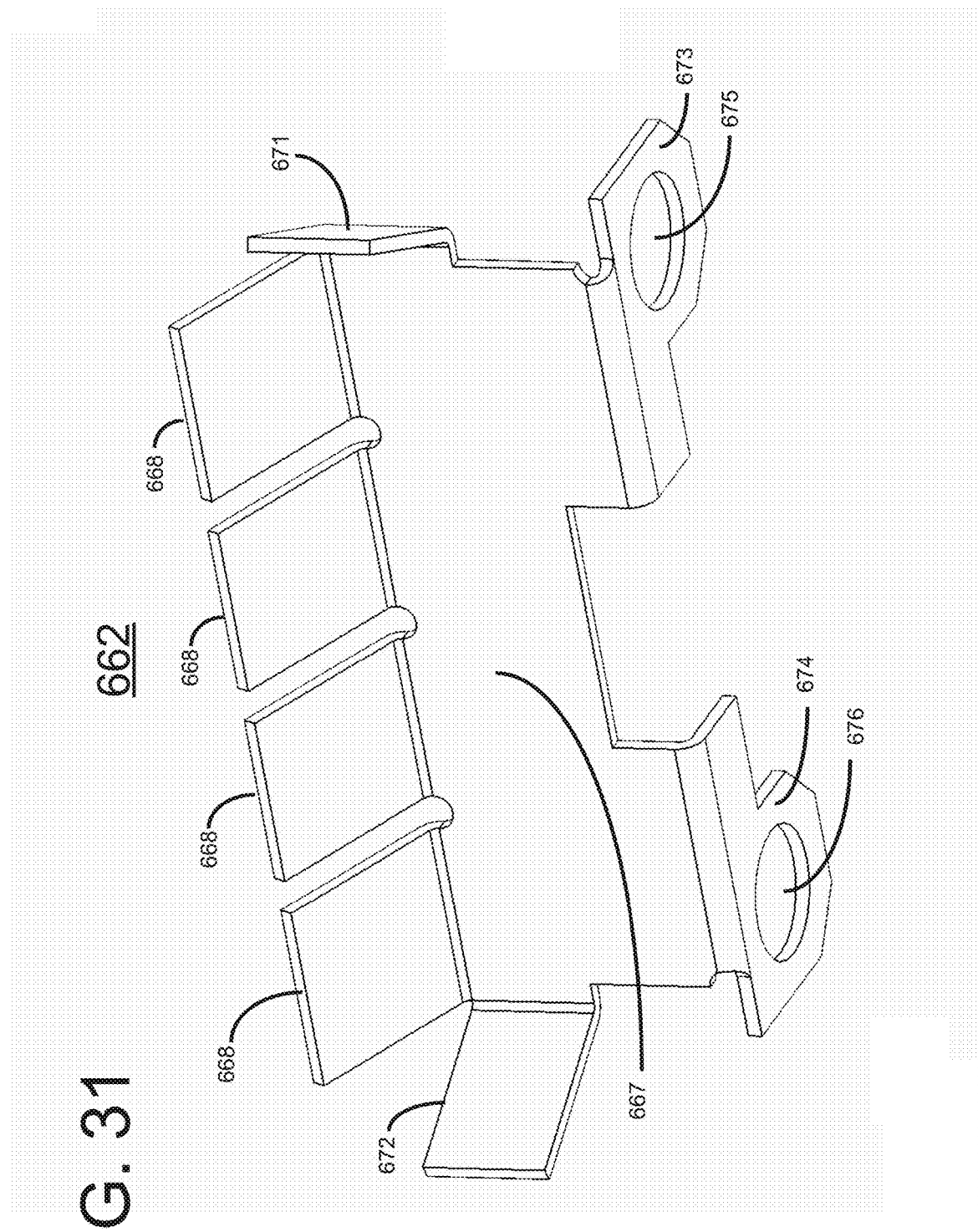
FIG. 31 is a back bottom perspective view of a shield in the cascade.

FIG. 29 shows cascade 630 with the partially assembled prototype housing with shield 662 now installed between modular blocks 101 and 102 at anchors 601 and 602. Another shield 664 is likewise installed between modular blocks 102 and 103 as shown. FIG. 30 is a top front perspective view of shield 662. FIG. 31 is a back bottom perspective view of shield 662. In one embodiment, shield 664 is identical to shield 662. As seen in FIG. 30, shield 662 includes a main shield body 667 above which 4 top prongs 668 angularly extend. Prongs 668 are adapted to contact the underside of the top of the underside of prototype housing lid (not shown in this view). Side prongs 671 and 672 extend angularly and laterally away from main shield body 667 at opposite side ends of main shield body 667. Side prongs 671 and 672 are adapted to contact opposite side walls of the prototype housing. The base of main shield body 667 includes mounting brackets 673 and 674, as depicted. Mounting brackets 673 and 674 include mounting holes 675 and 676, respectively. The same two screws that mount anchor 601 of FIG. 29 to modular block 101 and conductive plate 205 below are used to mount shield 662 via mounting holes 675 and 676 of shield 662. FIG. 31 provides a bottom rear perspective view of shield 662.

Figure 32:
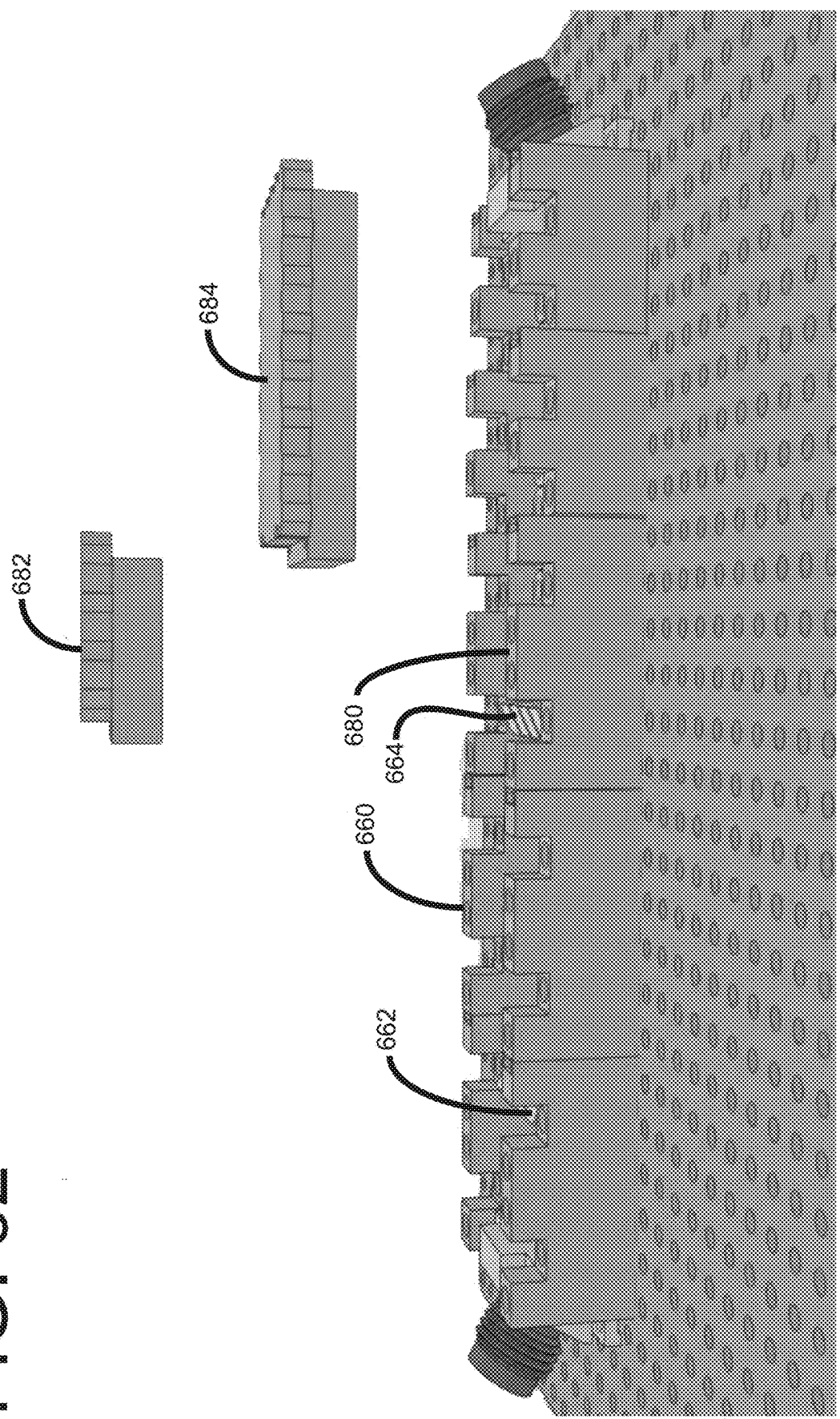
FIG. 32 is a side perspective view showing modular lid pieces being moved into place on the walls of the housing.
Figure 33:
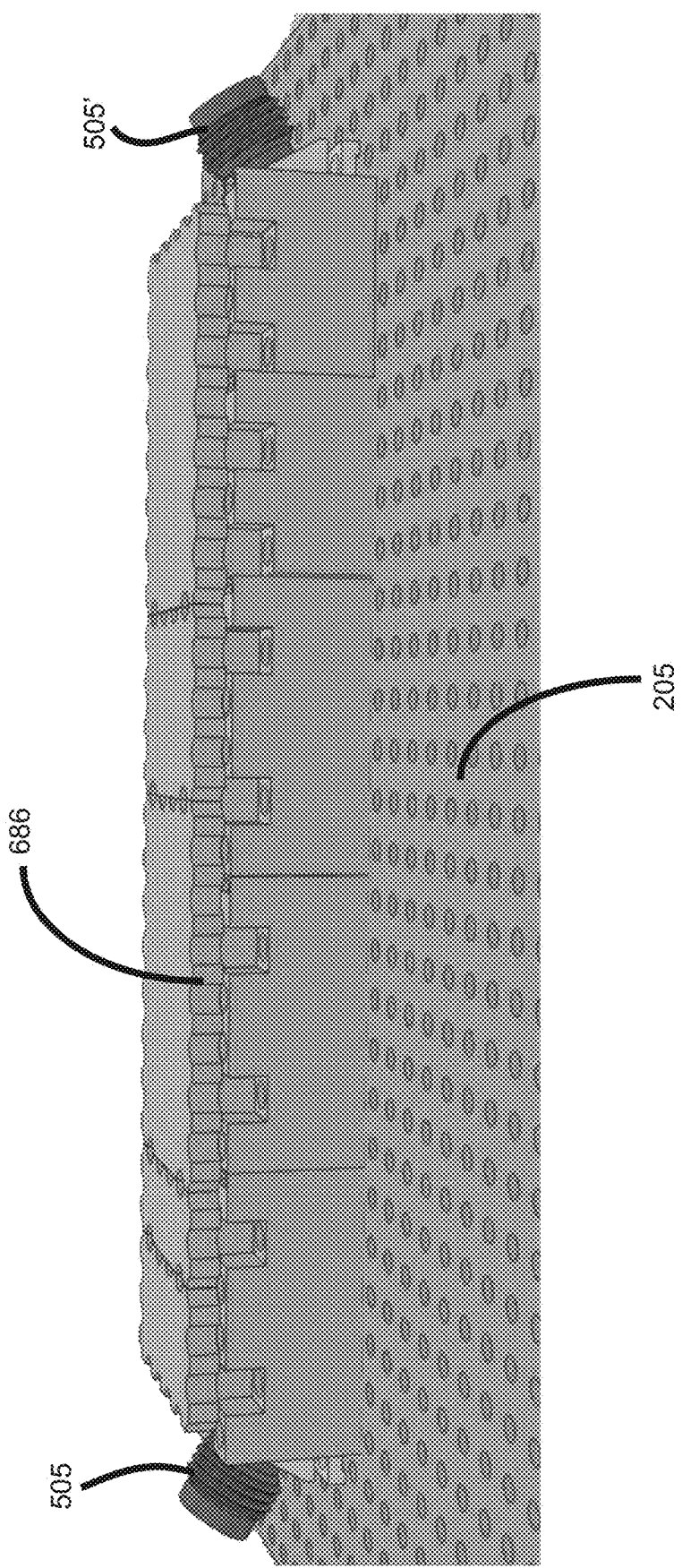
FIG. 33 is a side perspective view showing modular wall pieces and modular lid pieces of the housing.
Figure 34:
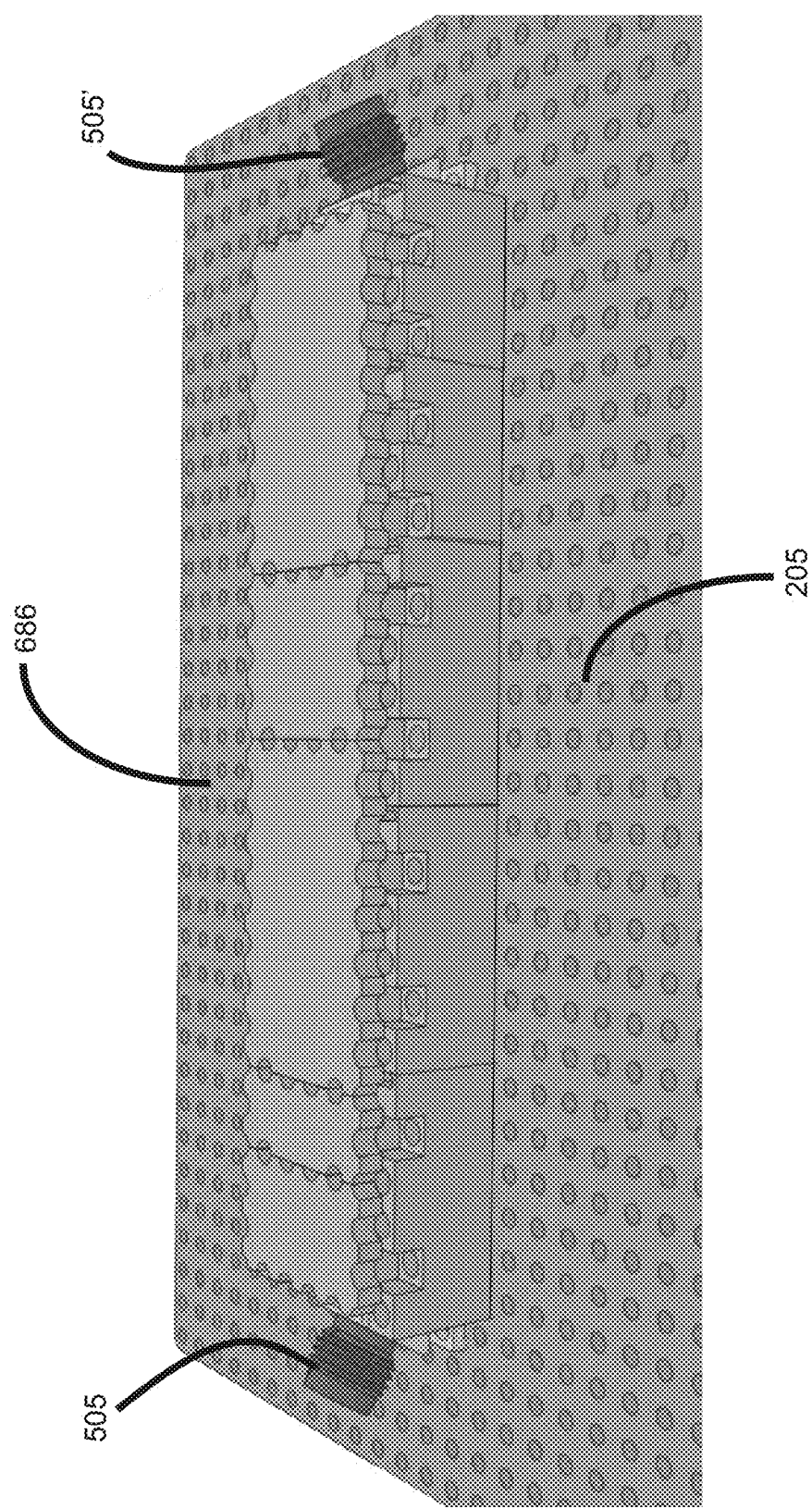
FIG. 34 is another side perspective view showing modular wall pieces and modular lid pieces of the housing.

FIG. 32 is a side perspective view of cascade 630 within the partially complete prototype housing formed by completed modular housing walls 660 and 680. Modular lid pieces 682 and 684 are positioned above completed walls 660 and 680, ready to be removably connected to the top of walls 660 and 680 to complete the prototype housing. Modular lid pieces 682 and 684 are fabricated from electrically conductive materials such as those used for completed walls 660 and 680. When lid pieces 682 and 684 are placed on top of completed walls 660 and 680, top prongs 668 of shield 662 and 668 electrically contact these lid pieces to form a cavity within the completed housing formed by the wall pieces and lid pieces. Side prongs 671 and 672 of shields 662 and 664 electrically contact walls 660 and 680. In this manner, shield 662 provides inter-stage shielding between modular block 101 and modular block 102. Similarly, shield 664 provides inter-stage shielding between modular block 102 and modular block 103. FIGS. 33 and 34 shows different perspective views of the completed prototype housing 686 formed by wall pieces and lid pieces as described above.

Figure 35:
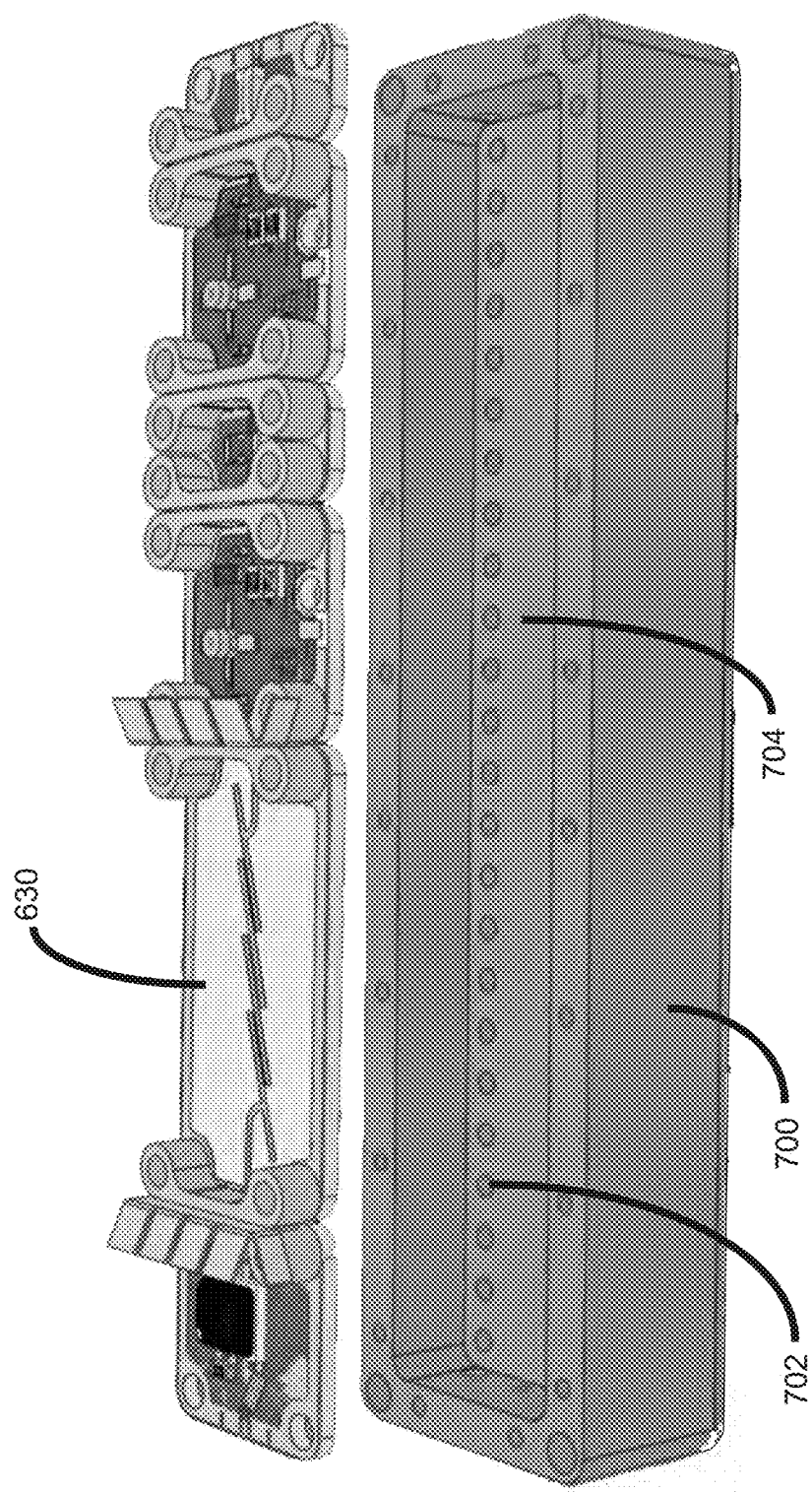
FIG. 35 shows the prototype cascade after removal from the prototype housing of FIGS. 33 and 34, and before installation in a production housing.

The prototype cascade 630 is removed from the prototype housing 686 and is situated above a production housing 700 such as a machined housing as shown in FIG. 35. Production housing 700 includes a grid of holes 702 that are situated on floor 704 to align with corresponding respective holes in the modular blocks of cascade 630. Other cavities (not shown) may be situated below floor 704 to supply control signals, power signals, regulated voltage signals and other signals running from below floor 704 through a hole 704 and through a hole in a modular block of cascade 630 to couple to that modular block. In one embodiment, a cross section of production housing 700 exhibits an H geometry wherein floor 704 is the cross member of the H and the walls of housing 700 above floor 704 together with the walls of housing 700 below floor 704 form the side members of the H. In this manner, each modular block of cascade 630 may receive appropriate bias signals, control signals and other signals or voltages or currents from electrical circuits below floor 704.

Figure 36:
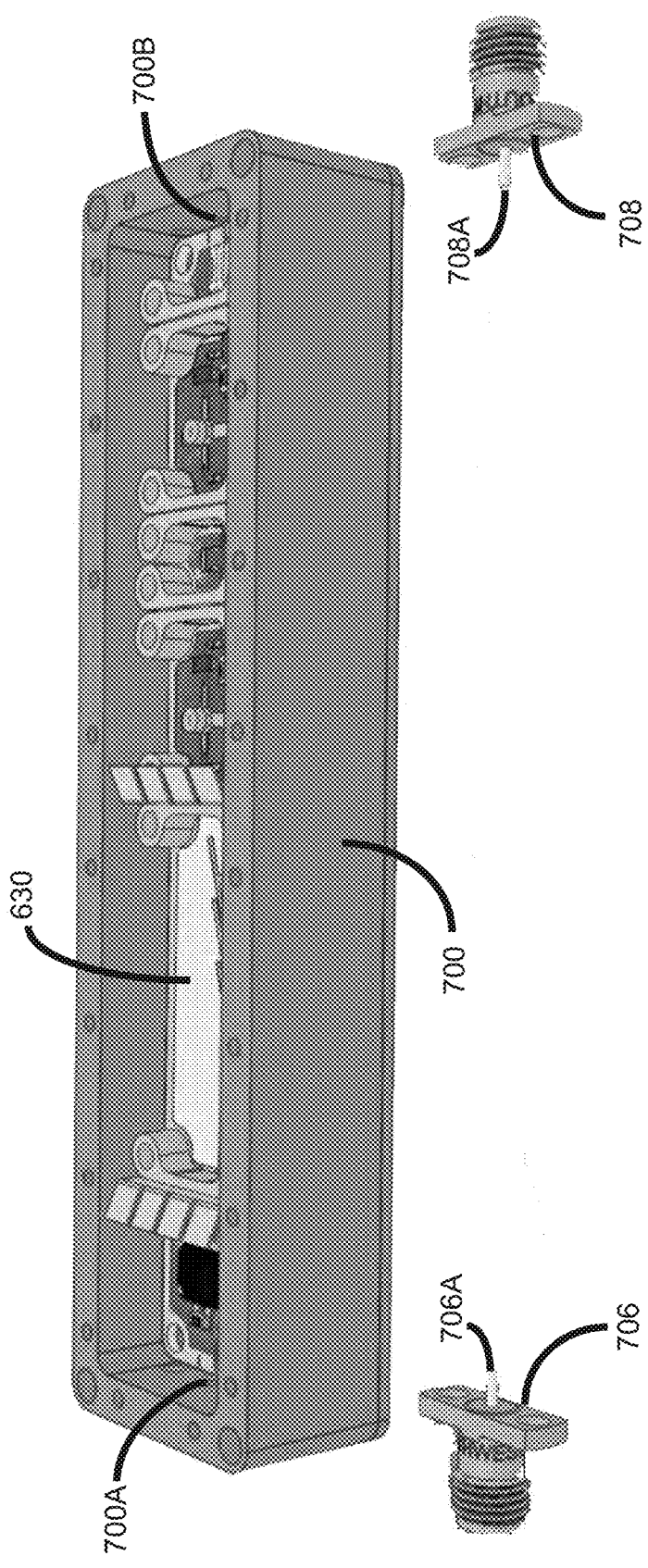
FIG. 36 shows the cascade now positioned in a production housing.
Figure 37:
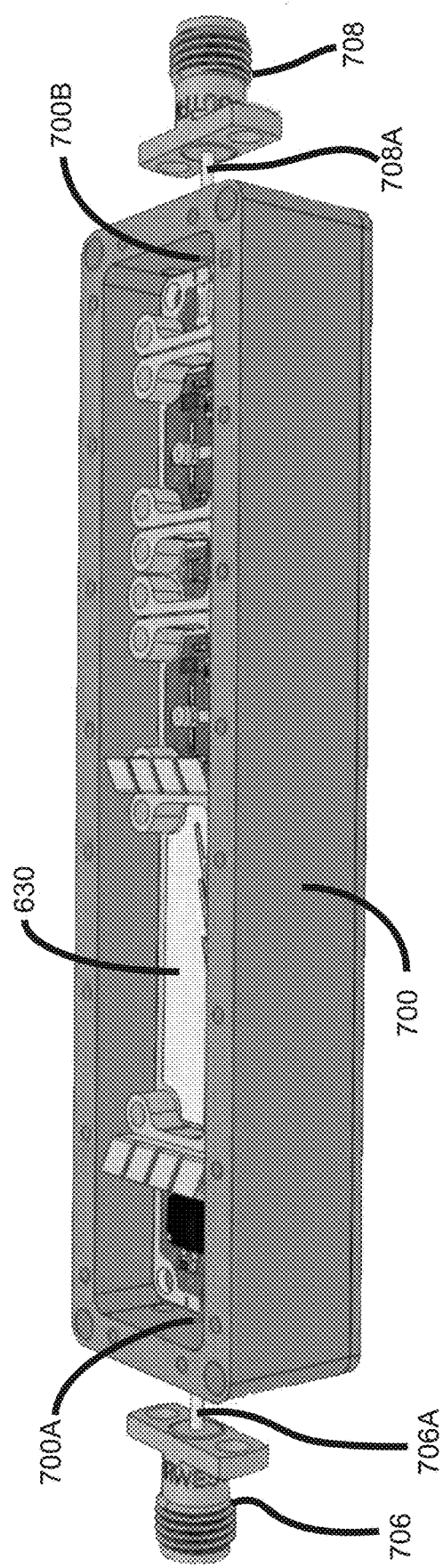
FIG. 37 shows two connectors ready for installation on the opposed ends of production housing.
Figure 38:
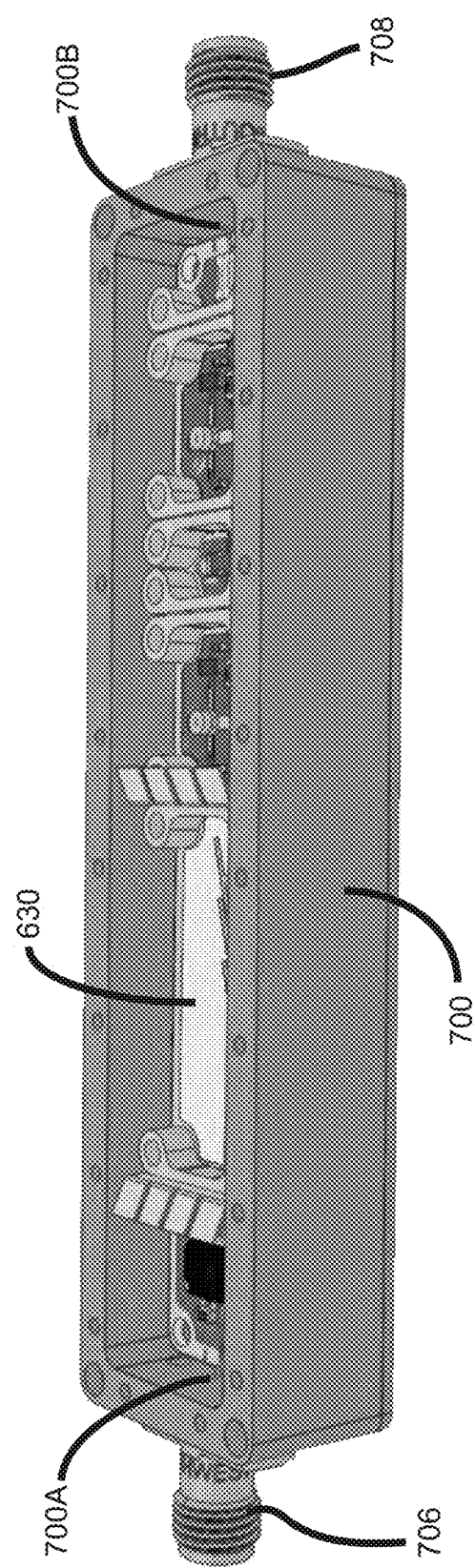
FIG. 38 shows the production housing with two connectors installed on the opposed ends of the production housing.

As seen in FIG. 36, cascade 630 is moved into production housing 700. Connectors 706 and 708 are situated adjacent the opposed ends of housing 700 as shown. Connectors 706 and 708 include connecting pins 706A and 708A, respectively. The opposed ends of production housing 700 include respective through holes 700A and 700B for receiving connecting pins 706A and 706B therein, respectively. As shown in FIG. 37, connectors 706 and 708 are moved into position adjacent through-holes 700A and 700B to be ready for installation. As seen in FIG. 38, connectors 706 and 708 are installed at the opposed ends of production housing 700 such that connective pins 706A and 706B (not shown) extend into through-holes 700A and 700B.

Figure 39:
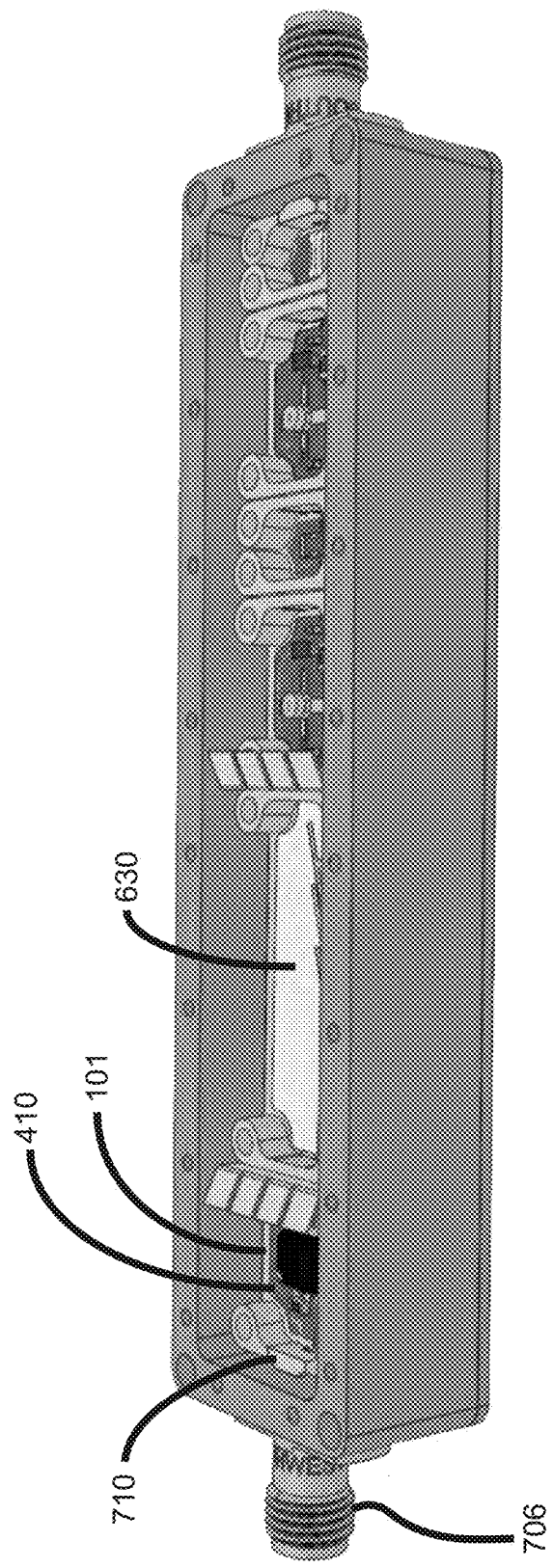
FIG. 39 shows a pin bridge installed adjacent an input launch of a modular block of the cascade situated within the production housing.

FIG. 39 shows a pin bridge 710 installed adjacent input launch 410 of modular block 101. As discussed in more detail below, pin bridge 710 is configured to smooth over the electrical discontinuity that would otherwise result from the center conductor of connector 706 coupling to input launch 410 of modular block 101. This reduces the undesired radiation of RF signals from connection of connector 706 to input launch 410.

Figure 40:
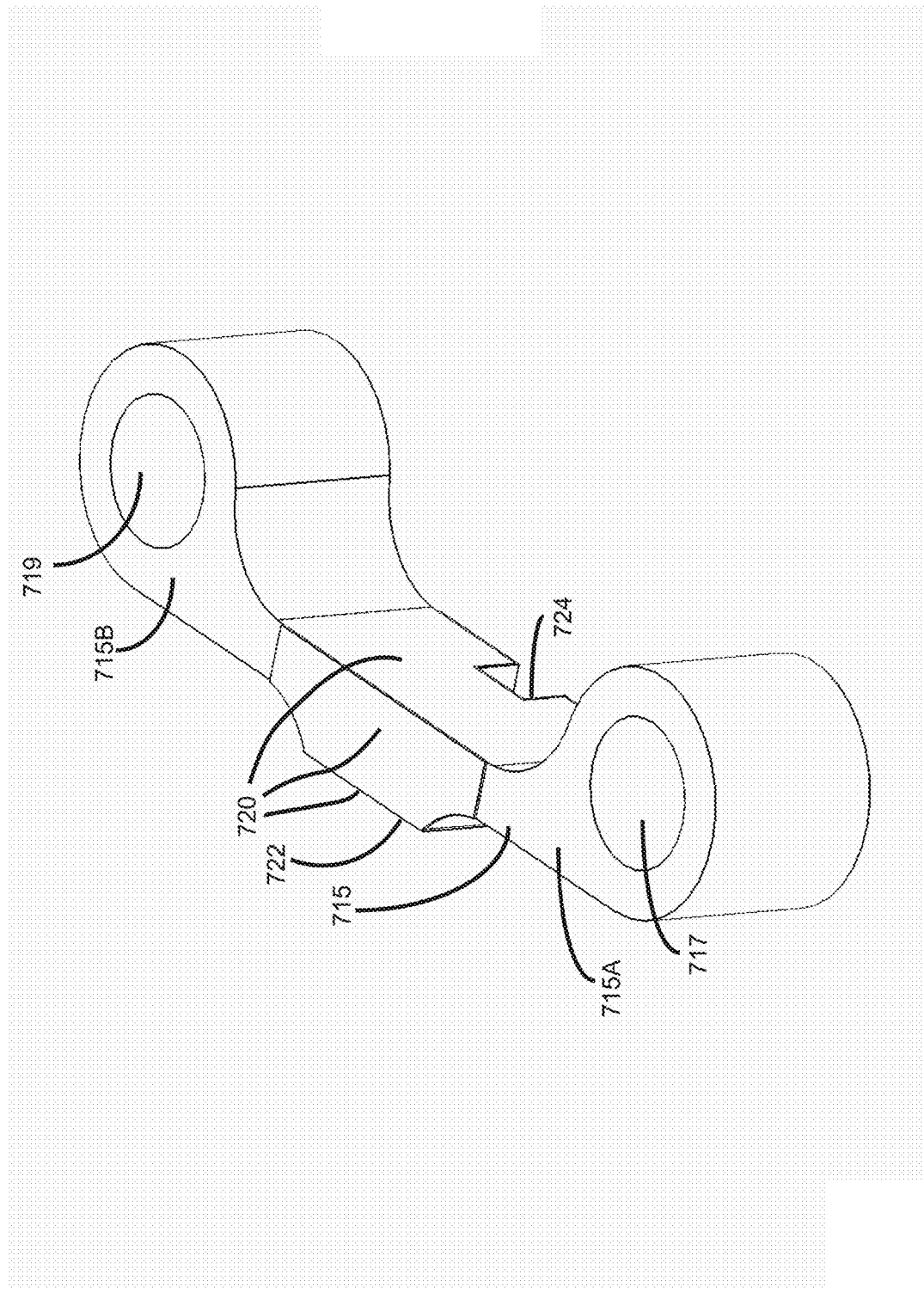
FIG. 40 shows a top front perspective view of a pin bridge.
Figure 41:
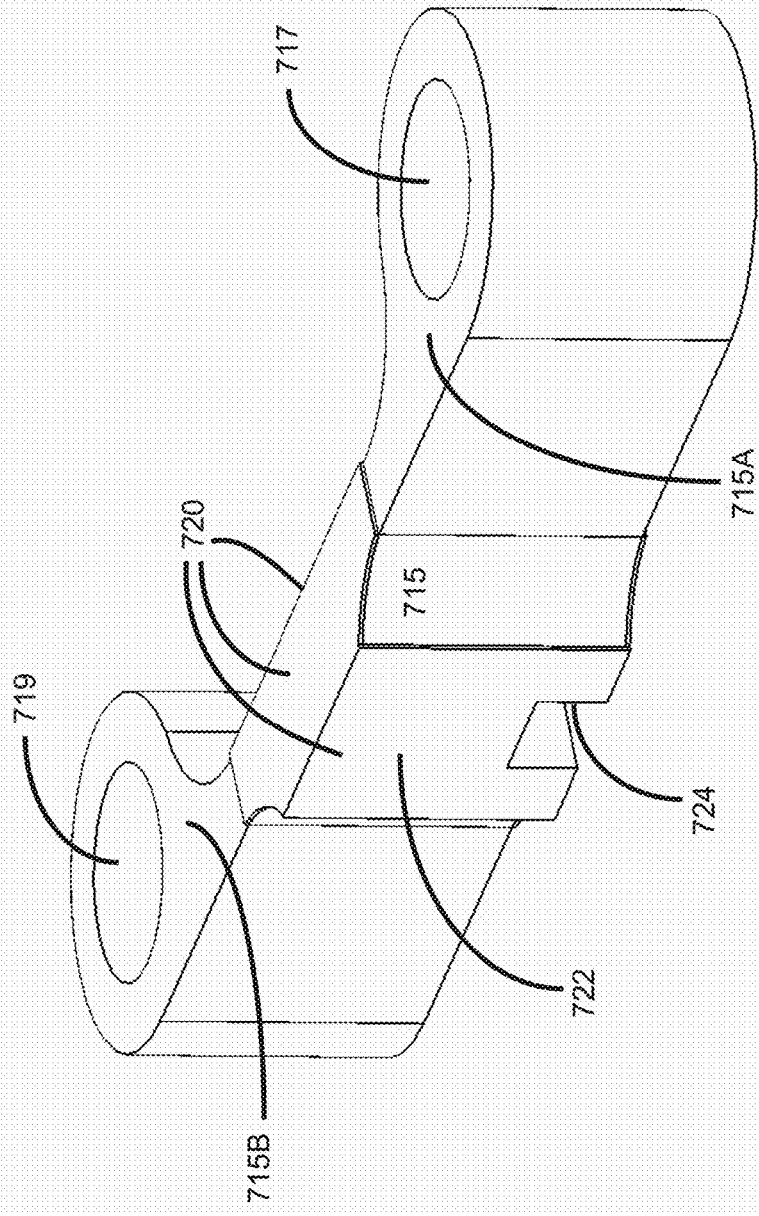
FIG. 41 shows a top rear perspective view of the pin bridge.
Figure 42:
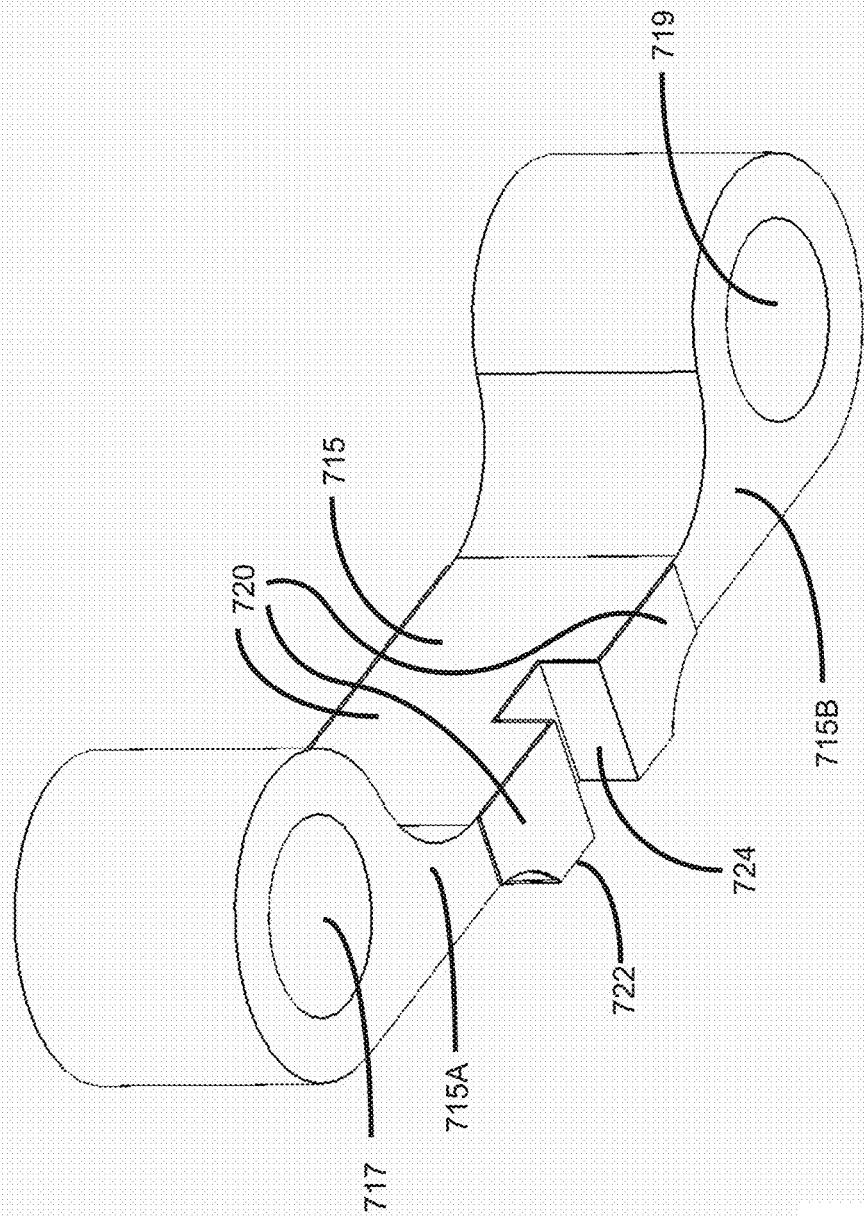
FIG. 42 shows a bottom front perspective view of a pin bridge.
Figure 43:
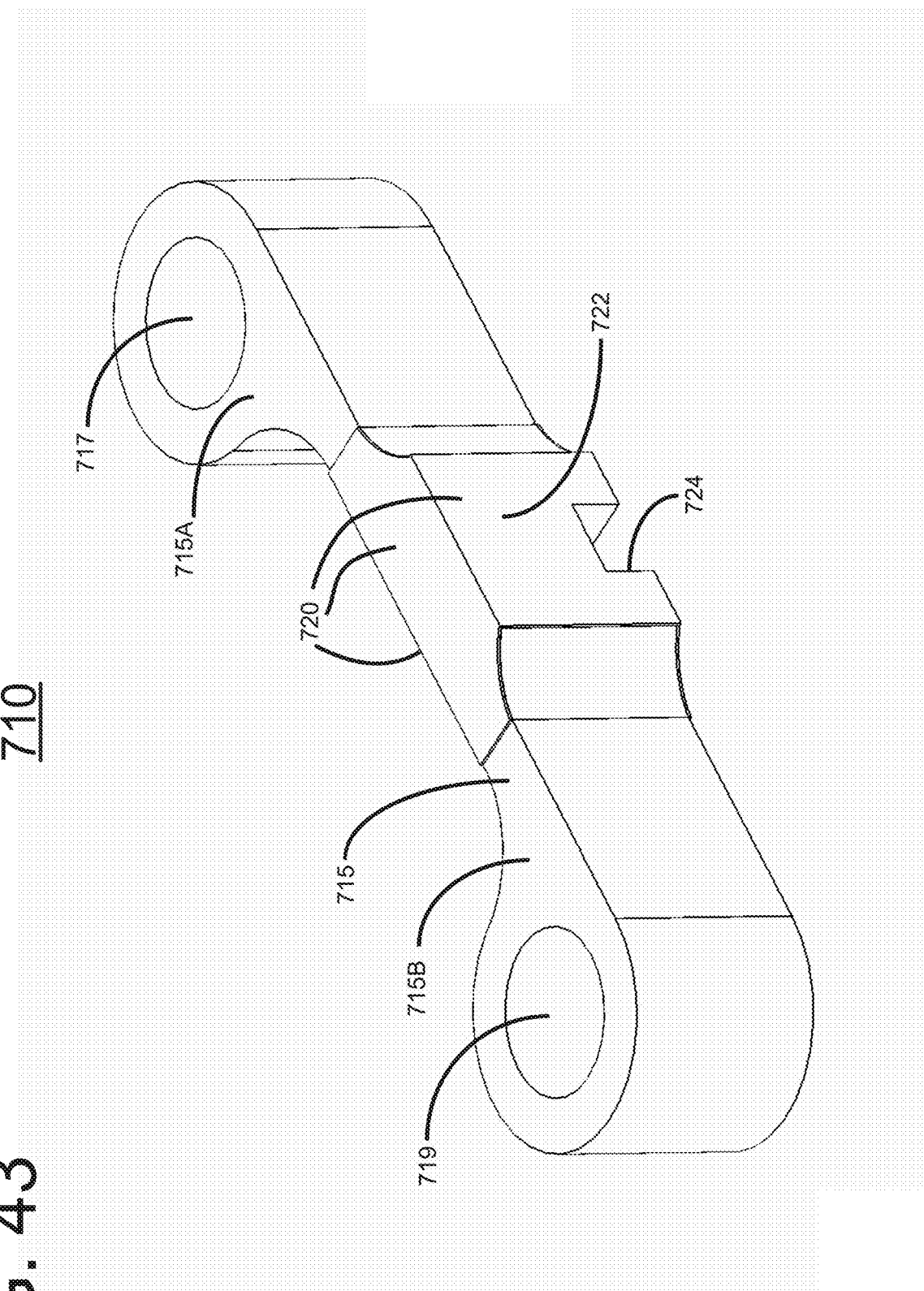
FIG. 43 shows another top rear perspective view of the pin bridge.

FIG. 40 shows a front perspective view of pin bridge 710. In one embodiment, the main body 715 of pin bridge 710 is fabricated from an electrically insulative material such as PVC. Main body 715 includes opposed ends 715A and 715B at which holes 717 and 719 are situated, as shown. Although pin bridge 710 is fabricated mainly of electrically insulative PVC material, pin bridge 710 includes a central contact region 720 that is coated with electrically conductive material such as gold to form good electrical contacts with the ground portions G of input launch 410 and better contacts with the inner wall of the prototype housing. Central contact region 720 includes a raised contact 722 that extends toward the interior housing wall when pin bridge 710 is installed via respective screws the extend through holes 717 and 719 to corresponding holes in modular block 101 below and threaded into corresponding threaded holes in floor 704. Central contact region 720 includes a channel 724 that provides room for the center conductor 706A of connector 706 to contact the signal trace S of input launch 410. FIGS. 41-43 show additional perspective views of pin bridge 710. A number of the structures referenced above are more clearly seen in FIG. 44.

FIG. 44A is a perspective view showing a portion of production housing 700 adjacent connector 706. FIG. 44A shows modular block 101 with its input launch 410 being coupled to connector 706. As seen in FIGS. 44A and 44B, housing 700 includes a housing wall 726 adjacent connector. FIG. 44B is a close-up view of the portion of FIG. 44A designated as 44B. Input launch 410 of modular block 101 includes conductors ground G, signal S, and ground G as shown in FIG. 44B. In one embodiment, pin bridge 710 does not touch the S conductor of input launch 410. Conductors G, S and G are separated by regions of electrically insulative material therebetween. Conductor S couples to the center conductor of connector 706 within channel 724. To reduce potential discontinuity between connector 706 and input launch 410, pin bridge 710 provides electrical connection from the G and G conductors of input launch 410 to housing wall 726. More particularly, central contact region 720 provides this connection from grounds G to the housing wall 726.

Figure 45:
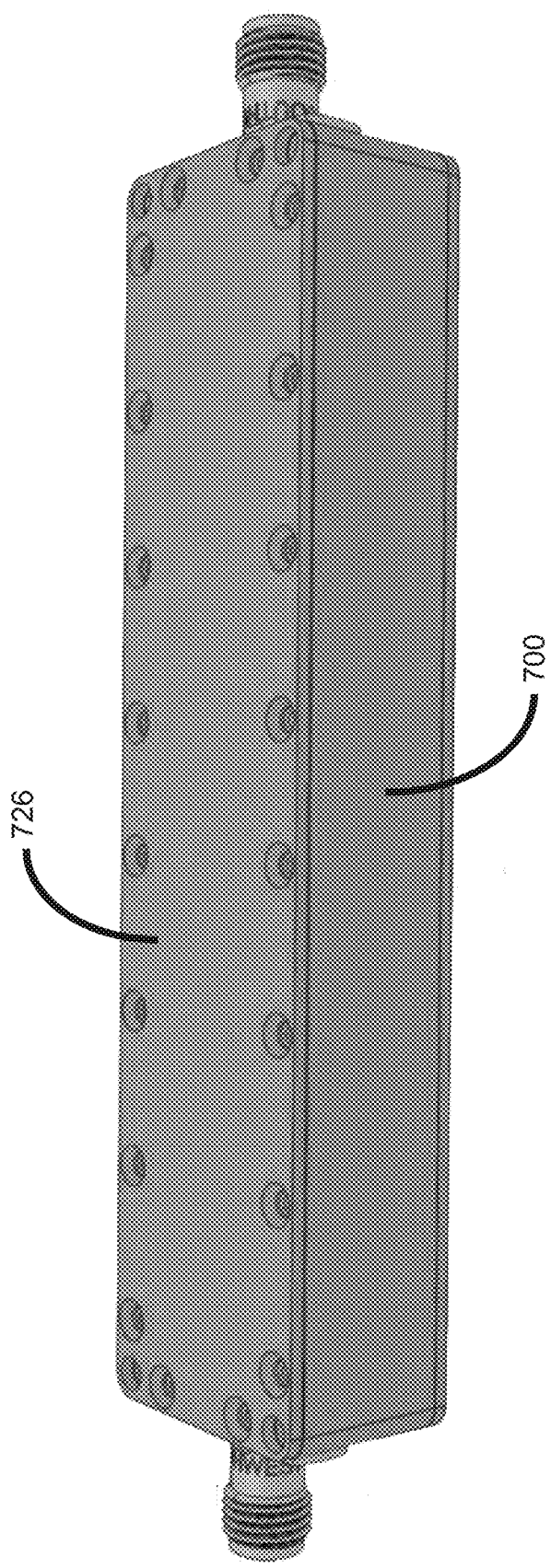
FIG. 45 shows the production housing with a lid mounted on the production housing to complete the multi-stage RF system.
Figure 46:
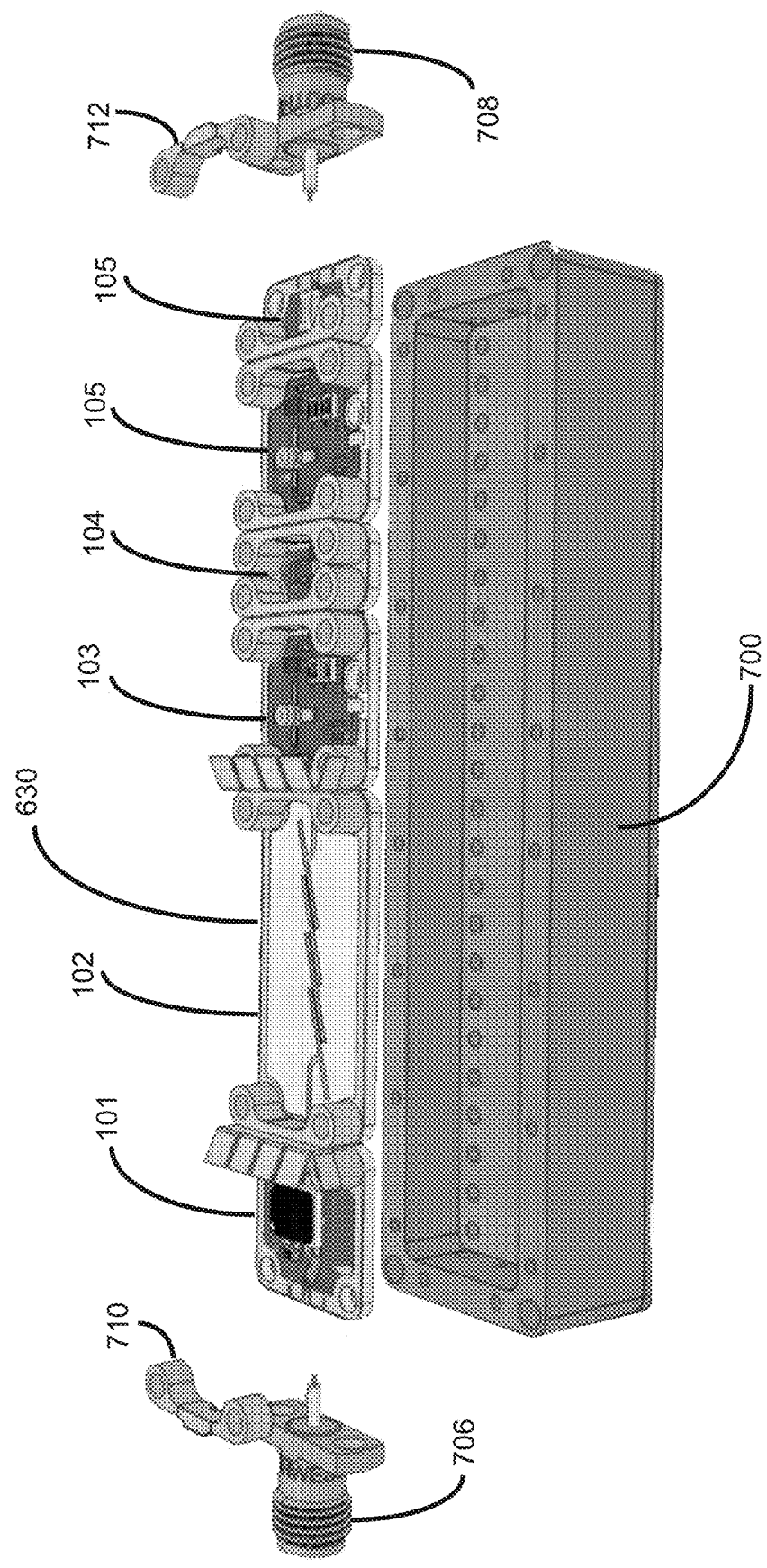
FIG. 46 depicts the disassembly of the multi-stage RF system.
Figure 47:
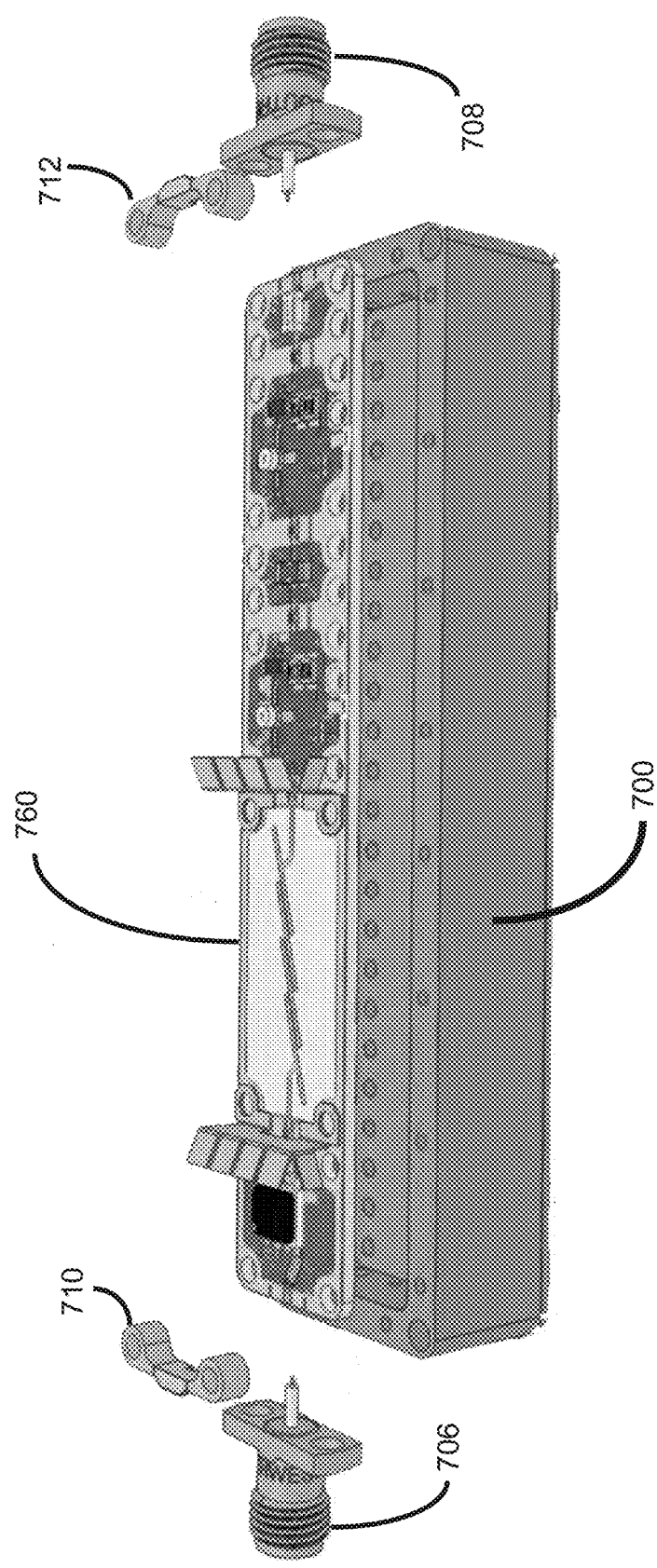
FIG. 47 shows a combined board that includes the circuitry of the modular blocks prior to mounting in a production housing.

FIG. 45 shows production housing 700 with lid 730 to provide a complete RF multi-stage system 750. At this point, a prototype RF design consisting of multiple separate modular blocks has been verified to work in a common launch geometry configuration depicted by cascade 630 shown in FIG. 46. As seen in FIG. 46, the components in housing 700 may now be disassembled and reused if desired. With modular blocks of cascade 630 being verified to successfully work together with one another to meet desired specifications, a single board including the functionality of all of modular blocks may be fabricated as combined board 760, as shown in FIG. 47.

Combined board 760 is to be used as a board in a production design ready for the marketplace or other use. FIG. 47 shows combined board 760 that includes the functionality of all of the boards of the cascade gathered together in a common structure. Combined board 760 exhibits component locations corresponding to component placement on the modular block 101-106 that combined board 760 replaces. For example, combined board 760 will have the same components located in the same locations as cascade 630 including components such as in bridges, anchors, shields and other structures. Likewise, combined board 760 includes holes in the same locations as the holes in the modular blocks of cascade 630. FIG. 47 depicts common board 760 immediately before installation in production housing 700. Combined board 760 may also be referred to as a production board because it is beyond the prototype stage and in the finished product stage.

Figure 48:
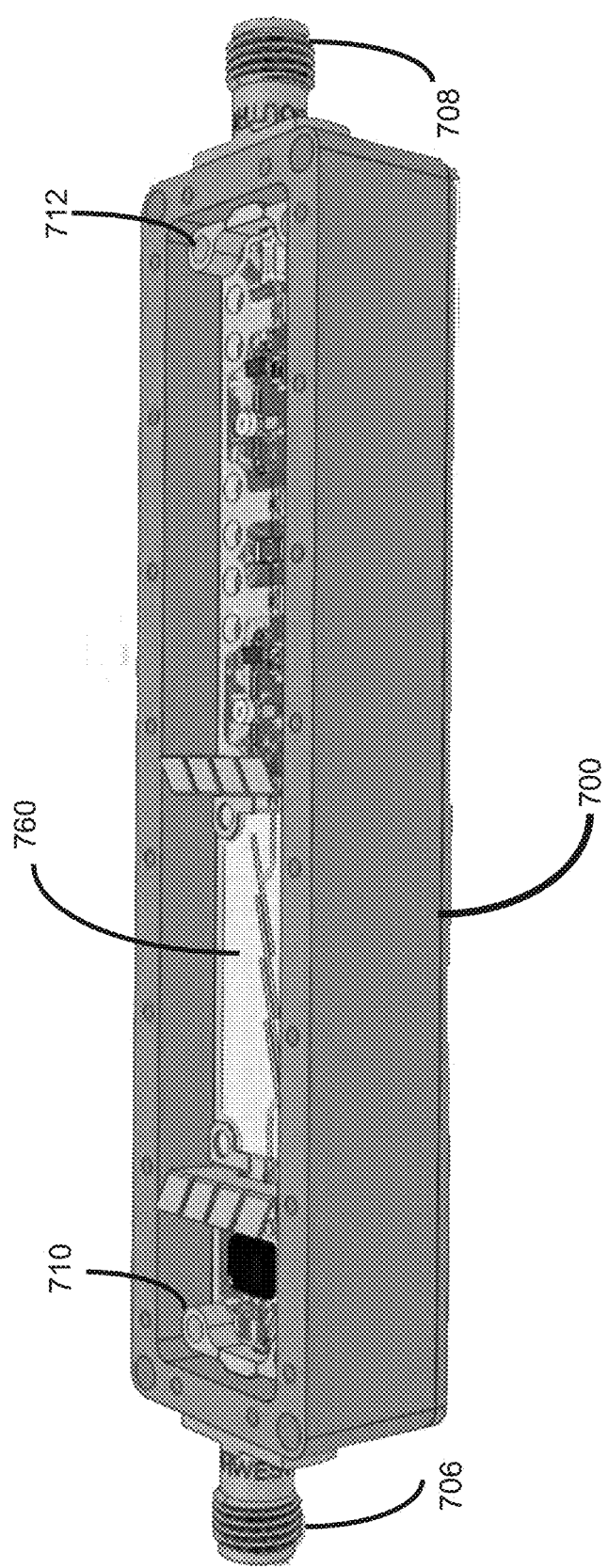
FIG. 48 shows the combined board situated in, and mounted to, the production housing.
Figure 49:
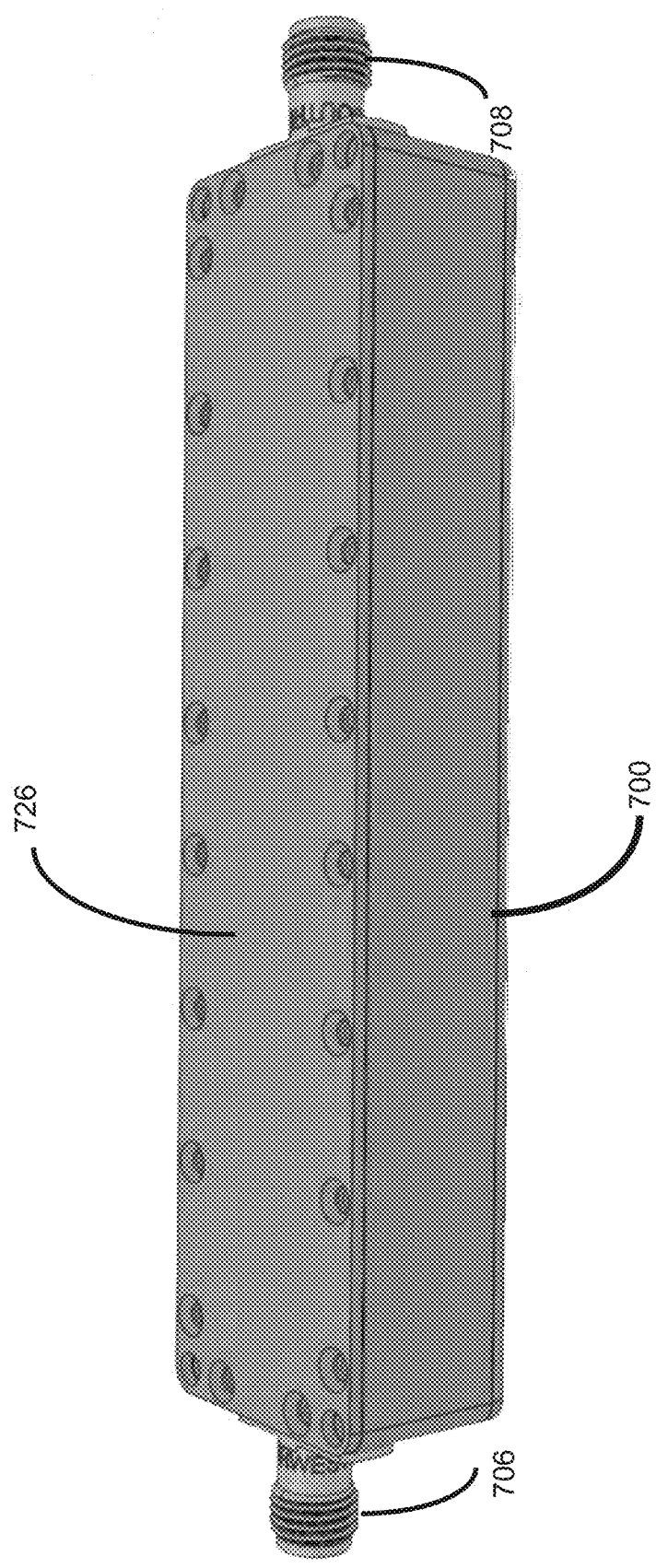
FIG. 49 is a representation of a finished production housing with the lid installed, and with the combined board inside.

FIG. 48 shows combined board 760 situated in, and mounted to, production housing 700. FIG. 49 shows the finished production housing 700 with lid 726 installed, and with combined board 760 inside.

FIG. 50 is a high level flowchart that depicts representative design steps used with respect to the disclosed RF systems to proceed from a prototype design to a production design using modular blocks as described in more detail above.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A radio frequency (RF) system, comprising:
an electrically conductive mounting member including a plurality of mounting holes arranged in a grid pattern;
a cascade of modular circuit blocks, each modular circuit block including an input launch and an output launch that exhibit the same launch geometry as other modular circuit blocks in the cascade, each modular circuit block including mounting holes aligned with corresponding mounting holes of the electrically conductive mounting member; and
a plurality of modular walls and modular lid pieces configured together with the electrically conductive mounting member to form a cavity for the cascade of modular circuit blocks.

2. The RF system of claim 1, wherein the input launches of the plurality of modular circuit blocks include a signal conductor and a ground conductor situated at a respective edge of each modular circuit block.

3. The RF system of claim 2, wherein the output launches of the plurality of modular circuit blocks include a signal conductor and a ground conductor situated at another respective edge of each modular circuit block.

4. The RF system of claim 3, wherein the cascade of modular circuit blocks includes an input end and an output end, the RF system further comprising:
an input RF probe being situated at the input end of the cascade, the input RF probe including mounting holes aligned with corresponding mounting holes in the electrically conductive mounting member.

5. The RF system of claim 4, further comprising:
an output RF probe being situated at the output end of the cascade, the input RF probe including mounting holes aligned with corresponding mounting holes in the electrically conductive mounting member.

6. The RF system of claim 1, wherein the cascade of modular circuit blocks includes first and second modular circuit blocks that each include mounting holes aligned with corresponding mounting holes of the electrically conductive mounting member, the RF system further comprising:
a flex jumper including a plurality of flexible conductors having opposed ends, the flex jumper coupling conductors of the output launch of the first modular circuit block to respective conductors of the input launch of the second modular circuit block.

7. The RF system of claim 6, wherein the mounting holes of the first modular circuit block include first and second mounting holes adjacent an output launch of the first modular circuit block, the RF system further comprising:
a first anchor situated extending across the conductors of the flex jumper at the output launch of the first modular circuit block, the first anchor including first and second mounting holes;
first and second mounting screws extending through the first and second mounting holes of the first anchor, through the first and second mounting holes of the first modular circuit block and into respective mounting holes of the electrically conductive mounting member.

8. The RF system of claim 7, wherein the mounting holes of the second modular circuit block include first and second mounting holes adjacent an input launch of the second modular circuit block, the RF system further comprising:
- a second anchor situated extending across the conductors of the flex jumper at the input launch of the second modular circuit block, the second anchor including first and second mounting holes;
- first and second mounting screws extending through the first and second mounting holes of the second anchor, through the first and second mounting holes of the second modular circuit block and into respective mounting holes of the electrically conductive mounting member.

9. The RF system of claim 1, wherein the electrically conductive mounting member comprises a prototype plate.

10. The RF system of claim 1, wherein the cascade of modular circuit blocks is a prototype cascade of modular circuit blocks.

11. The RF system of claim 1, further comprising:
- a plurality of mounting screws extending through the mounting holes of the modular circuit blocks and corresponding mounting holes of the electrically conductive mounting member to removably hold the modular circuit blocks to the electrically conductive mounting member.

12. The RF system of claim 1, further comprising:
- removable shields situated between adjacent modular circuit blocks of the cascade, the removable shields including mounting holes aligned with corresponding mounting holes in the electrically conductive mounting member.

* * * * *